United States Patent [19]
Kawano et al.

[11] Patent Number: 5,728,494
[45] Date of Patent: Mar. 17, 1998

[54] EXPOSURE MASK AND METHOD AND APPARATUS FOR MANUFACTURING THE SAME

[75] Inventors: Kenji Kawano, Tokyo; Shinichi Ito, Yokohama; Iwao Higashikawa, Tokyo; Masamitsu Itoh, Yokohama; Takashi Kamo, Tokyo; Hiroaki Hazama, Yokohama; Takayuki Iwamatsu, Abiko, all of Japan

[73] Assignee: Kabushiki Kaisha Toshiba, Kawasaki, Japan

[21] Appl. No.: 730,017

[22] Filed: Oct. 11, 1996

Related U.S. Application Data

[63] Continuation of Ser. No. 583,857, Jan. 11, 1996, Pat. No. 5,629,115, which is a continuation of Ser. No. 235,690, Apr. 29, 1994, abandoned.

[30] Foreign Application Priority Data

| Apr. 30, 1993 | [JP] | Japan | 5-103416 |
| Aug. 13, 1993 | [JP] | Japan | 5-201558 |
| Dec. 3, 1993 | [JP] | Japan | 5-304185 |
| Dec. 3, 1993 | [JP] | Japan | 5-304186 |
| Feb. 25, 1994 | [JP] | Japan | 6-28592 |

[51] Int. Cl.$^6$ .................................. G03F 9/00
[52] U.S. Cl. .................................. 430/5; 430/322
[58] Field of Search .............. 430/5, 322, 324

[56] References Cited

U.S. PATENT DOCUMENTS

| 4,497,878 | 2/1985 | Hatano et al. | 430/5 |
| 5,318,868 | 6/1994 | Hasegawa et al. | 430/320 |

Primary Examiner—S. Rosasco
Attorney, Agent, or Firm—Oblon, Spivak, McClelland, Maier & Neustadt, P.C.

[57] ABSTRACT

This invention provides an exposure mask including a translucent film formed on a light-transmitting substrate and having a mask pattern, and a stabilized region formed in the boundary between the light-transmitting substrate and the translucent film or on at least the surface of the translucent film to prevent variations in physical properties of the translucent film. In addition, this invention provides a method of manufacturing an exposure mask, including the steps of forming a translucent film on a light-transmitting substrate, forming a photosensitive resin film on the translucent film, forming a photosensitive resin pattern by exposing the photosensitive resin film to a radiation or a charged particle beam, removing an exposed portion of the translucent film by using the photosensitive resin pattern as a mask, removing the photosensitive resin pattern, and forming a stabilized region in the boundary between the light-transmitting substrate and the translucent film or on at least the surface of the translucent film before the step of forming the photo-sensitive resin film or after the step of forming the photosensitive resin pattern. Also, this invention provides an apparatus for manufacturing an exposure mask.

4 Claims, 41 Drawing Sheets

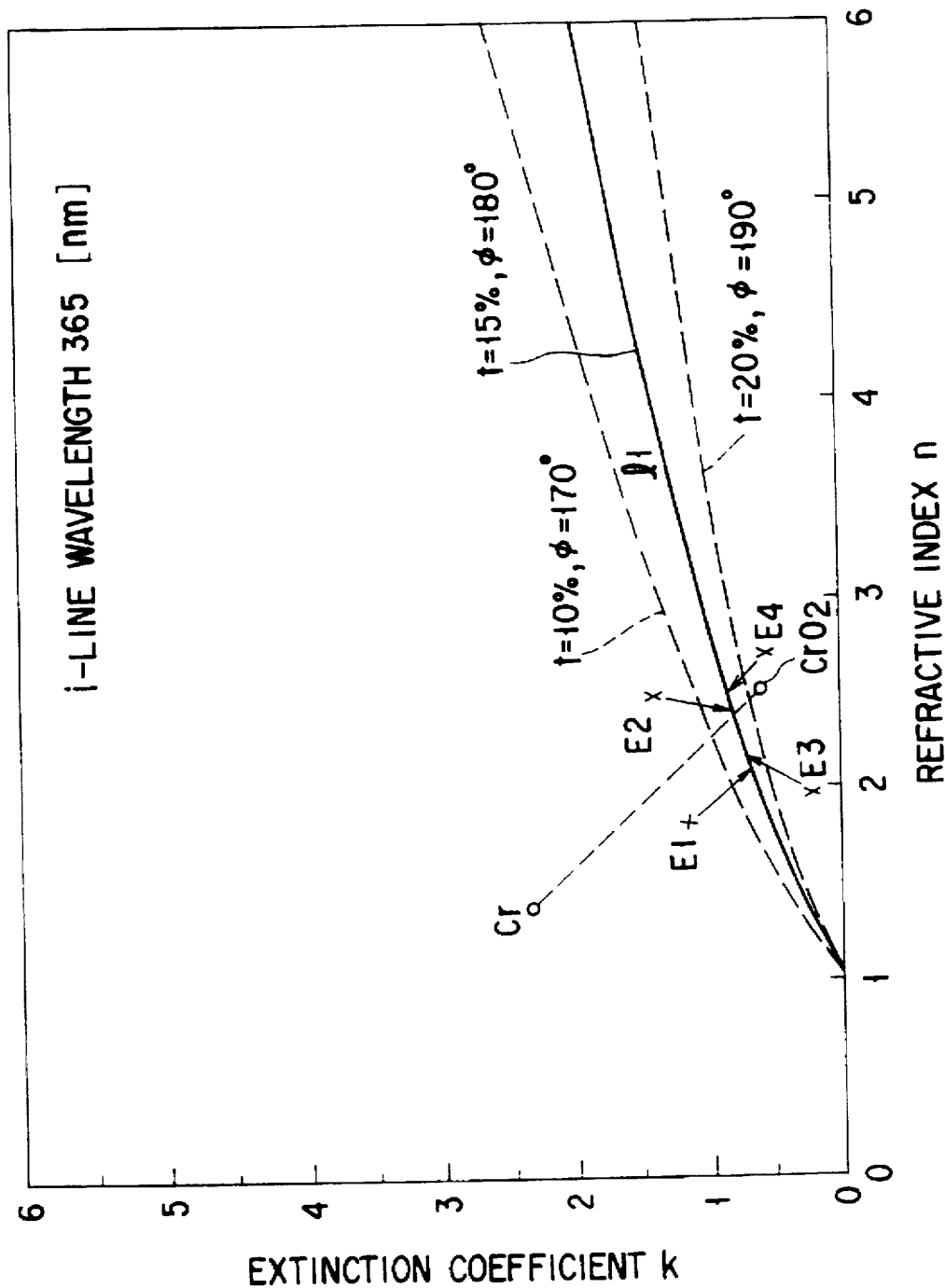
F I G. 5

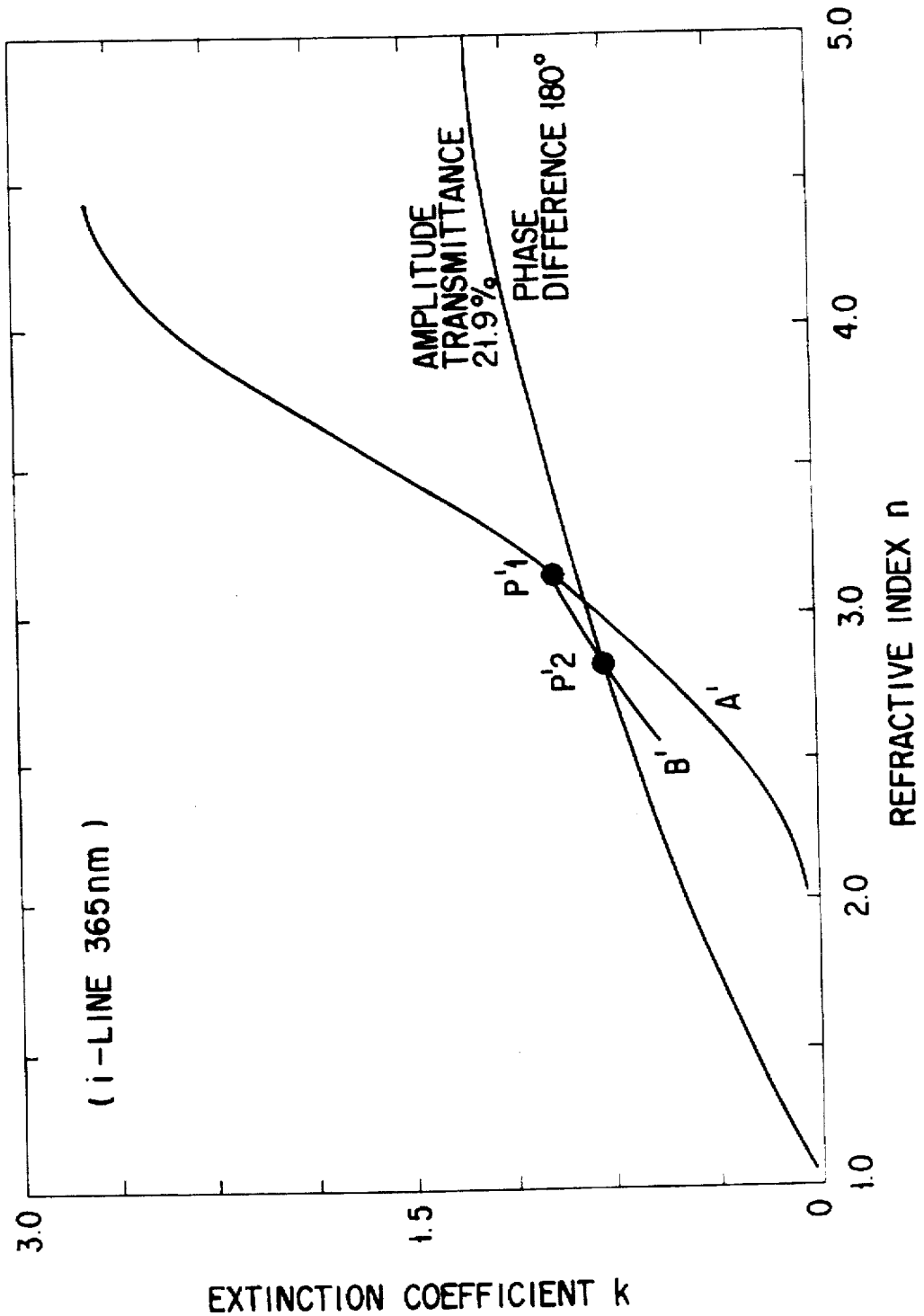

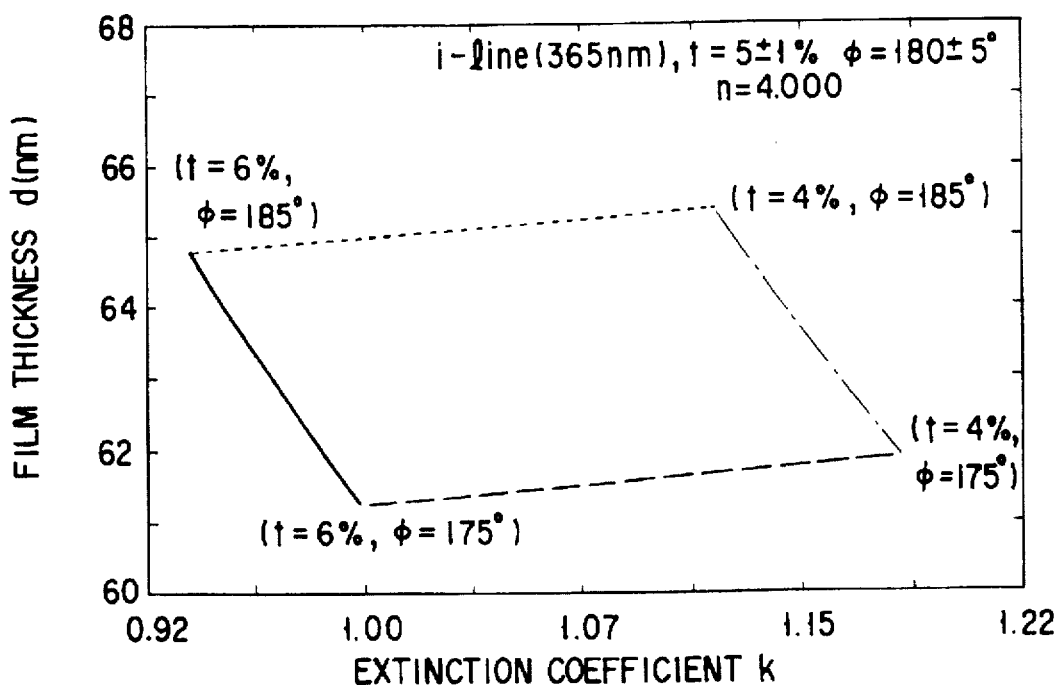
F I G. 20
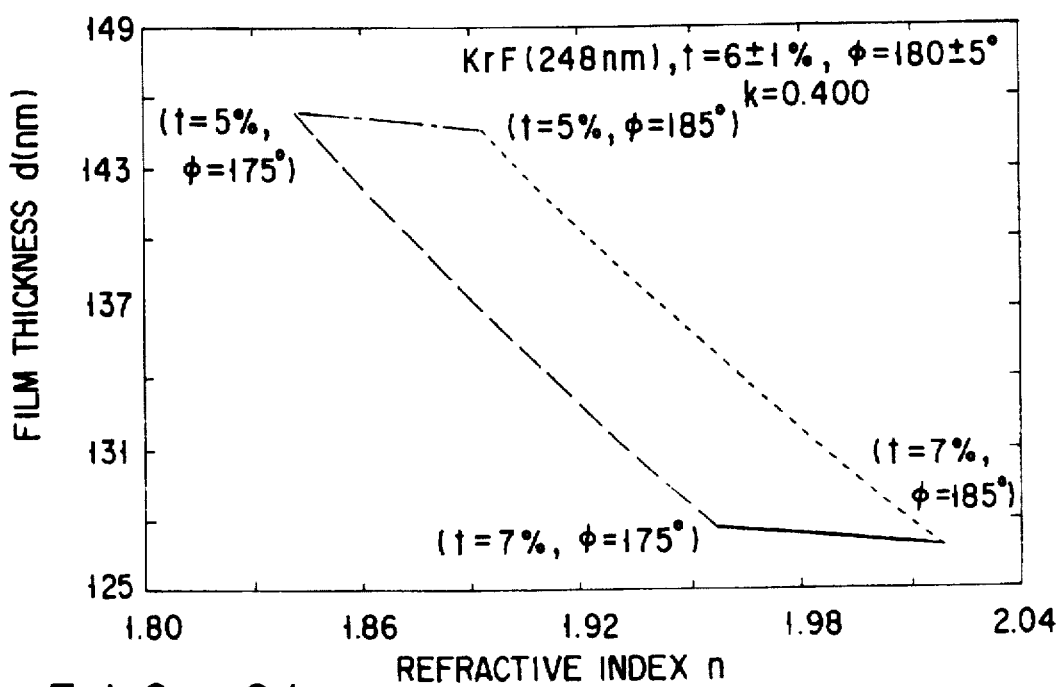
F I G. 21

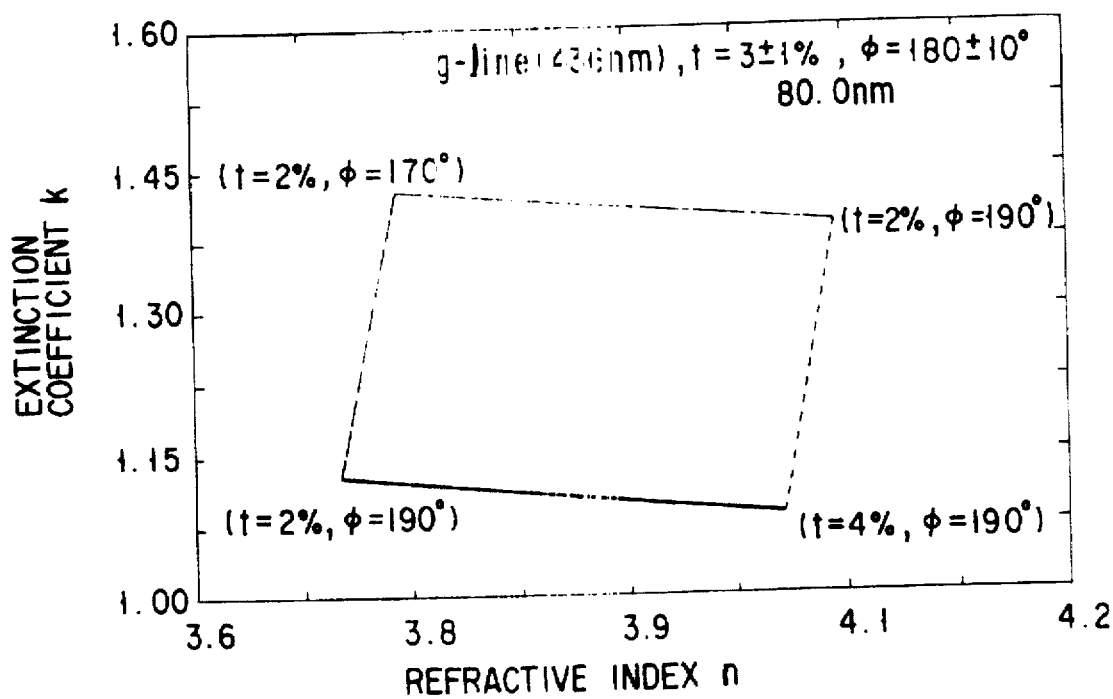
F I G. 22
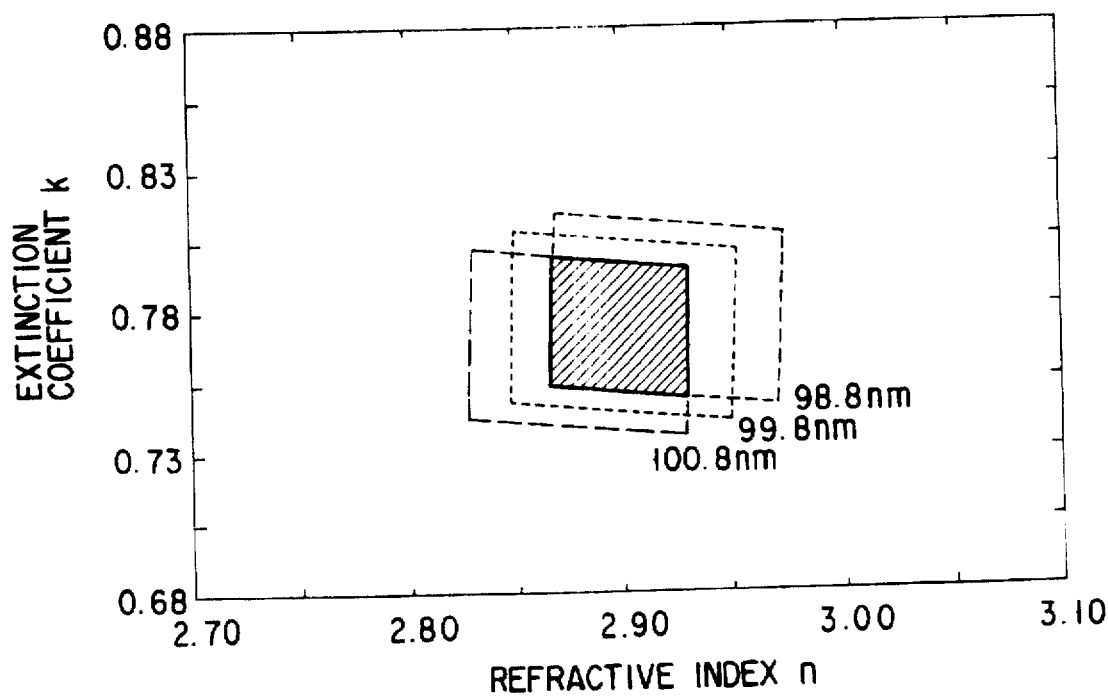
F I G. 23

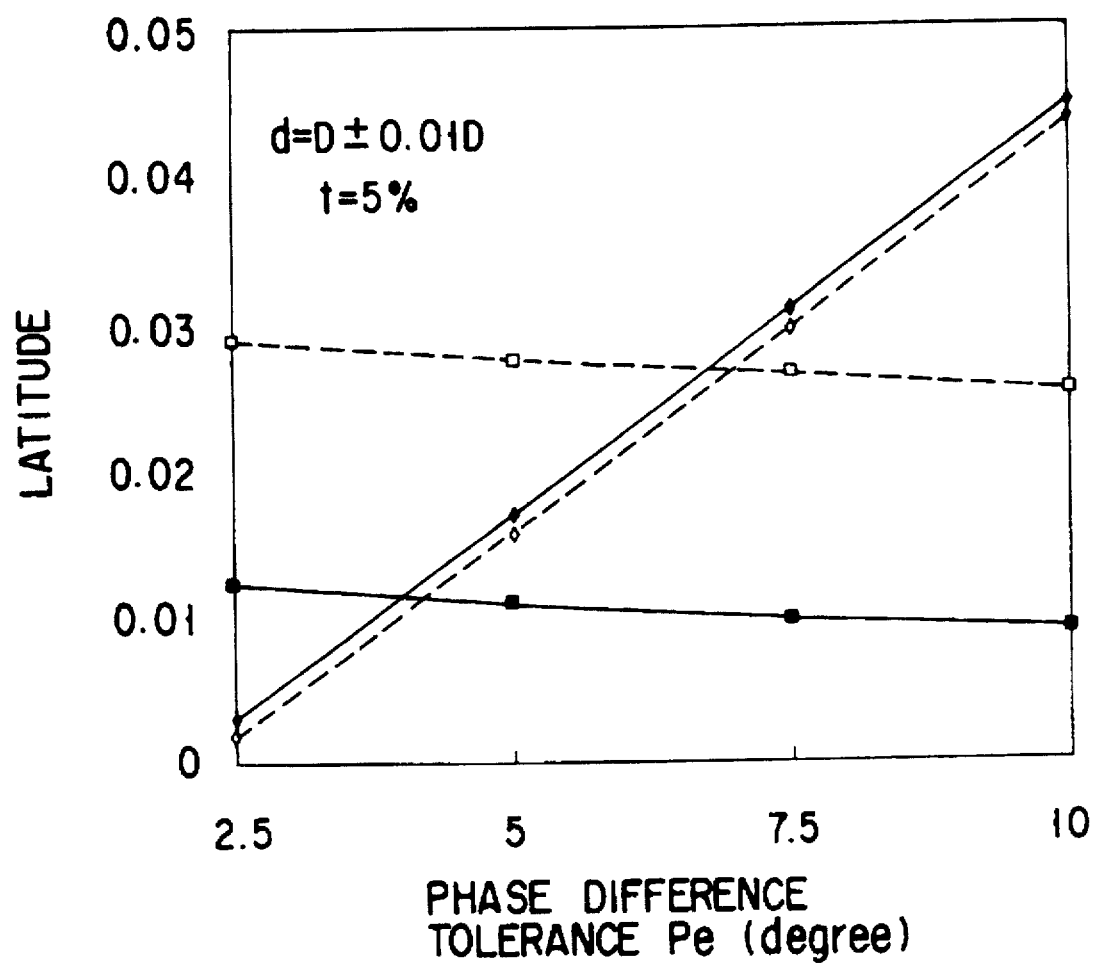
F I G. 25

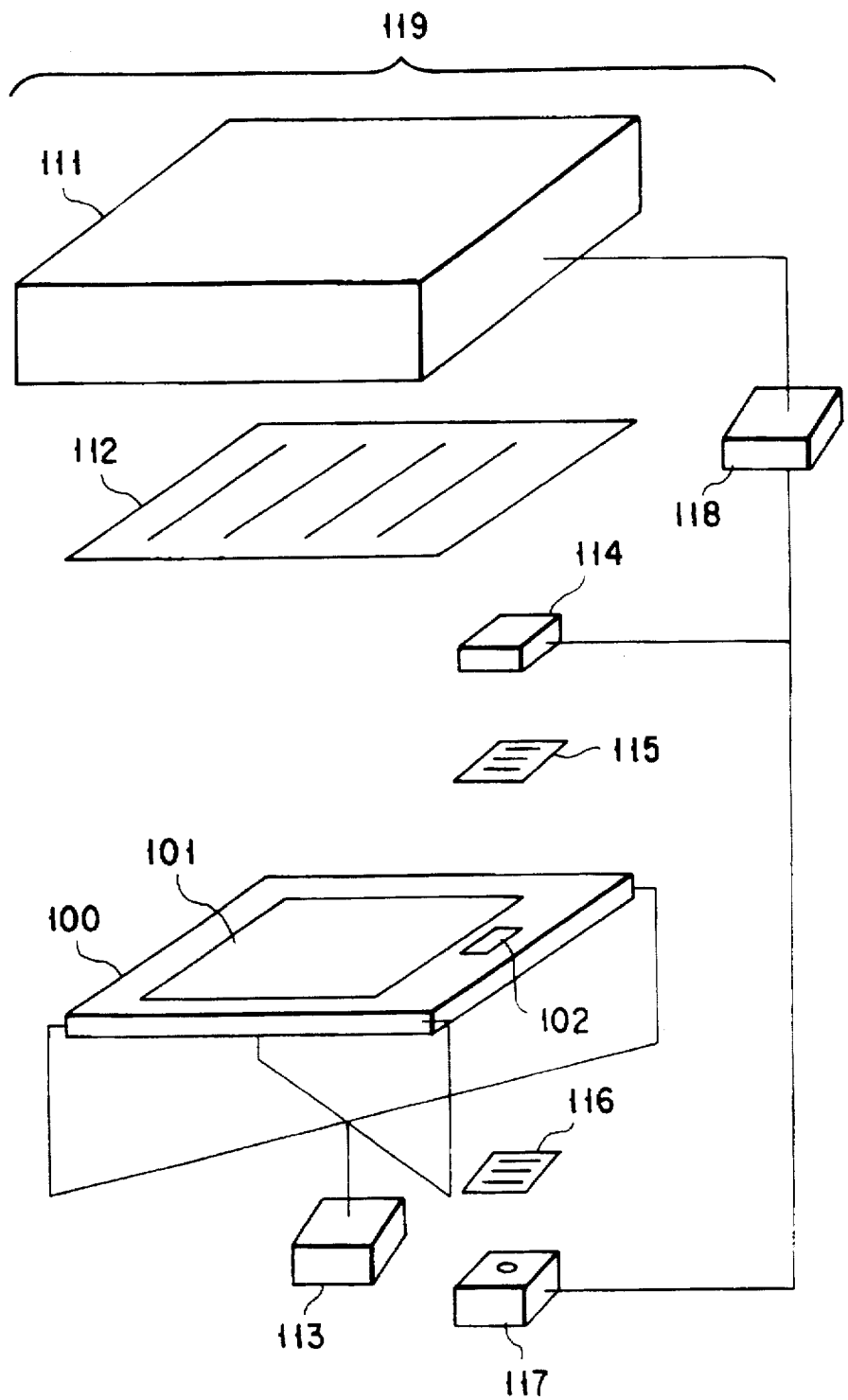
F I G. 36

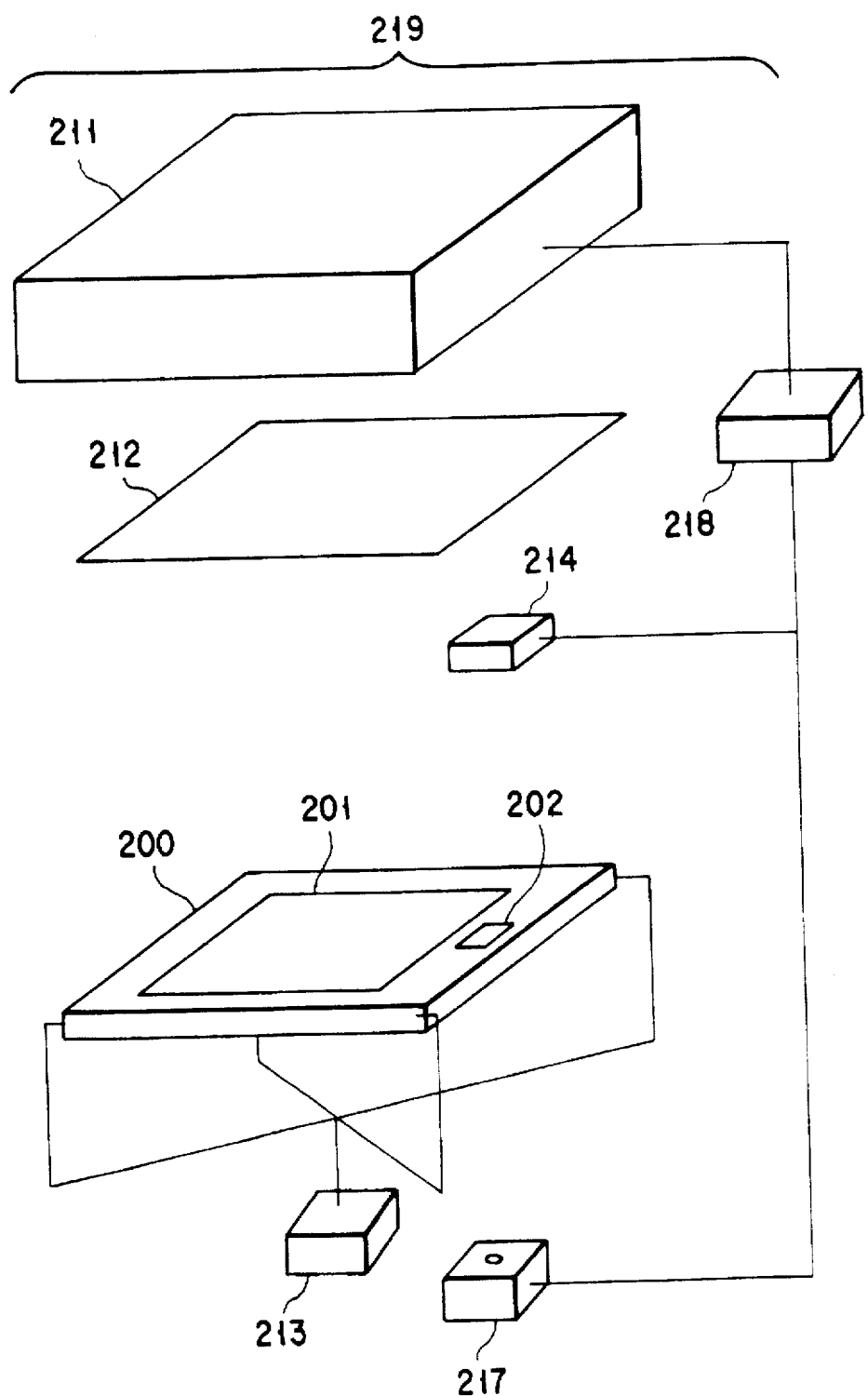
F I G. 37

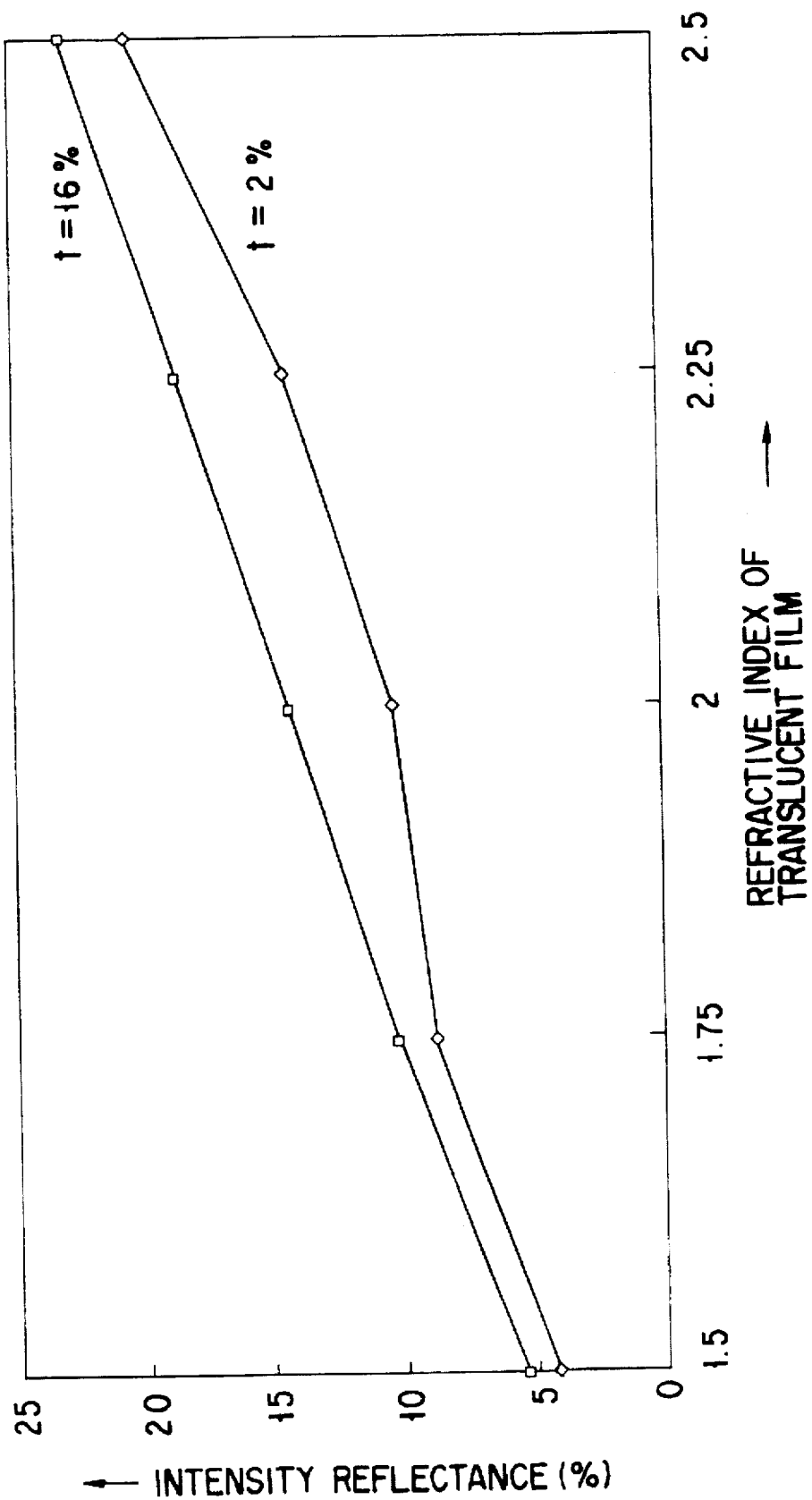
F I G. 41

EXPOSURE MASK AND METHOD AND APPARATUS FOR MANUFACTURING THE SAME

This is a Continuation of application Ser. No. 08/583,857 filed on Jan. 11, 1996, now U.S. Pat. No. 5,629,115; which is a Continuation of application Ser. No. 08/235,690 filed on Apr. 29, 1994, now abandoned.

BACKGROUND OF THE INVENTION

1. Field of the Invention

The present invention relates to an exposure mask for use in lithography in the manufacture of semi-conductor devices, and a method and an apparatus for manufacturing the exposure mask.

2. Description of the Related Art

The degrees of integration and miniaturization of semiconductor integrated circuits have increased steadily, and shortening the wavelength of an exposure light source has been studied to meet this requirement. Recently, on the other hand, a phase-shifting method of improving an exposure mask without changing an exposure light source has attracted attention. This phase-shifting method aims at improving pattern accuracy by forming a portion called a phase shifter for inverting a phase and thereby removing the influence of positive interference of light between adjacent patterns. Although a variety of phase-shifting methods have been proposed so far, a Levenson method, among other phase-shifting methods, is particularly known well as a method of dramatically improving resolving power and focal depth.

The Levenson method produces a negative interference by setting a 180× phase difference between light components transmitted through adjacent light-transmitting portions. The Levenson method has a large effect of improving resolving power for periodic patterns such as line-and-space patterns. If, however, the phase difference of 180° is set in situations where three or more patterns are formed adjacent to one another, phases become equal at least at one portion. Consequently, no resolving power improving effect can be obtained in this portion in which the phase difference between adjacent portions becomes 0. It is therefore required to improve the design or the like in order to put this method into practice for actual device patterns.

A halftone method is one phase-shifting method requiring no change in device design. This method uses a translucent film, instead of a light-shielding film, and sets a 180° phase difference between light transmitted through the translucent film and light transmitted through a transparent portion, thereby reducing the interference of light which causes a decrease in pattern resolution. To take advantage of the full phase-shift improving effect of the halftone method, it is necessary to optimize the transmittance of the translucent film and the phase difference between the light components transmitted through the translucent film and the transparent portion.

One example of this halftone method is the method disclosed in Jpn. Pat. Appln. KOKAI Publication No. 4-136854 in which the phase and the transmittance are adjusted by using a multilayered film. However, the use of the multilayered film requires two transfer steps. in addition, if defects occur in the lower layer, it is difficult to correct these defects. Adjusting the phase and the transmittance by using a single-layer film also has been examined as disclosed in Japanese Patent Application No. 4-327623. However, to simultaneously control the transmittance and the phase difference by a single-layer translucent film, the composition of a film to be used as the translucent film is limited.

Generally, a film consisting of a material having an intermediate composition, i.e., a material containing a semi-bonded state is used as the translucent film. Therefore, variations in the physical properties of the translucent film may readily take place upon irradiation with light during exposure. Since the irradiation direction of exposure light is from a transparent substrate to the translucent film, the influence of the photoirradiation reaches a maximum in the interface between the translucent film and the transparent substrate. The translucent film has a large absorbance to an exposure wavelength. Therefore, a thermal reaction occurs due to an optical reaction taking place near the interface or due to heat produced by this optical reaction. This results in loss of a resistance against the irradiation of exposure light if a measure of only stabilization of the film quality on the surface of the translucent film is taken by an oxidation treatment. Consequently, the physical properties of the translucent film vary primarily near the interface with the transparent substrate.

With this reaction, the phase difference and the transmittance of the translucent film of a halftone phase-shifting mask are shifted from their respective desired values upon irradiation with light during exposure. After the mask is manufactured, therefore, the shape of the transferred resist pattern is degraded or the focal depth is decreased due to the deterioration with time of the amplitude transmittance and the phase difference.

Note that it is also possible to leave the translucent film to stand until physical property variations no longer take place. This method, however, is impractical because several years are required before the film quality is stabilized.

The present invention provides a method of solving the above conventional problems by using at least one of irradiation, heating, and oxidation as will be described later. As disclosed in jpn. Pat. Appln. KOKAI Publication No. 3-131027, however, the end point of irradiation has been indirectly determined in conventional methods. That is, the relationships between the film thickness of an insulating film formed by irradiation and the irradiation temperature and between the film quality and the irradiation time are obtained beforehand, and the irradiation time is calculated by monitoring the temperature during the irradiation. Alternatively, as disclosed in Jpn. Pat. Appln. KOKAI Publication No. 3-278524, a method of compensating for the lamp output by measuring the transmittance and the reflectance to infrared light prior to irradiation has been performed. These methods, however, cannot directly measure the film thickness or the physical properties of a film being treated. Consequently, variations are produced in the physical properties of the film obtained after the treatment.

In conventional halftone phase-shifting masks as discussed above, the physical properties of a translucent film vary due to photoirradiation during exposure or with time, shifting the phase difference and the transmittance of the translucent film from their respective desired values. This leads to degradation in the shape of a transferred resist pattern or decrease in the focal depth. In addition, exposure masks capable of achieving the maximum phase-shifting effect are difficult to manufacture with a high reproducibility, since it is not possible to directly measure the transmittance and the phase shift during the irradiation or heating mentioned above.

SUMMARY OF THE INVENTION

The present invention has been made in consideration of the above situations and has as its object to provide an exposure mask capable of preventing variations in the physical properties of a translucent film resulting from irradiation of exposure light or with time, thereby contributing to improvements in a pattern transfer accuracy, and a method and an apparatus for manufacturing this exposure mask.

The first invention of the present invention provides an exposure mask comprising a translucent film formed on a light-transmitting substrate and having a mask pattern, and a stabilized region formed in the boundary between the light-transmitting substrate and the translucent film or on at least the surface of the translucent film to prevent variations in physical properties of the translucent film.

The second invention of the present invention provides a method of manufacturing an exposure mask, comprising the steps of forming a translucent film on a light-transmitting substrate, forming a photosensitive resin film on the translucent film, forming a photosensitive resin pattern by exposing the photosensitive resin film to a radiation or a charged particle beam, removing an exposed portion of the translucent film by using the photosensitive resin pattern as a mask, removing the photosensitive resin pattern, and forming a stabilized region in the boundary between the light-transmitting substrate and the translucent film or on at least the surface of the translucent film before the step of forming the photosensitive resin film or after the step of forming the photosensitive resin pattern.

The third invention of the present invention provides an apparatus for manufacturing an exposure mask, comprising a light source for radiating light containing at least an exposure wavelength onto a translucent film formed on a light-transmitting substrate, photodetecting means for detecting light emitted from the light source and transmitted through or reflected by the translucent film, and measuring means for measuring the characteristic of the translucent film from the light detected by the photodetecting means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a graph showing the relationship between the refractive index n and the extinction coefficient k obtained when an i-line is used as an exposure wavelength and the composition of CrO is changed;

FIG. 16 is a graph showing the relationship between the refractive index n and the extinction coefficient k obtained when an i-line of a mercury lamp is used as an exposure wavelength and the composition ratio of SiN is changed;

FIG. 20 is a graph for explaining the first experimental example, which shows the tolerances of the extinction coefficient and the film thickness when the refractive index is fixed by taking account of multiple reflection inside a translucent film;

FIG. 21 is a graph for explaining the second experimental example, which shows the tolerances of the refractive index and the film thickness when the extinction coefficient is fixed by taking account of multiple reflection of a translucent film;

FIG. 22 is a graph for explaining the third experimental example, which shows the tolerances of the refractive index and the extinction coefficient when the film thickness is fixed by taking account of multiple reflection of a translucent film;

FIG. 23 is a graph for explaining the fifth experimental example, which shows the tolerances of the refractive index and the extinction coefficient when a proper range is set for the film thickness by taking account of multiple reflection of a translucent film;

FIG. 25 is a graph for explaining the dependence of dn and dk on the phase difference variation Pe in the fifth experimental example;

FIG. 36 is a schematic view showing an exposure mask manufacturing apparatus according to the ninth embodiment of the present invention;

FIG. 37 is a schematic view showing an exposure mask manufacturing apparatus according to the tenth embodiment of the present invention;

FIG. 41 is a graph showing the comparison between the pattern surface reflectance of an i-line translucent phase-shifting film and that of a KrF-line translucent phase-shifting film;

DETAILED DESCRIPTION OF THE PREFERRED EMBODIMENTS

Figure 1:
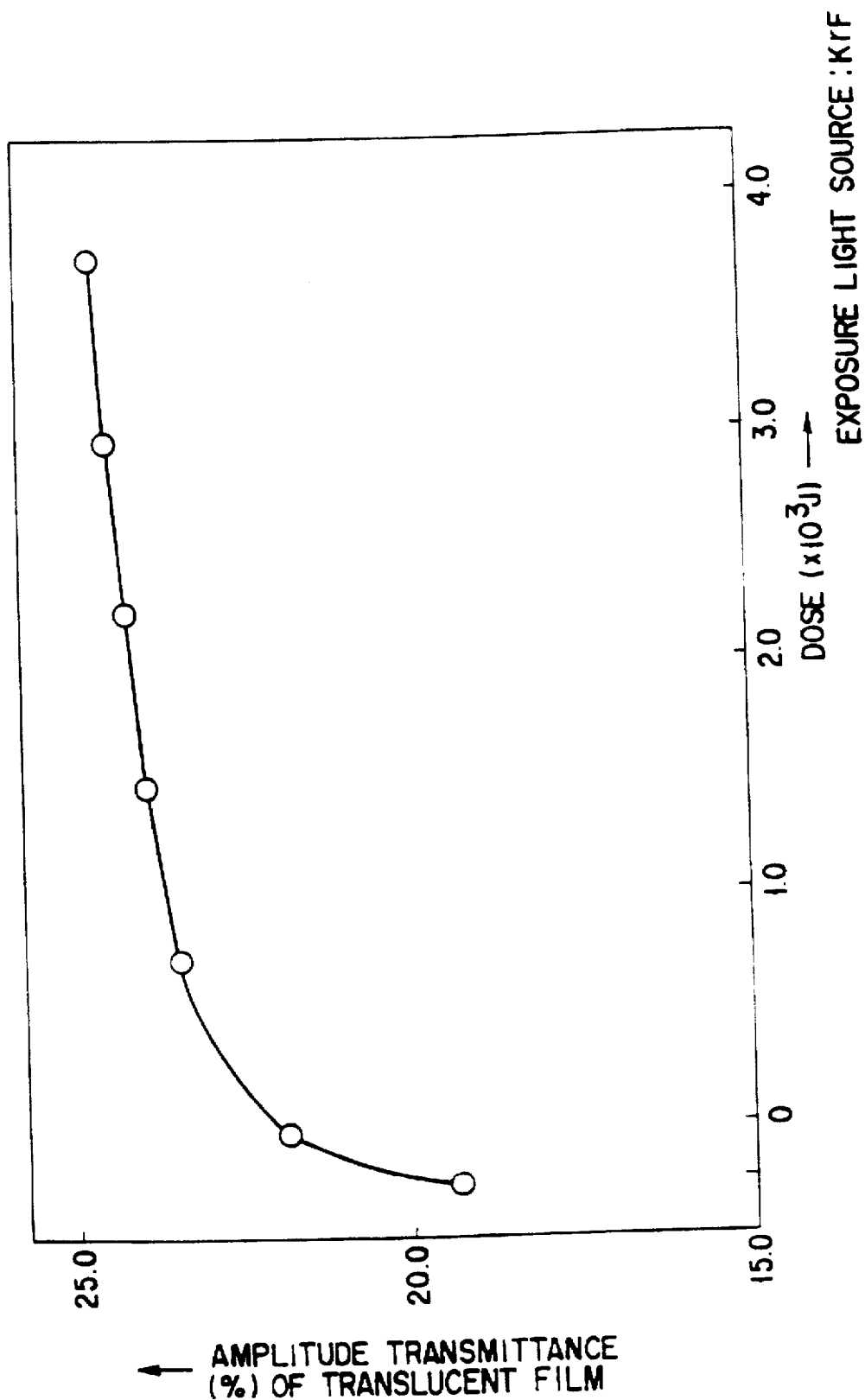
FIG. 1 is a graph showing the change in transmittance of a translucent film (SiN) formed by a conventional technique.

The gist of the present invention is to stabilize a translucent film of a halftone phase-shifting mask by performing at least one of irradiation, heating, and oxidation for the translucent film prior to exposure, in order that the phase difference and the transmittance of the translucent film do not change due to photo-irradiation during exposure or with time.

That is, the first aspect of the first invention of the present invention is characterized in that, in an exposure mask manufactured by forming a translucent film into a desired pattern on a light-transmitting substrate, a stabilized region for preventing variations in physical properties of the translucent film caused by irradiation of exposure light is formed in the boundary between the light-transmitting substrate and the translucent film.

The second aspect of the first invention of the present invention is characterized in that, in an exposure mask manufactured by forming a translucent film into a desired pattern on a light-transmitting substrate, a modified region (stabilized region) for preventing variations in physical properties of the translucent film caused by irradiation of exposure light or with time is formed in the boundary between the light-transmitting substrate and the translucent film or at least on the surface of the translucent film.

More specifically, the characteristic feature of the present invention is that the number of dangling bonds produced during film formation is decreased by an oxidation reaction and a crosslinking reaction. Examples of the material of the translucent film are an Si compound, a Cr compound, an Al compound, a Ti compound, an MoSi compound, and their mixtures. Especially in the case of the Si compound, the density of Si dangling bonds is preferably about $1.0—10^{19}/cm^3$ or less. It is similarly required to decrease the number of dangling bonds of a translucent film consisting of a compound of another element.

The third aspect of the first invention of the present invention is characterized by comprising, in an exposure mask constituting a halftone phase-shifting mask, a transmitting portion consisting of a transparent substrate, a translucent film pattern formed at a predetermined position on the transparent substrate, and an oxide film with a desired thickness formed only on top of the translucent film pattern or formed to cover the translucent film pattern, wherein a phase difference between light transmitted through the transmitting portion and light transmitted through the translucent film pattern and the oxide film is 180°±10°.

Other desirable aspects of the first invention of the present invention are as follows.

(1.1) The stabilized region or the modified region is formed by radiating light having at least a wavelength falling in the absorption band of the translucent film at an exposure wavelength.

(1.2) The stabilized region or the modified region is formed by radiating infrared light containing at least a wavelength falling in the absorption band of the translucent film in an infrared region.

(1.3) The stabilized region or the modified region is formed by heating.

(1.4) The stabilized region or the modified region is formed by oxidation.

(1.5) The stabilized region or the modified region is formed by promoting the modification reaction by performing oxidation simultaneously with at least one of irradiation and heating.

(1.6) The stabilized region or the modified region is formed by promoting the modification reaction by simultaneously performing irradiation and heating.

(1.7) The stabilized region or the modified region is formed by irradiation in directions including at least a direction from the transparent substrate to the translucent film.

(1.8) The stabilized region or the modified region is formed by performing irradiation by using light containing at least a wavelength falling in the absorption band of a substance constituting the translucent film.

(1.9) The modified region is formed by performing irradiation by using light containing a wavelength $\lambda$ meeting $k1 > k(\lambda)$ (where k is the extinction coefficient of the translucent film, k1 is the extinction coefficient of the translucent film at the exposure wavelength, and $\lambda$ is the wavelength).

(1.10) The translucent film is formed by making the complex index of refraction of the translucent film during film formation differ from a complex index of refraction meeting desired transmittance and phase difference by taking into account a change in the complex index of refraction upon modification, and by adjusting the complex index of refraction to a value meeting the desired transmittance and phase difference by performing at least one of irradiation, heating, and oxidation. In this case, the difference is preferably set by taking account of the shift of the complex index of refraction caused when at least one of irradiation, heating, and oxidation is performed.

Figure 3:
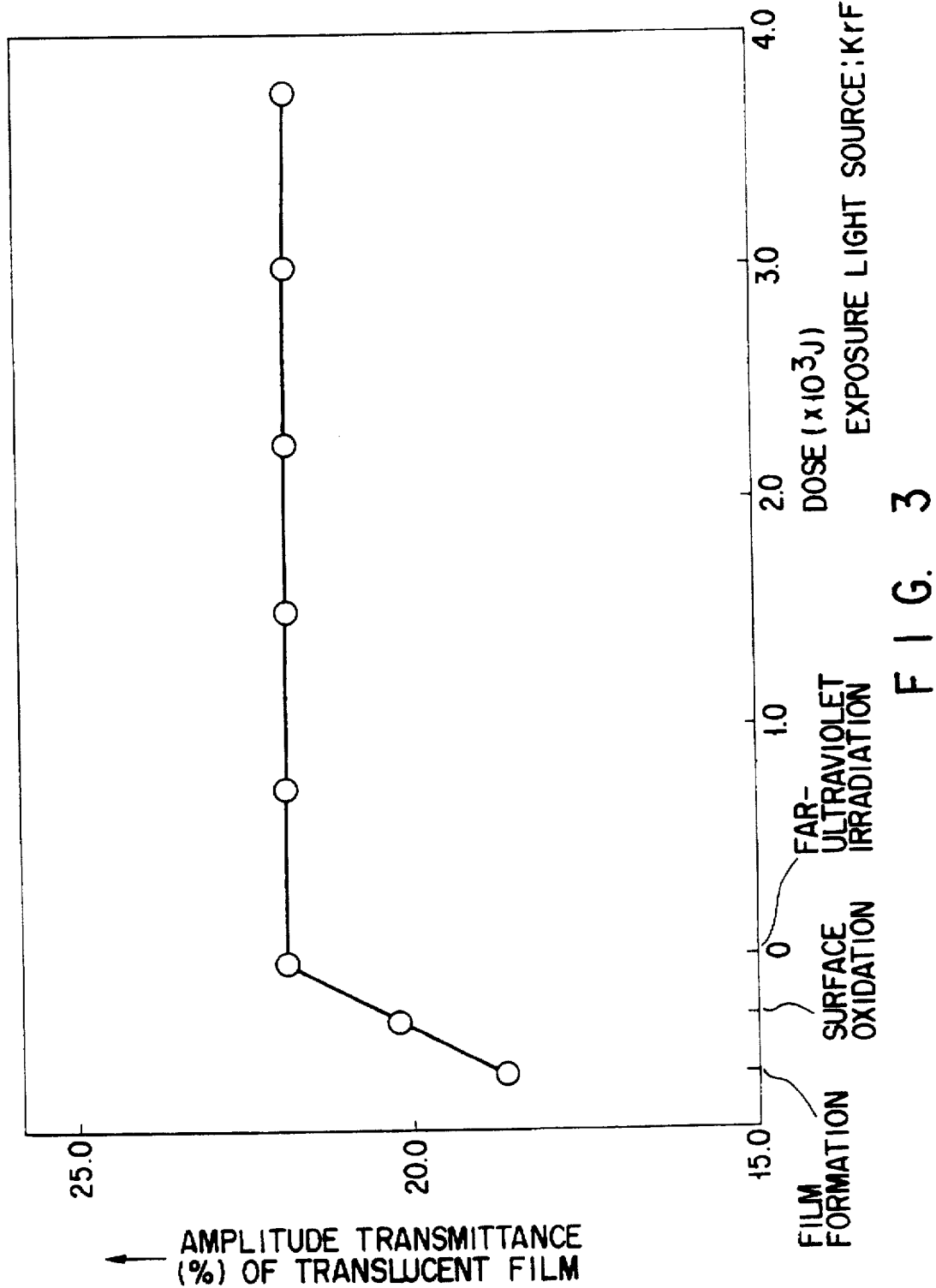
FIG. 3 is a graph showing the change in transmittance of a translucent film (SiN) according to the present invention.

(1.11) A variation in the amplitude transmittance of the translucent film including the modified region is ±0.05% or less at a dose of 800 J/cm$^2$ radiated by an experimental results illustrated in FIG. 3.

The first aspect of the second invention of the present invention is characterized by comprising, in an exposure mask manufacturing method of manufacturing the above exposure mask, the steps of forming a translucent film on a light-transmitting substrate, forming a photosensitive resin film on the translucent film, forming a photosensitive resin pattern by exposing the photosensitive resin film to a radiation or a charged particle beam, removing an exposed portion of the translucent film by using the photosensitive resin pattern as a mask, removing the photosensitive resin pattern, and forming a modified region in the boundary between the light-transmitting substrate and the translucent film by radiating, from at least the light-transmitting substrate to the translucent film, light having a wavelength falling in the absorption band of the translucent film at an exposure wavelength or infrared light containing the absorption band of the translucent film in an infrared region, before the step of forming the photosensitive resin film or after the step of forming the photosensitive resin pattern.

The second aspect of the second invention of the present invention is characterized by comprising, in an exposure mask manufacturing method of manufacturing the above exposure mask, the steps of forming a translucent film on a light-transmitting substrate, forming a photosensitive resin film on the translucent film, forming a photosensitive resin pattern by exposing the photosensitive resin film to a radiation or a charged particle beam, removing an exposed portion of the translucent film by using the photosensitive resin pattern as a mask, removing the photosensitive resin pattern, and modifying the boundary between the light-transmitting substrate and the translucent film or at least a portion of the translucent film by performing at least one of irradiation, heating, and oxidation before the step of forming the photosensitive resin film or after the step of forming the photosensitive resin pattern.

The third aspect of the second invention of the present invention is characterized in that, in a method of manufacturing the exposure mask with the above arrangement, after a translucent film is formed on a transparent substrate, an oxide film with a desired thickness is formed on the translucent film, a photosensitive resin pattern is formed on the oxide film, the oxide film and the translucent film are selectively etched to form a phase-shifting layer having a layered structure of the oxide film and the translucent film by using the photosensitive resin pattern as a mask, and the photosensitive resin pattern is removed.

The fourth aspect of the second invention of the present invention is characterized in that, in a method of manufacturing the exposure mask with the above arrangement, after a translucent film is formed on a transparent substrate, a photosensitive resin pattern is formed on the translucent film, the translucent film is etched by using the photosensitive resin pattern as a mask, the photosensitive resin pattern is removed, and an oxide film with a desired thickness is so formed as to cover the translucent film, thereby forming a phase-shifting layer having a layered structure of the oxide film and the translucent film.

Other desirable aspects of the second invention of the present invention are as follows.

(2.1) The light used in the formation of the stabilized region or the modified region contains at least a wavelength falling in the absorption band of the translucent film at an exposure wavelength.

(2.2) The infrared light used in the formation of the stabilized region or the modified region contains at least a wavelength falling in the absorption band of the translucent film in an infrared region.

(2.3) The stabilized region or the modified region is formed by heating.

(2.4) The heating is performed by using at least one of a hot plate and a high-temperature chamber.

(2.5) The stabilized region or the modified region is formed by oxidizing the translucent film.

(2.6) The oxidation is performed in an atmosphere containing oxygen atoms.

(2.7) The oxidation is performed by dipping into an oxidizing solution.

(2.8) Fuming nitric acid or a solution mixture of sulfuric acid and a hydrogen peroxide solution is used as the oxidizing solution.

(2.9) The stabilized region or the modified region is formed by promoting the modification reaction by performing oxidation simultaneously with at least one of irradiation and heating.

(2.10) The stabilized region or the modified region is formed by irradiation in directions including at least a direction from the transparent substrate to the translucent film.

(2.11) The stabilized region or the modified region is formed by promoting the modification reaction by simultaneously performing irradiation and heating.

(2.12) The light used in the formation of the stabilized region or the modified region contains at least a wavelength falling in the absorption band of a substance constituting the translucent film.

(2.13) The light used in the formation of the stabilized region or the modified region contains a wavelength $\lambda$ meeting k1>k(k) (where k is the extinction coefficient of the translucent film, k1 is the extinction coefficient of the translucent film at the exposure wavelength, and λ is the wavelength).

(2.14) The translucent film is formed by making the complex index of refraction of the translucent film during film formation differ from a complex index of refraction meeting desired transmittance and phase difference by taking into account a change in the complex index of refraction upon modification, and by adjusting the complex index of refraction to a value meeting the desired transmittance and phase difference by performing at least one of irradiation, heating, and oxidation. In this case, the difference is preferably set by taking account of the shift of the complex index of refraction caused when at least one of irradiation, heating, and oxidation is performed.

(2.15) At least one of irradiation, heating, and oxidation is preferably controlled by monitoring the light transmittance, the light reflectance, the complex index of refraction, the change in film thickness, and the phase difference.

(2.16) At least one of irradiation, heating, and oxidation is preferably controlled on the basis of the values of the transmittance and the phase difference calculated from the complex index of refraction and the film thickness.

(2.17) The step of forming the stabilized region or the modified region is performed in a state in which no photosensitive resin film is formed on the translucent film, or in a state in which the photosensitive resin film is formed and patterned by exposure. As the step of forming the stabilized region or the modified region, the light-transmitting substrate is placed in a chamber having an oxygen-containing atmosphere, and the oxide film is formed on the surface of the translucent film simultaneously with the formation of the stabilized region or the modified region performed by irradiation of light.

(2.18) in the step of forming the oxide film, the translucent film is oxidized in an atmosphere containing oxygen atoms.

(2.19) In the step of forming the oxide film, the transparent substrate having the translucent film is dipped in an oxidizing solution to thereby oxidize the surface of the translucent film.

(2.20) Fuming nitric acid or a solution mixture of sulfuric acid and hydrogen peroxide solution is used as the oxidizing solution.

(2.21) The oxide film has a thickness by which the thickness of the translucent film does not increase due to natural oxidation.

(2.22) The translucent film is formed by simultaneously controlling the refractive index and the extinction coefficient by changing the element composition ratio of the translucent film by taking into account the thickness of an oxide film formed by oxidation and the change in the thickness of the translucent film, thereby setting an amplitude transmittance and a phase difference with respect to the substrate at values by which the maximum phase-shifting effect can be achieved.

The first aspect of the third invention of the present invention is characterized by comprising, in an exposure mask manufacturing apparatus for manufacturing the above exposure mask, a first light source for radiating, from a light-transmitting substrate onto a translucent film formed on the substrate, light containing at least a wavelength falling in the absorption band of the translucent film at an exposure wavelength, a second light source for radiating light having the exposure wavelength onto the translucent film, a transmittance measuring unit for detecting light emitted from the second light source and transmitted though the translucent film to measure the light transmittance of the translucent film, and means for controlling the first light source in accordance with the light transmittance measured by the transmittance measuring unit.

The second aspect of the third invention of the present invention is characterized by comprising, in an exposure mask manufacturing apparatus for manufacturing the above exposure mask, a treating unit capable of performing at least one of irradiation, heating, and oxidation for a translucent film formed on a light-transmitting substrate, a light source for radiating light containing at least an exposure wavelength onto the translucent film, and a measuring unit for detecting light emitted from the light source and transmitted through or reflected by the translucent film to measure at least one of the light transmittance, the light reflectance, the complex index of refraction, the change in film thickness, and the phase difference of the translucent film.

Other desirable aspects of the third invention of the present invention are as follows.

(3.1) Even photoirradiation for the light-transmitting substrate and the translucent film is enabled by providing a substrate mounting unit which fixes at least a portion of the periphery of the light-transmitting substrate and rotates parallel to the surface of the light-transmitting substrate.

(3.2) If the information obtained by the measuring unit is the light transmittance, in the treating unit (having the first light source) for performing irradiation, in order for the light transmittance measuring unit to distinguish between light from the first light source and light from the second light source for radiating transmittance measurement light containing an exposure wavelength onto the translucent film, the light components from the two light sources are polarized through linearly polarizing plates arranged such that the polarizing direction of the polarizing plate on the first light source side is perpendicular to that of the polarizing plate on the second light source side. Although the polarizing plate on the second light source side is preferably arranged on each side of the light-transmitting substrate, this polarizing plate can also be arranged on only one side (transmittance measurement side) of the substrate.

(3.3) if the information obtained by the measuring unit is the light transmittance, in the treating unit (having the first light source) for performing irradiation, in order for the light transmittance measuring unit to distinguish between light from the first light source and light from the second light source for radiating transmittance measurement light containing an exposure wavelength onto the translucent film, the wavelengths of the two light sources are made to differ from each other. In order for the transmittance measuring unit to detect only the light from the second light source, it is possible to use a light-receiving unit having wavelength selectivity or a filter for passing the light from the second light source and cutting off the light from the first light source.

(3.4) If the information obtained by the measuring unit is the light transmittance, in the treating unit (having the first light source) for performing irradiation, in order for the light transmittance measuring unit to distinguish between light from the first light source and light from the second light source for radiating transmittance measurement light containing an exposure wavelength onto the translucent film, the irradiation timings of the first and second light sources are shifted from each other. It is desirable that the irradiation from the first light source be performed periodically, and the light transmittance be measured in a time period during which no irradiation is performed by the first light source.

(3.5) The apparatus desirably comprises an analyzing unit for obtaining the phase difference of the translucent film on the basis of the light transmittance and the light reflectance.

(3.6) The apparatus desirably comprises an analyzing unit capable of obtaining the complex index of refraction and the thickness of the translucent film by using an ellipsometer and calculating the phase difference from the complex index of refraction and the film thickness.

(3.7) A gas inlet port is formed in a chamber in which the light-transmitting substrate is placed. The wavelength range of the light emitted from first light source contains at least a wavelength falling in the absorption band of a gas to be fed into the chamber. The gas is fed at the same time the light is emitted from the first light source, thereby also causing a reaction with the gas.

(3.8) Light emitted from gas molecules pumped by the light emitted from the first light source contains at least a wavelength falling in the absorption band of the translucent film at an exposure wavelength.

(3.9) The gas or the optically pumped gas has oxidizing properties.

(3.10) Light emitted from gas molecules pumped by the light emitted from the first light source is polarized in a direction perpendicular to the direction of the light emitted from the second light source.

In the present invention, examples of the material frequently used in manufacturing the translucent phase-shifting film as a single-layer film are elements such as Si, Cr, Ge, Ti, Ta, Al, Sn, MoSi, and WSi; carbon; and an oxide, a nitride, a carbide, a hydride, and a halide of any of these substances, and their mixtures. These films have an intermediate composition in order to have the function of simultaneously controlling the transmittance and the phase difference as mentioned earlier. For this reason, the bonded state of the molecules in the film is not necessarily stable. In such a film, electrons contributing to the bond are excited by the radiation energy during exposure. Consequently, the bonded state changes from that during film formation. This varies the optical constant of the film, particularly, the amplitude transmittance to the exposure wavelength.

In the present invention, therefore, a translucent film consisting of, e.g., Si is formed, and an oxide region with a desired thickness is formed by oxidizing this Si film. This oxide region having a predetermined thickness or larger can prevent an increase in film thickness resulting from, e.g., natural oxidation of the underlying Si film. Therefore, it is possible to maintain the initially set optical constants such as an ideal phase and transmittance of the translucent film. Consequently, the deterioration with time of the film quality of the translucent film can be prevented, and this makes it possible to realize an ideal phase difference and amplitude transmittance of the halftone phase-shifting mask.

FIG. 1 shows the change in amplitude transmittance caused by exposure when SiN for KrF laser exposure is used as a translucent phase-shifting film. The present inventors have studied a method of oxidizing the surface of a translucent film in order to stabilize the translucent film. This method can achieve the stabilization with time of the translucent film. Even in this method, however, the amplitude transmittance of the translucent film rises upon exposure, producing a shift from a desired optical constant.

Figure 2:
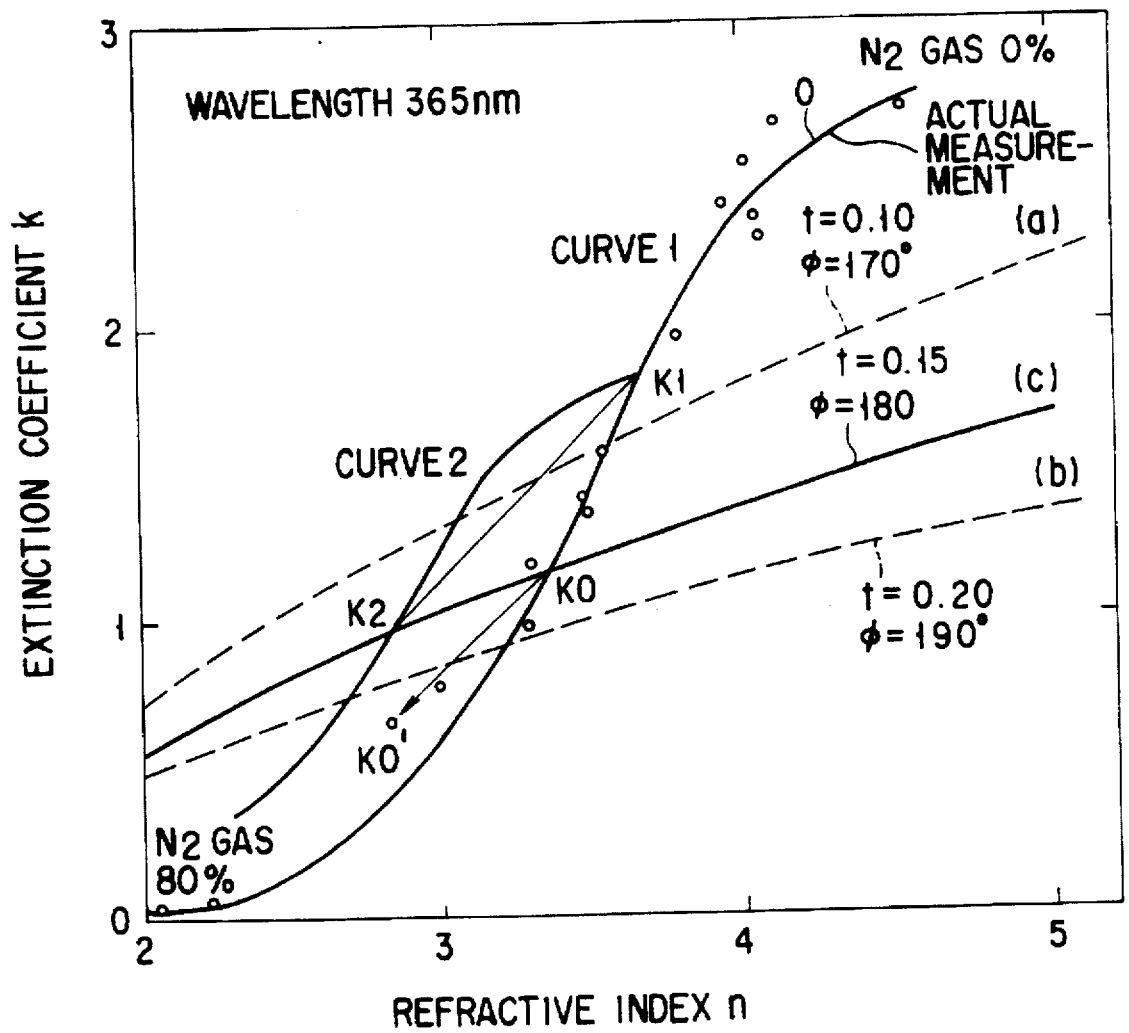
FIG. 2 is a graph showing the relationship between the refractive index n and the extinction coefficient k obtained when an i-line is used as an exposure wavelength and the composition ratio of SiN is changed.

In the case of SiN for i-line exposure, as shown in FIG. 2, a point K0 at which a desired refractive index n and a desired extinction coefficient k are satisfied is shifted to a point K0' upon exposure. Consequently, neither an optimal transmittance nor an optimal phase difference can be obtained.

In the present invention, therefore, after a translucent film is formed and before it is used as an exposure mask, at least one of irradiation, heating, and oxidation is performed to stabilize the film, thereby suppressing variations in film quality caused by exposure and variations in physical properties with time. In this case, the irradiation is desirably a direct or indirect irradiation of a radiation limited to a wavelength at which the translucent phase-shifting film can be stabilized most efficiently. Consequently, as shown in FIG. 3, the change in amplitude transmittance caused by exposure when SiN is used as the translucent phase-shifting film can be eliminated nearly completely.

In this case, as shown in FIG. 3, the variation in amplitude transmittance of the film after the film is stabilized is desirably ±0.05% or less with a dose of 800 J per exposure.

Note that the present invention involves performing heating in order to activate the reaction during oxidation or irradiation.

Figure 4:
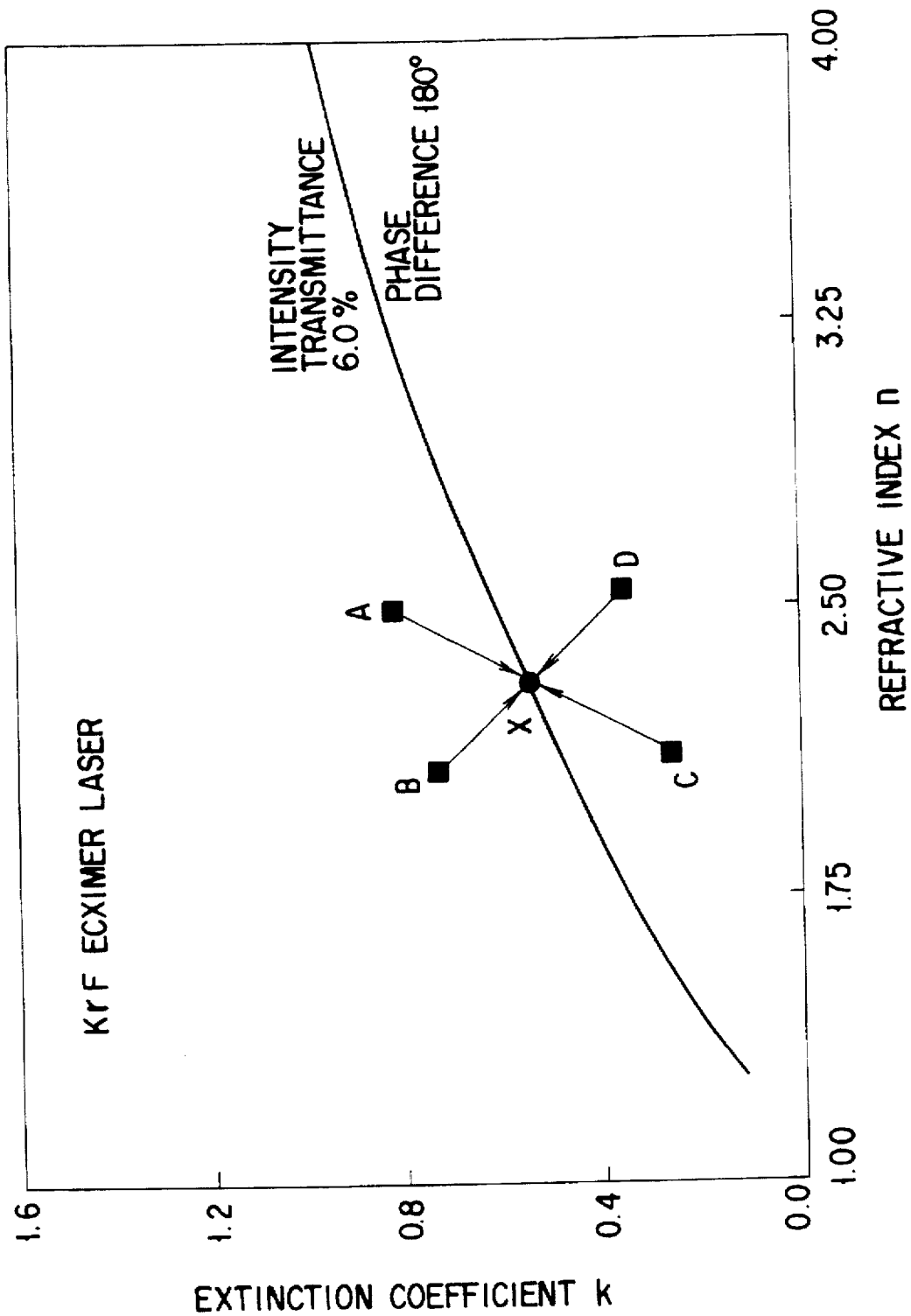
FIG. 4 is a graph showing the difference between the complex indices of refraction before and after stabilization is performed according to the present invention.

In addition, as shown in FIG. 4, by taking into consideration the change in complex index of refraction produced by at least one of irradiation, heating, and oxidation, the refractive index as the complex index of refraction and the extinction coefficient of a translucent film during film formation are set at points (A, B, C, and D in FIG. 4) shifted from their respective desired values. This makes it possible to obtain the condition (point X in FIG. 4) under which the maximum phase-shifting effect can be achieved after the stabilized region or the modified region is formed. In this case, the direction of adjustment is preferably set along the direction of the curve plotting the extinction coefficient k as a function of the refractive index n obtained when the composition ratio is changed. It is preferable that (n,k) curve is determined by considering an incident angle of an exposure light.

Figure 6:
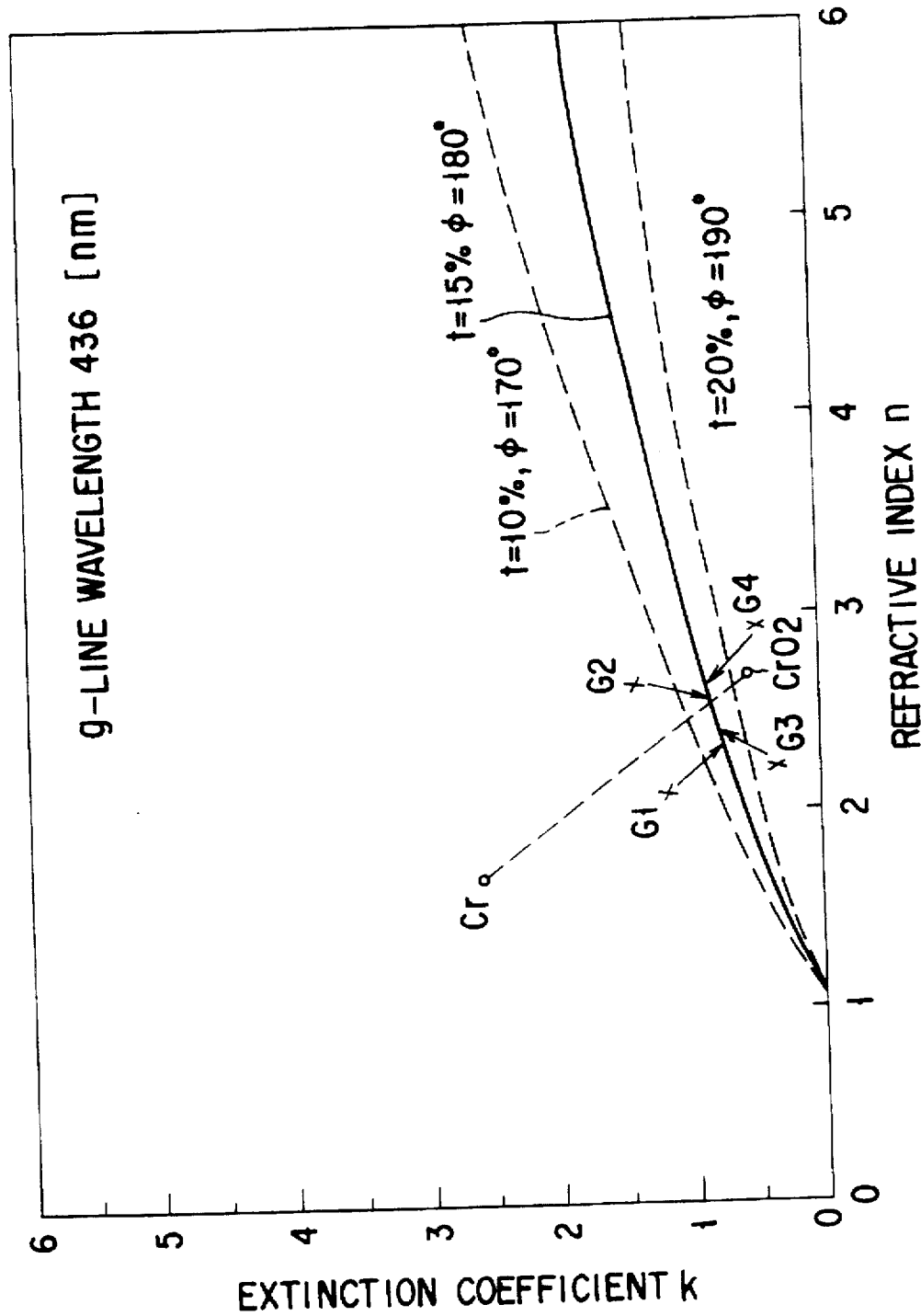
FIG. 6 is a graph showing the relationship between the refractive index n and the extinction coefficient k obtained when a g-line is used as an exposure wavelength and the composition of CrO is changed.

FIG. 5 shows examples of the curve plotting the extinction coefficient k as a function of the refractive index n obtained when an i-line is used as an exposure wavelength and the composition of CrO is changed. The refractive index n and the extinction coefficient k of the translucent film obtained in this case take points E1, E2, E3, and E4 depending on the film formation conditions. By setting the refractive index n and the extinction coefficient k to a point shifted from a desired point (points E1-E4 in FIG. 5), it is possible to obtain the condition (curve 11) under which the maximum phase-shifting effect can be achieved after at least one of irradiation, heating, and oxidation is performed. Similar results are obtained when a g-line is used as an exposure wavelength as shown in FIG. 6. It is preferable that (n,k) curve is determined by considering an incident angle of an exposure light.

Figure 7:
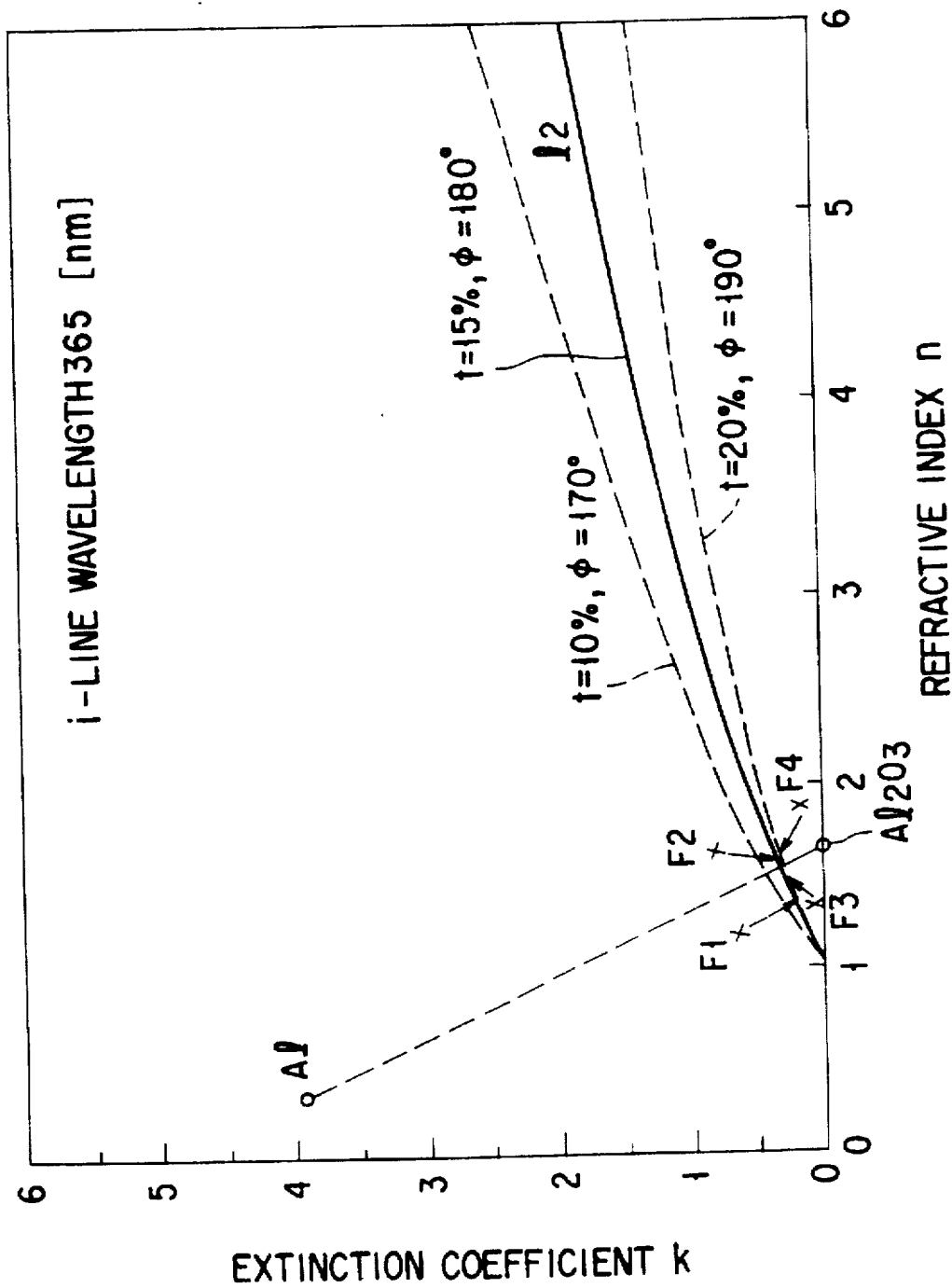
FIG. 7 is a graph showing the relationship between the refractive index n and the extinction coefficient k obtained when an i-line is used as an exposure wavelength and the composition of AlO is changed.
Figure 8A:
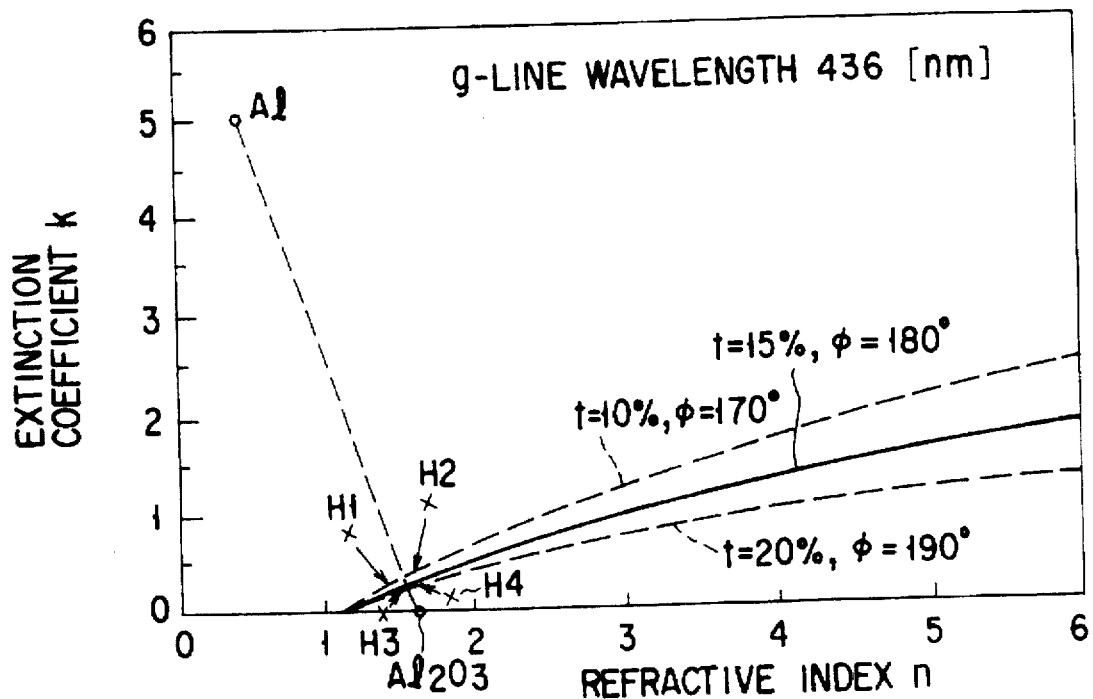
FIGS. 8A and 8B are graphs showing plots of the relationship between the refractive index n and the extinction coefficient k obtained when a g-line and a KrF laser, respectively, are used as exposure wavelengths and the composition of AlO is changed.
Figure 8B:
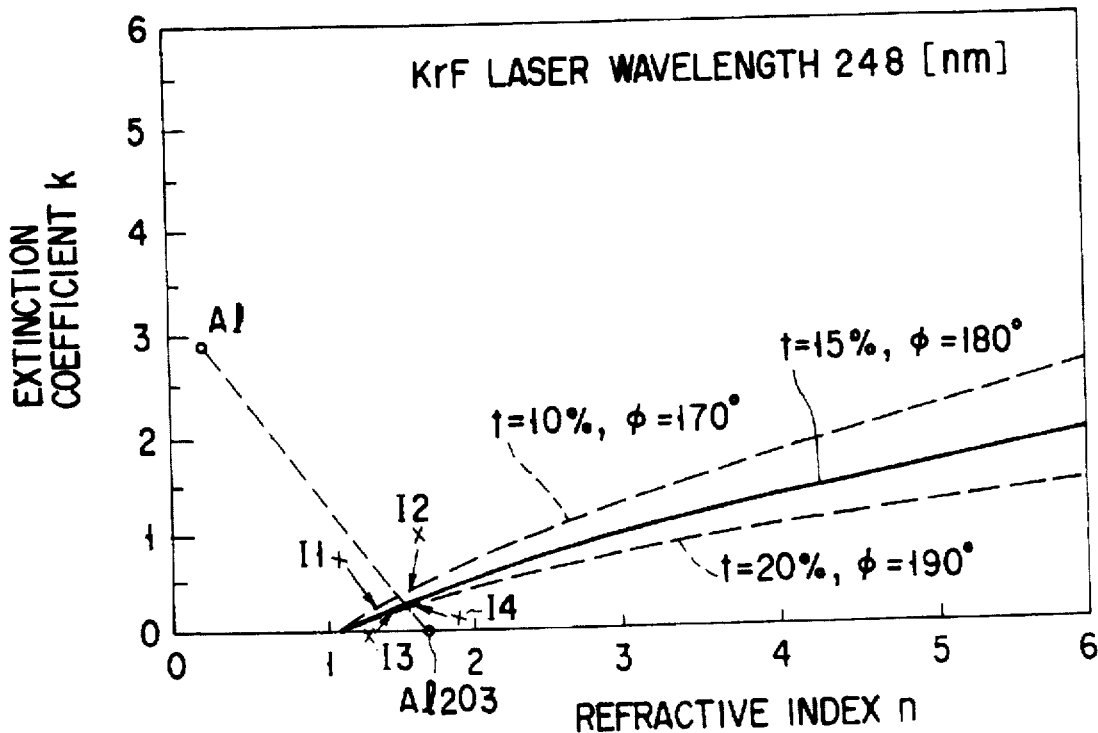
Figure 9A:
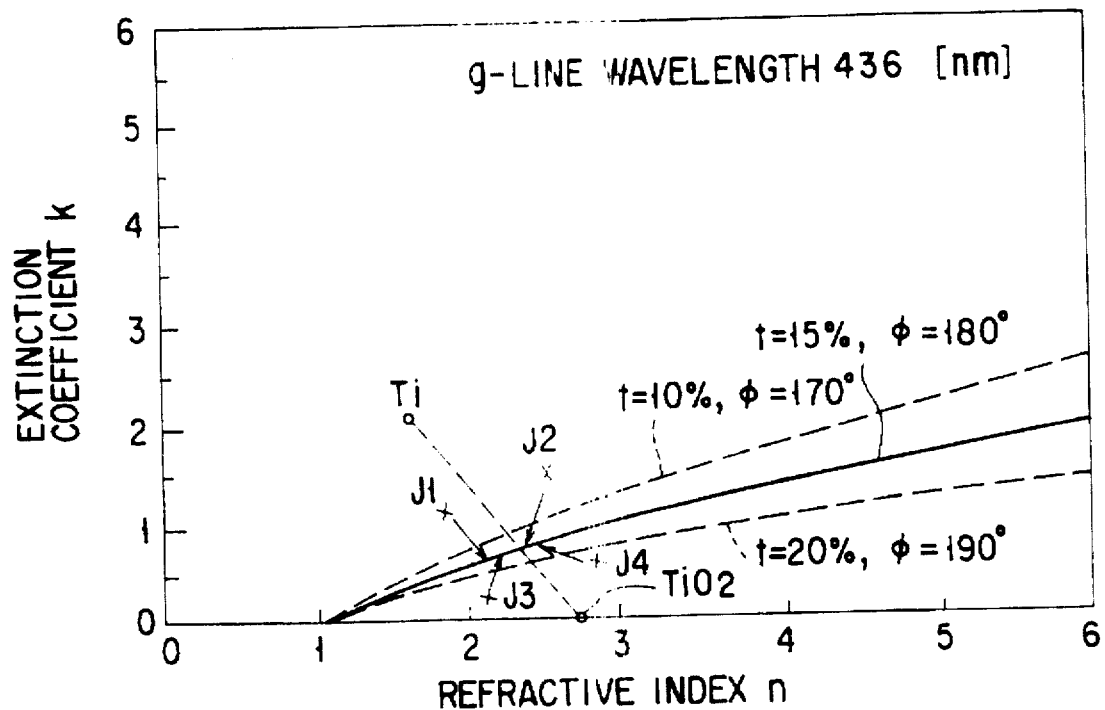
FIGS. 9A and 9B are graphs showing plots of the relationship between the refractive index n and the extinction coefficient k obtained when a g-line and an i-line, respectively, are used as exposure wavelengths and the composition of TiO is changed.
Figure 9B:
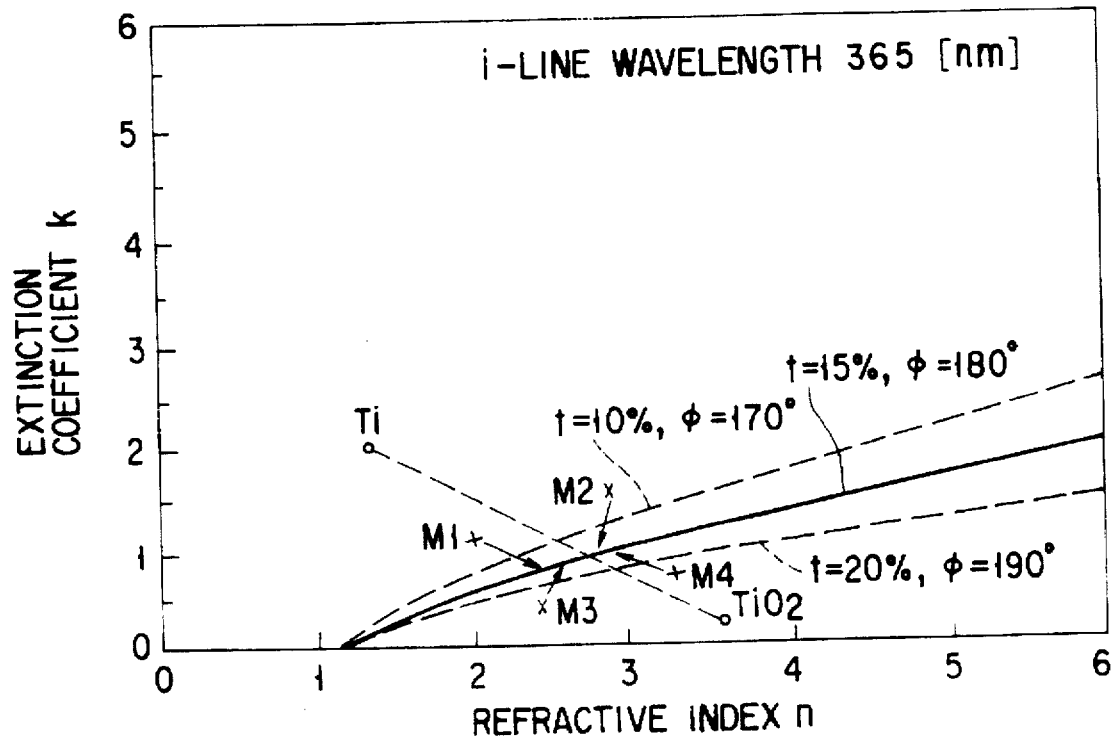

FIG. 7 illustrates examples of the curve plotting the extinction coefficient k as a function of the refractive index n obtained when an i-line is used as an exposure wavelength and the composition ratio of AlO is changed. As in the above case, the refractive index n and the extinction coefficient k are set to a point shifted from a desired point (points F1-F4 in FIG. 7). These shift amounts are preferably set by taking into account the shift of the complex index of refraction produced by at least one of irradiation, heating, and oxidation. Consequently, it is possible to obtain the condition (curve 12) under which the phase-shifting effect can be fully exhibited after the stabilized region is formed. Similar results are obtained when a g-line and a KrF laser are used as exposure wavelengths as shown in FIGS. 8A and 8B, respectively, and when a g-line and an i-line are used as exposure wavelengths and TiO is used, as shown in FIGS. 9A and 9B, respectively. It is preferable that (n,k) curve is determined by considering an incident angle of an exposure light.

The foregoing is true for metal compounds containing compositions, such as CrN, CRON, AlON, AlN, TiO, TiN, and TiON, other than CrO and AlO.

It is, however, necessary to determine the change quantity by the following method if oxygen is added through an oxidation reaction to the substances, e.g., CrN, AlN, or TiN which constitute the translucent film. For example, when an i-line and an SiO film are used, the curve plotting the extinction coefficient k as a function of the refractive index n obtained when the composition is changed is illustrated in FIG. (n,k) curve 1 obtained by changing the composition ratio of N of SiN is first calculated, and a compound (N composition ratio α) as a target of film formation is predetermined (point K1) from this (n,k) curve. Subsequently, an amount of the oxygen added by oxidation and an (n,k) point shift produced by irradiation or heating are estimated from (n,k) curve 2 calculated by changing the oxygen composition in $SiN_\alpha O$. Consequently, a point K2 at which desired (n,k) are met can be obtained. Note that in curve 2, the N composition ratio a must be lower than an N composition ratio β at the point K0. It is preferable that n,k) curve is determined by considering an incident angle of an exposure light.

In addition, the use of an exposure mask manufacturing apparatus of the present invention makes it possible to obtain the transmittance and the phase difference during stabilization. Consequently, exposure masks that can achieve the maximum phase-shifting effect can be manufactured with a high reproducibility.

Note that the present invention can be applied not only to an SiN film but to films of SiO, SiON, an SiN—SiO mixture, CrO, CrN, CRON, AlO, AlON, AlN, MoSiO, MoSiN, MoSiNO, TiO, TiN, TiON, WSi, WSiO, and WSiON. Note also that an identical effect can be obtained by performing nitriding, halogenation, hydrogenation, or carbonization, instead of oxidation.

The embodiments of the present invention will be described below with reference to the accompanying drawings.

(Embodiment 1)

FIGS. 10A to 10F are sectional views showing the steps of manufacturing an exposure mask according to the first embodiment of the present invention. In this embodiment, a KrF laser was used as an exposure light source, and SiN was used as the material of a semiconductor film of a halftone mask.

Figure 11:
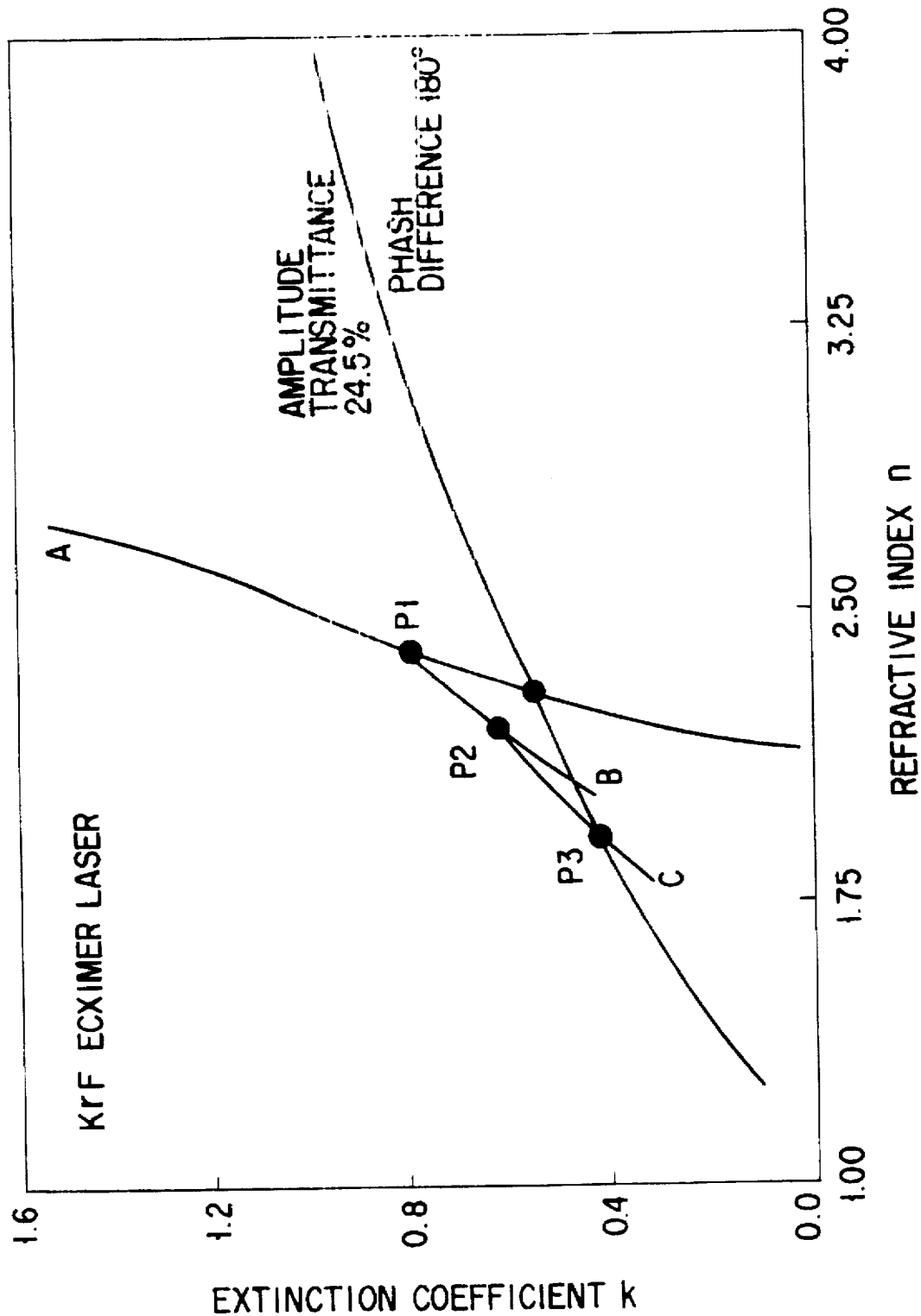
FIG. 11 is a graph showing the relationship between the refractive index n and the extinction coefficient k obtained when the composition ratio of SiN is changed, particularly (n,k) curves changing due to addition of oxygen and photoirradiation.
Figure 12A:
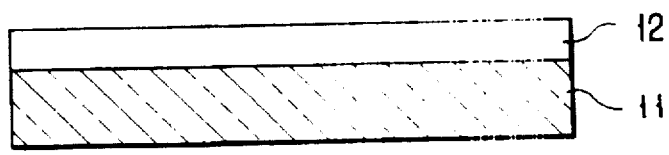
FIGS. 12A to 12F are sectional views showing the steps of manufacturing an exposure mask according to the first embodiment of the present invention.
Figure 12B:
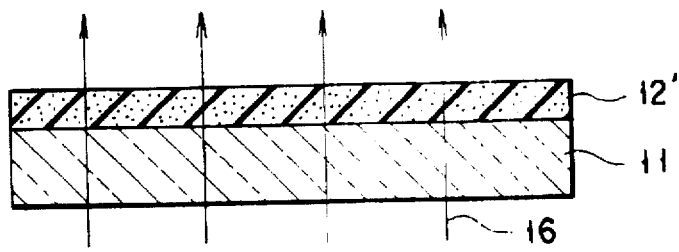
Figure 12C:
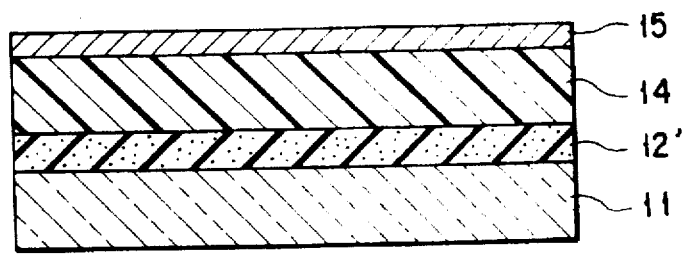
Figure 12D:
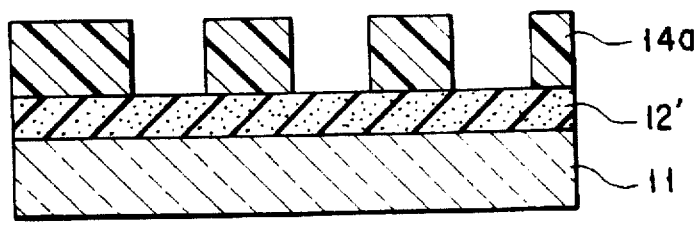
Figure 12E:
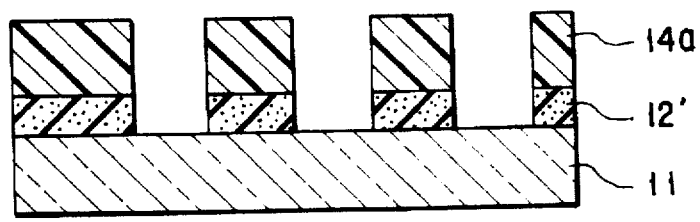
Figure 12F:
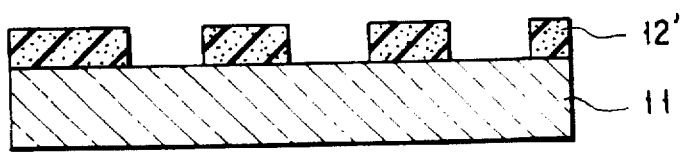

FIG. 11 is a graph showing the changes in the refractive index n and the extinction coefficient k in this embodiment. Referring to FIG. 11, a curve A indicates an (n,k) curve corresponding to a composition ratio when an SiN film was formed by sputtering; a curve B, an (n,k) curve corresponding to an addition amount when an $SiN_x$ composition at a point P1 was fixed and oxygen was added; and a curve C, an (n,k) curve obtained by reducing dangling bonds by photoirradiation with respect to an $SiN_xO_y$ composition at a point P2.

Figure 10A:
FIGS. 10A to 10F are sectional views showing the steps of manufacturing an exposure mask according to the first embodiment of the present invention.
Figure 10B:
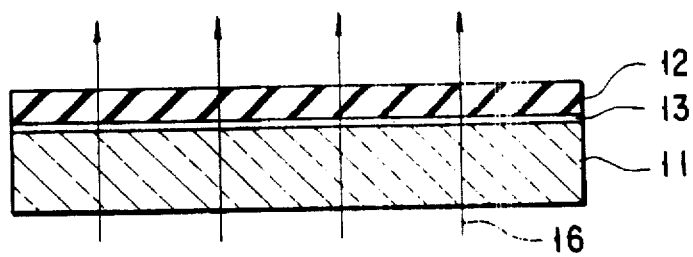

To begin with, as shown in FIG. 10A, a 96-nm thick SiN film (translucent film) 12 is formed on a transparent substrate 11 consisting of, e.g., quartz by performing sputtering. The amplitude transmittance of the translucent film 12 at that time was found to be 17.6% (the point P1 in FIG. 11).

Subsequently, to prevent the deterioration with time of the surface of the translucent film, the translucent film 12 is modified by dipping the substrate 11 in an oxidizing solution mixture of a hydrogen peroxide solution and sulfuric acid. This modification was evenly performed on the surface, and the resultant amplitude transmittance of the translucent film 12 was 20.1% (the point P2 in FIG. 11).

Subsequently, as shown in FIG. 11B, far-ultraviolet radiation 16 with a wavelength near 300 nm is evenly radiated from a mercury lamp onto the substrate 11 in a direction from the substrate to the translucent film, thereby performing optical stabilization. Consequently, a stabilized region 13 is formed in the interface between the substrate 11 and the translucent film 12. During the stabilization, the amplitude transmittance of the translucent film 12 including the stabilized region or the modified region 13 changed to 24.5% the point P3 in FIG. 11).

Note that the refractive index, the extinction coefficient, and the film thickness of the SiN film during the film formation were set by taking into account the oxidation reaction in the oxidizing solution mixture and the changes in refractive index, extinction coefficient, and film thickness caused by the far-ultraviolet irradiation, so that desired transmittance and phase difference were obtained after the oxidation reaction and the ultraviolet irradiation.

Figure 10C:
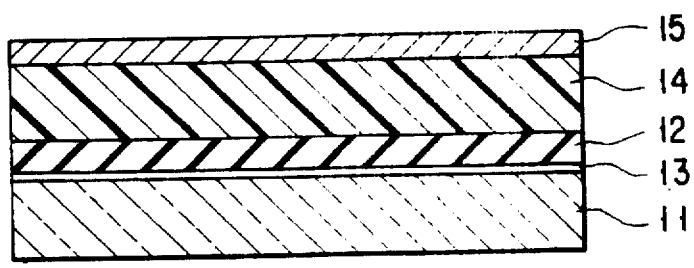
Figure 10D:
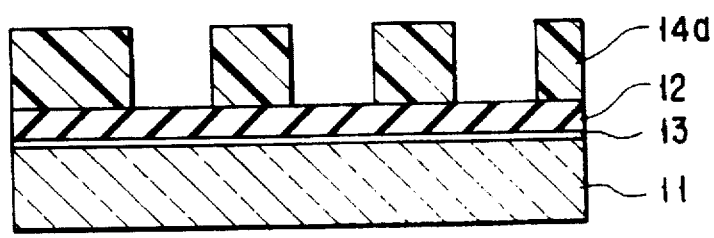

Then, as shown in FIG. 10C, an electron beam resist (to be referred to as an EB resist hereinafter) 14 is coated on the SiN film 12, and a conductive film 15 is formed on the EB resist 14 to prevent charge-up occurring when EB drawing is performed. Thereafter, as shown in FIG. 10D, a desired pattern 14a is formed by EB drawing.

Figure 10E:
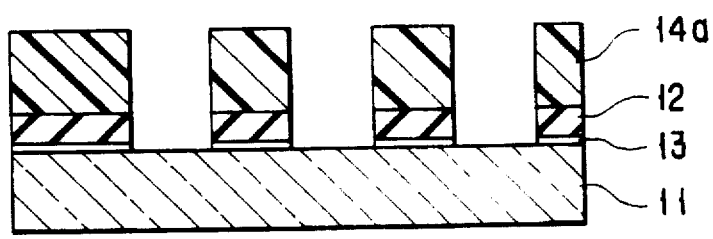
Figure 10F:
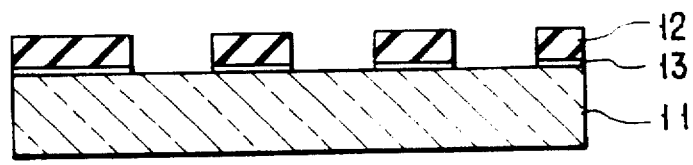

Subsequently, as shown in FIG. 10E, the SiN film 12 is patterned by selectively etching the SiN film by using the resist pattern 14a as a mask. Examples of the etching are CDE (Chemical Dry Etching) and RIE (Reactive ion Etching). Thereafter, the resist pattern 14a is removed to complete an exposure mask as shown in FIG. 10F.

In FIGS. 10A to 10F, the structure in which the stabilized region or the modified region 13 is formed in the interface between the substrate 11 and the translucent film 12 is illustrated. However, the stabilized region or the modified region 13 need not always be clearly distinguished from the translucent film 12 but may be formed by modifying the translucent film 12. An example of this is shown in FIGS. 12A to 12F. The manufacturing steps shown in FIGS. 12A to 12F are identical with those shown in FIGS. 10A to 10F, and a stabilized region 12' is formed instead of the stabilized region 13. As the dot density of the region 12' shown in FIGS. 12B to 12F increases, the bonded state is more stabilized.

In the method of this embodiment as discussed above, the stabilized region 13 or the stabilized region 12' is formed in the interface between the transparent substrate 11 and the translucent film 12. Therefore, as shown in FIG. 3, the film quality is not deteriorated by irradiation of exposure light, so the performance of the film is kept stable. For this reason, when the translucent film is used in actual exposure, it is possible to prevent physical property variations in the translucent film upon irradiation of exposure light. This contributes to improvements in the pattern transfer accuracy.

In this embodiment, the stabilized region 13 or the stabilized region 12' is formed by photoirradiation. However, these regions can also be formed by heating or by promoting the stabilization reaction by simultaneously performing photoirradiation and heating.

In addition, the mercury lamp is used as the light source of a radiation in this embodiment, but it is also possible to use another light source, e.g., a xenon lamp in combination with a cutoff filter. Also, the SiN film is used as the translucent film in this embodiment. However, similar effects can be obtained by using a translucent film consisting of, e.g., Si, Cr, Ge, Ti, Ta, Al, Sn, MoSi, or WSi; carbon; or an oxide, a nitride, a carbide, a hydride, or a halide of any of these metals, or a mixture thereof. The present invention is also applicable to a translucent film to be exposed to, e.g., an i-line or a g-line of a mercury lamp or ArF laser light.

Furthermore, in this embodiment, the oxidizing solution mixture of a hydrogen peroxide solution and sulfuric acid is used in the surface oxidation treatment. However, a substance with a strong oxidizing effect, such as fuming nitric acid, is also usable. It is also possible to expose the film to an oxidizing gas atmosphere such as ozone. The oxide film can also be formed by a CVD process. in addition, in order for the dot density (e.g., the oxygen concentration) of the region 12' shown in FIGS. 12B to 12F to have a gradient inside the film, the film formation conditions and the modification conditions can be adjusted such that the dangling bonds are gradually decreased from the transparent substrate or the oxygen concentration is gradually decreased from the surface of the translucent film. In this case, although the refractive index and the extinction coefficient continuously change inside the film, they can be adjusted by the method illustrated in FIG. 4 by using the average refractive index and extinction coefficient of the film obtained by measurements using an ellipsometer or the like. Furthermore, the thickness of the translucent film can take any given value within a range not departing from the gist of the present invention. Also, instead of forming the conductive film on the translucent film, a film serving as an antistatic film may be formed on the substrate in advance. it is preferable that (n,k) curve is determined by considering an incident angle of an exposure light.

(Embodiment 2)

FIGS. 13A to 13E are sectional views showing the steps of manufacturing an exposure mask according to the second embodiment of the present invention. In this embodiment, a KrF laser was used as an exposure light source, and SiN was used as the material of a translucent film of a halftone mask.

Figure 13A:
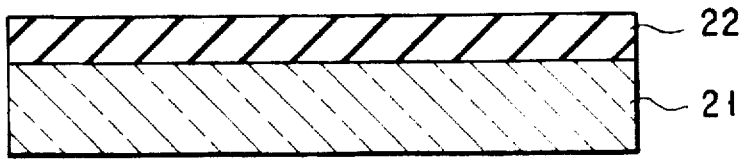
FIGS. 13A to 13E are sectional views showing the steps of manufacturing an exposure mask according to the second embodiment of the present invention.

To begin with, as shown in FIG. 13A, a 96-nm thick SiN film (translucent film) 22 is formed on a transparent substrate 21 by sputtering. The amplitude transmittance of the translucent film 22 at that time was found to be 17.6%. Subsequently, to prevent the deterioration with time of the surface of the translucent film, the substrate 21 is dipped in an oxidizing solution mixture of a hydrogen peroxide solution and sulfuric acid, thereby stabilizing the surface. The resultant amplitude transmittance of the translucent film 22 was 20.1%.

Figure 13B:
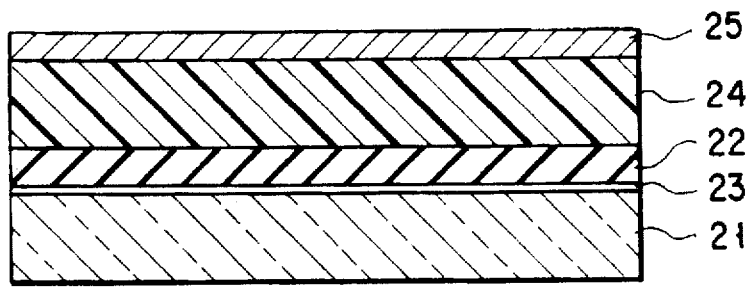
Figure 13C:
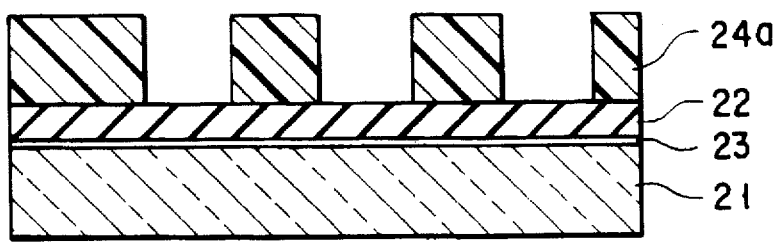

Subsequently, as shown in FIG. 13B, an EB resist 24 is coated on the SiN film 22, and a conductive film 25 is formed on the EB resist 24 to prevent charge-up occurring when EB drawing is performed. Thereafter, as shown in FIG. 13C, a desired resist pattern 24a is formed by EB drawing.

Figure 13D:
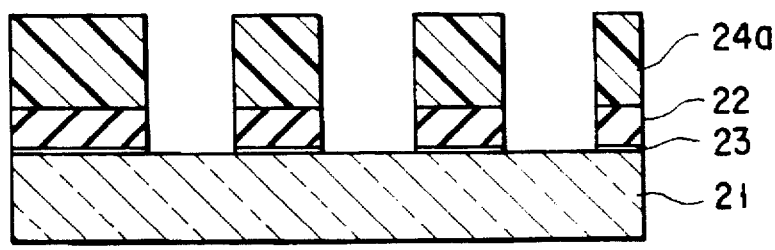

Then, as shown in FIG. 13D, the SiN film 22 is patterned by selectively etching the SiN film by using the resist pattern 24a as a mask. Examples of the etching are CDE and RIE.

Figure 13E:
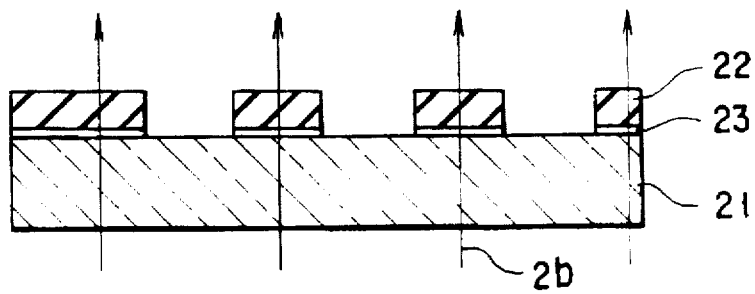
Figure 14A:
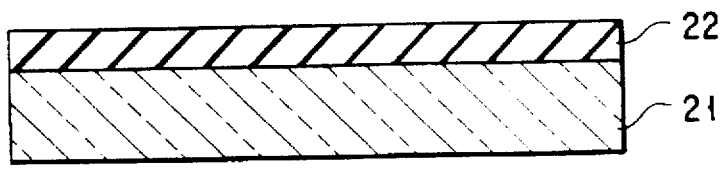
FIGS. 14A to 14E are sectional views showing the steps of manufacturing an exposure mask according to the second embodiment of the present invention.
Figure 14B:
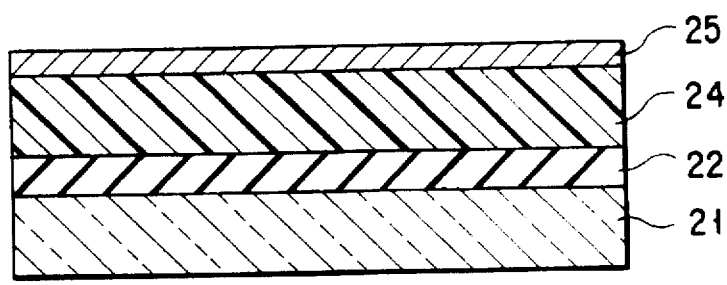
Figure 14C:
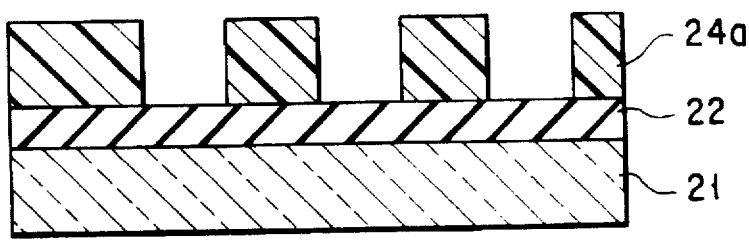
Figure 14D:
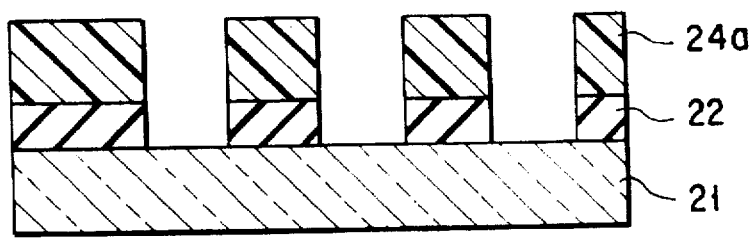
Figure 14E:
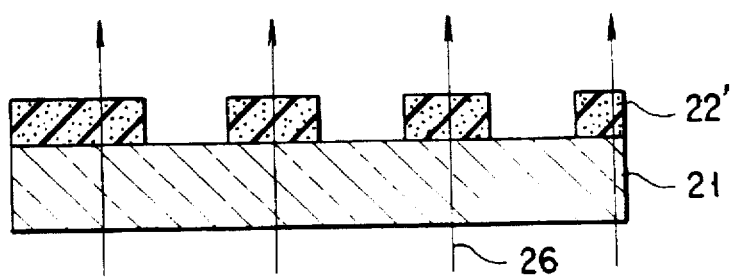

Finally, as shown in FIG. 13E, after the resist pattern 24a is removed, far-ultraviolet radiation 26 with a wavelength near 300 nm is evenly radiated from a mercury lamp onto the substrate 21 in a direction from the substrate to the translucent film, thereby performing optical stabilization. Consequently, a stabilized region 23 is formed. During the stabilization, the amplitude transmittance of the translucent film 22 including the stabilized region 23 changed to 21.9%.

Note that the refractive index, the extinction coefficient, and the film thickness of the SiN film during the film formation were set by taking into account the oxidation reaction in the oxidizing solution mixture and the changes in refractive index, extinction coefficient, and film thickness caused by the far-ultraviolet irradiation, so that desired transmittance and phase difference were obtained after the oxidation reaction and the far-ultraviolet irradiation.

In FIGS. 13A to 13E, the structure in which the stabilized region 23 is formed in the interface between the substrate 21 and the translucent film 22 is illustrated. However, the stabilized region 23 is not necessarily clearly distinguished from the translucent film 22 but may be formed by modifying the translucent film 22. An example of this is shown in FIGS. 14A to 14E. The manufacturing steps shown in FIGS. 14A to 14E are identical with those shown in FIGS. 13A to 13E, and a stabilized region 22' is formed instead of the stabilized region 23.

In the method of this embodiment as discussed above, the stabilized region 23 or the stabilized region 22' is formed in the interface between the transparent substrate 21 and the translucent film 22. Therefore, the film quality is not deteriorated by irradiation of exposure light, so the performance of the film is kept stable. This makes it possible to obtain effects similar to those of the first embodiment. In this embodiment, various modifications can be made as discussed earlier in the first embodiment.

(Embodiment 3)

FIGS. 15A to 15F are sectional views showing the steps of manufacturing an exposure mask according to the third embodiment of the present invention. In this embodiment, an i-line of a mercury lamp was used as an exposure light source, and SiN was used as the material of a translucent film of a halftone mask.

FIG. 16 shows changes in the refractive index n and the extinction coefficient k in this embodiment. Referring to FIG. 16, a curve A' indicates an (n,k) curve corresponding to a composition ratio when an SiN film was formed by sputtering; and a curve B', an (n,k) curve obtained by increasing the oxygen concentration and decreasing the number of dangling bonds when the $SiN_x$ composition at a point P1' was fixed and irradiation and oxidation were simultaneously performed.

Figure 15A:
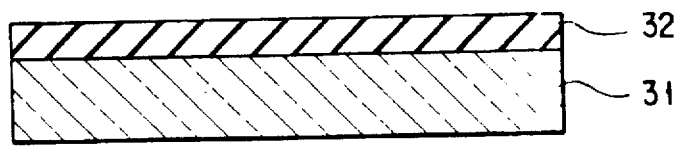
FIGS. 15A to 15F are sectional views showing the steps of manufacturing an exposure mask according to the third embodiment of the present invention.

First, as shown in FIG. 15A, a 97-nm thick SiN film (translucent film) 32 is formed on a transparent substrate 31 by sputtering. The amplitude transmittance of the translucent film 32 at that time was found to be 20.0% (P1' in FIG. 16).

Figure 15B:
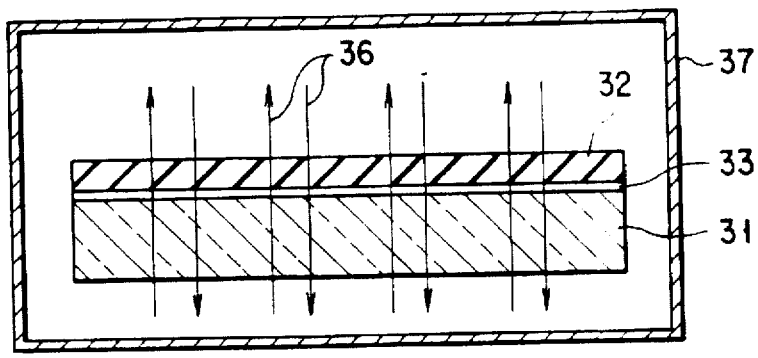

Subsequently, as shown in FIG. 15B, far-ultraviolet radiations 36 having wavelengths of 185 and 254 nm are radiated evenly in a direction from the substrate to the translucent film and a direction from the translucent film to the substrate from low-pressure mercury lamps arranged at two positions inside a chamber 37 containing oxygen. Consequently, the 185-nm far-ultraviolet radiation is absorbed by the oxygen in the chamber 37 to produce ozone, and this ozone emits light having a wavelength near 300 nm when deexcited by the oxygen. This light forms a stabilized region 33 in the boundary between the substrate 31 and the translucent film 32.

When, on the other hand, the 254-nm far-ultraviolet radiation is absorbed by the ozone, excited oxygen atoms are produced. These excited oxygen atoms react with the SiN film 32 to form an oxide film. This eliminates the treatment for preventing the deterioration with time of the translucent film 32. At that time, the amplitude transmittance of the translucent film 32 including the stabilized region 33 changed to 21.9% (P2' in FIG. 16).

Note that the refractive index, the extinction coefficient, and the film thickness of the SiN film during the film formation were set by taking into account the oxidation reaction by the ozone and the excited oxygen atoms and the changes in refractive index, extinction coefficient, and film thickness caused by the far-ultraviolet irradiation, so that desired transmittance and phase difference were obtained after the oxidation reaction by the ozone and the excited oxygen atoms and the ultraviolet irradiation.

Figure 15C:
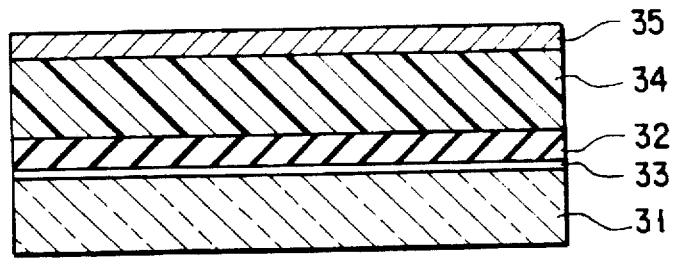
Figure 15D:
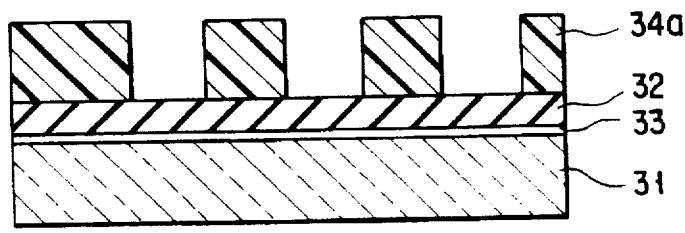

Subsequently, as shown in FIG. 15C, an EB resist 34 is coated on the SiN film 32, and a conductive film 35 is formed on the EB resist 34 to prevent charge-up occurring when EB drawing is performed. Thereafter, as shown in FIG. 15D, a desired resist pattern 34a is formed by EB drawing.

Figure 15E:
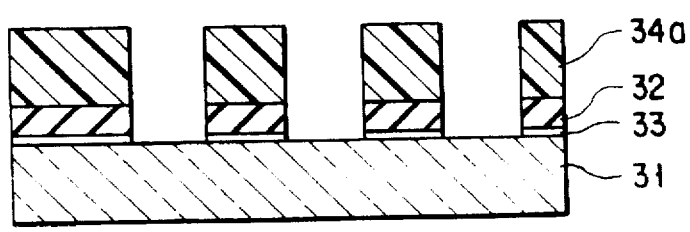
Figure 15F:
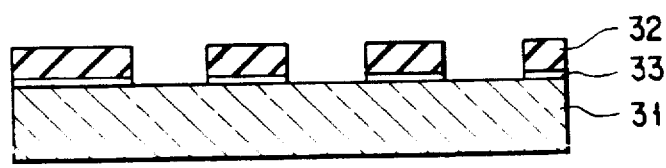
Figure 17A:
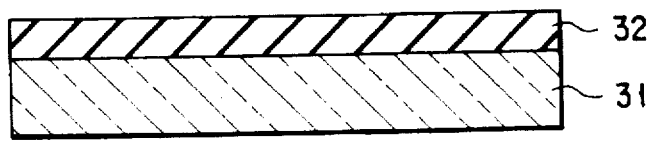
FIGS. 17A to 17F are sectional views showing the steps of manufacturing an exposure mask according to the third embodiment of the present invention.
Figure 17B:
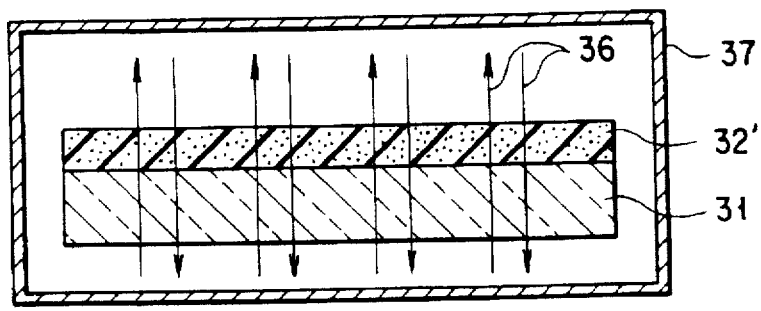
Figure 17C:
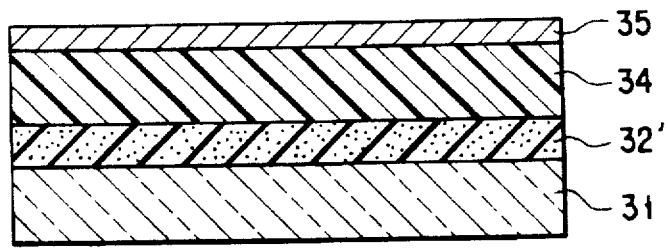
Figure 17D:
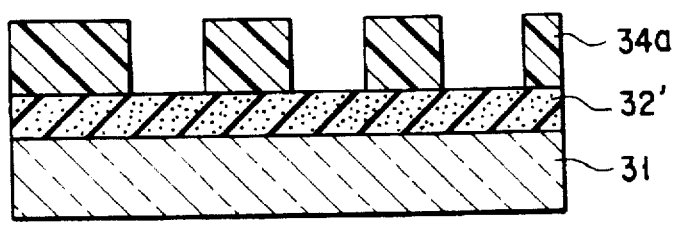
Figure 17E:
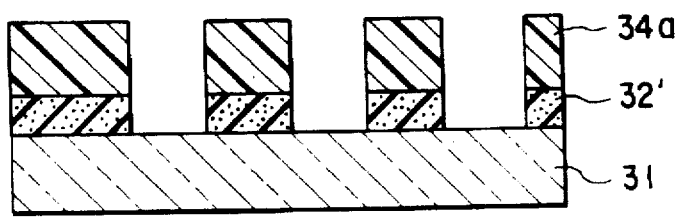
Figure 17F:
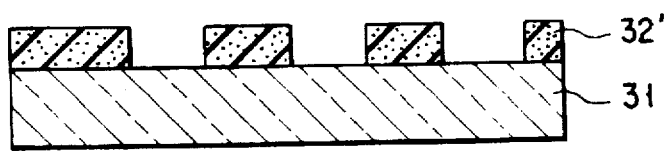

Then, as shown in FIG. 15E, the SiN film 32 is patterned by selectively etching the SiN film by using the resist pattern 34a as a mask. Examples of the etching are CDE and RIE. After the SiN film pattern is formed by this etching, the resist pattern 34a is removed to complete an exposure mask as shown in FIG. 15F.

In FIGS. 15A to 15F, the structure in which the stabilized region 33 is formed in the interface between the substrate 31 and the translucent film 32 is illustrated. However, the stabilized region 33 need not always be clearly distinguished from the translucent film 32 but may be formed by modifying the translucent film 32. An example of this is shown in FIGS. 17A to 17F. The manufacturing steps shown in FIGS. 17A to 17F are identical with those shown in FIGS. 15A to 15F, and a stabilized region 32' is formed instead of the stabilized region 33.

In addition, although the stabilized region 33 or the stabilized region 32' is formed by photoirradiation in this embodiment, they can also be formed by promoting the stabilization reaction by performing a high-temperature heat treatment simultaneously with the photoirradiation.

In the method of this embodiment as discussed above, the stabilized region 33 or the stabilized region 32' is formed in the interface between the transparent substrate 31 and the translucent film 32. Therefore, the film quality is not deteriorated by irradiation of exposure light, so the performance of the film is kept stable. This makes it possible to obtain effects similar to those of the first embodiment. In this embodiment, various modifications can be made as discussed earlier in the first embodiment.

(Embodiment 4)

FIGS. 18A to 18E are sectional views showing the steps of manufacturing an exposure mask according to the fourth embodiment of the present invention. In this embodiment, an i-line of a mercury lamp was used as an exposure light source, and CrO was used as the material of a translucent film of a halftone mask.

Figure 18A:
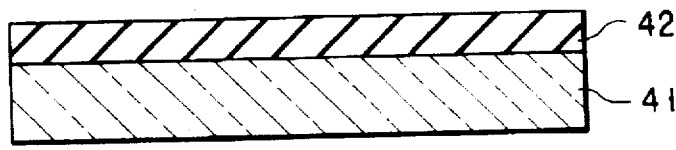
FIGS. 18A to 18E are sectional views showing the steps of manufacturing an exposure mask according to the fourth embodiment of the present invention.
Figure 18B:
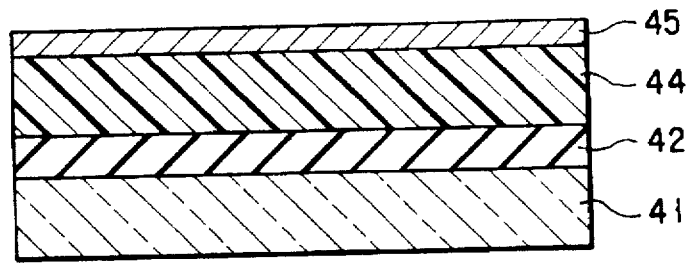

To begin with, as shown in FIG. 18A, a 50-nm thick CrO film (translucent film) 42 is formed on a transparent substrate 41 by sputtering. The thickness, the refractive index n, and the extinction coefficient k of the translucent film 42 are so adjusted that a phase difference and a transmittance take their respective desired values with respect to the transparent substrate after irradiation is performed to stabilize the film quality. The amplitude transmittance of the translucent film 42 at that time was found to be 23.0%.

Figure 18C:
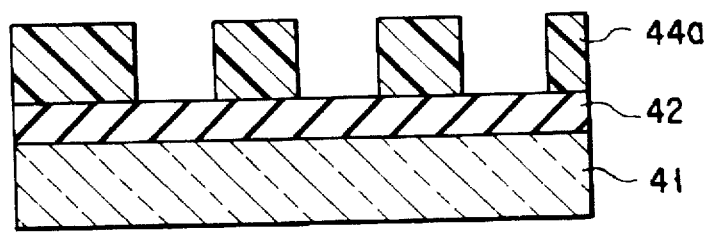

Subsequently, as shown in FIG. 15B, an EB resist 44 is coated on the CrO film 42, and a conductive film 45 is formed on the EB resist 44 to prevent charge-up occurring when EB drawing is performed. Thereafter, as shown in FIG. 18C, a desired resist pattern 44a is formed by EB drawing.

Figure 18D:
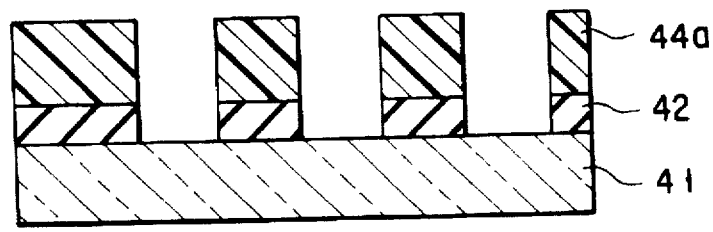

Then, as shown in FIG. 18D, the CrO film 42 is patterned by selectively etching the CrO film 42 by using the resist pattern 44a as a mask. Examples of the etching are CDE and RIE. After the CrO film pattern is formed by this etching, the resist pattern 44a is removed.

Figure 18E:
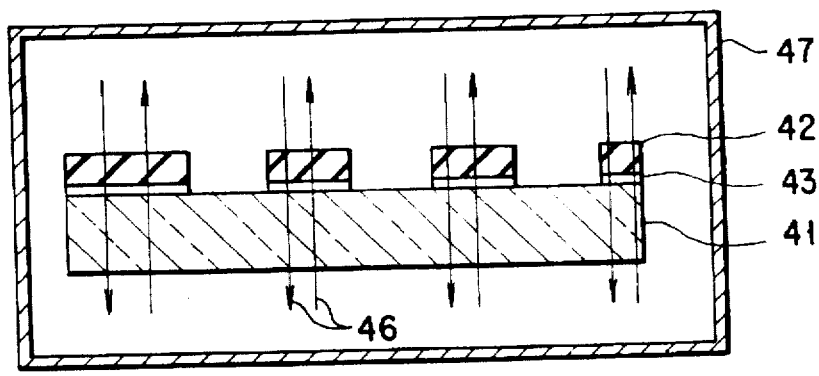
Figure 19A:
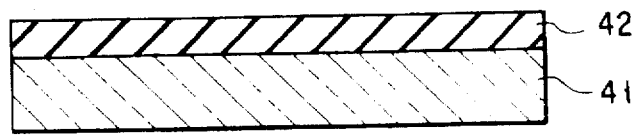
FIGS. 19A to 19E are sectional views showing the steps of manufacturing an exposure mask according to the fourth embodiment of the present invention.
Figure 19B:
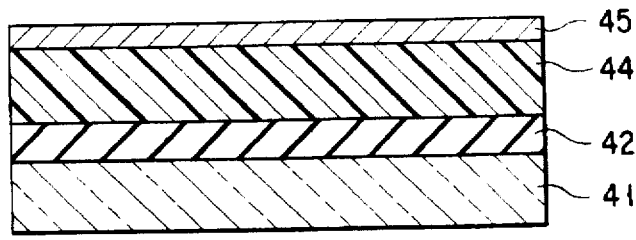
Figure 19C:
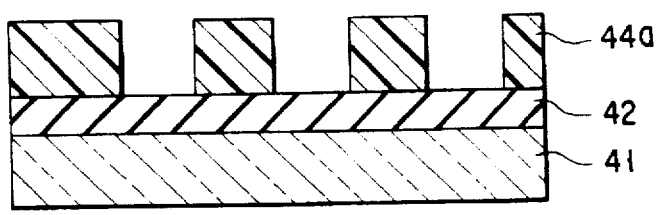
Figure 19D:
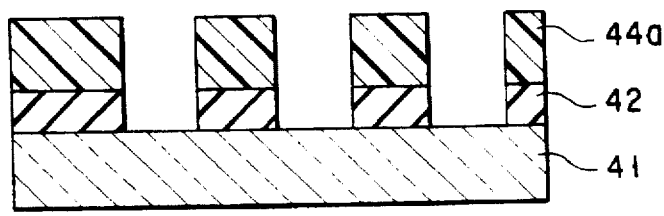
Figure 19E:
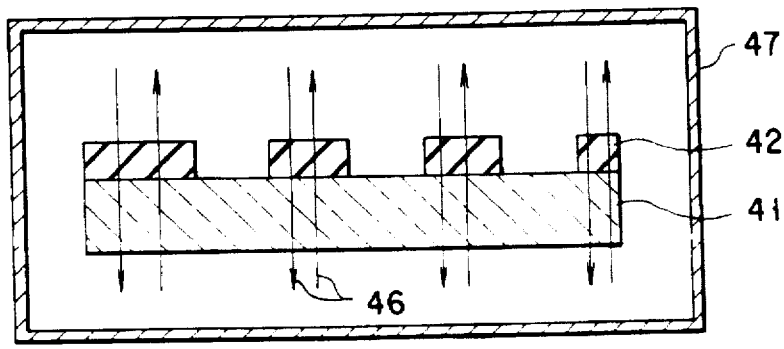

Finally, as shown in FIG. 18E, far-ultraviolet radiations 46 having wavelengths of 185 and 254 nm are radiated evenly in a direction from the substrate to the translucent film and a direction from the translucent film to the substrate from low-pressure mercury lamps arranged at two positions inside a chamber 47 containing oxygen. Consequently, the 185-nm far-ultraviolet radiation is absorbed by the oxygen in the chamber 47 to produce ozone.

In this embodiment, surface oxidation by the produced ozone and optical stabilization by the far-ultraviolet radiation are accomplished at the same time. That is, an oxide film is formed on the surface of the translucent film 42 simultaneously with formation of a stabilized region 43 in the interface between the substrate 41 and the translucent film 42. This eliminates the treatment for preventing the deterioration with time of the translucent film 42. At that time, the amplitude transmittance of the translucent film 42 including the stabilized region 43 changed to 25.0%.

In FIGS. 18A to 18E, the structure in which the stabilized region 43 is formed in the interface between the substrate 41 and the translucent film 42 is illustrated. However, the stabilized region 43 need not always be clearly distinguished from the translucent film 42 but may be formed by modifying the translucent film 42. An example of this is shown in FIGS. 19A to 19E. The manufacturing steps shown in FIGS. 19A to 19E are identical with those shown in FIGS. 18A to 18E, and a stabilized region 42' is formed instead of the stabilized region 43. In the step illustrated in FIG. 19E, far-ultraviolet radiations 46 having a wavelength near 365 nm were radiated from high-pressure mercury and Xe lamps in a direction from the transparent substrate to the translucent film and a direction from the translucent film to the transparent substrate.

In addition, although the stabilized region 43 or the stabilized region 42' is formed by photoirradiation in this embodiment, they can also be formed by promoting the stabilization reaction by performing a high-temperature heat treatment simultaneously with the photoirradiation.

In the method of this embodiment as discussed above, the stabilized region 43 or the stabilized region 42' is formed in the interface between the transparent substrate 41 and the translucent film 42. Therefore, the film quality is not deteriorated by irradiation of exposure light, so the performance of the film is kept stable. This makes it possible to obtain effects similar to those of the first embodiment. In this embodiment, various modifications can be made as discussed earlier in the first embodiment.

A design method for determining the refractive index n, the extinction coefficient k, and the film thickness d of a translucent film used in the formation of a phase-shifting film will be described in detail below.

Regarding translucent phase-shifting mask, Jpn. Pat. Appln. KOKAI Publication No. 4-136854 and Jpn. Pat. Appln. KOKAI Publication No. 4-162039 discuss a translucent phase-shifting film with a single-layer structure.

In these publications, a single-layer translucent phase-shifting mask is formed by mixing a dye in coating glass. In this method, the transmittance and the phase difference are adjusted by the dye and the coating glass, respectively. Jpn. pat. Appln. KOKAI Publication No. 5-127361 also describes a single-layer translucent film. In this publication, the thickness d of the translucent film is set to $d=\lambda/2(n-1)$ by taking into consideration phase relation 2 π(dn/λ−d/λ)=π to a portion on which no translucent film is formed.

The methods of the above sort, however, have the following problems. That is, in the method of forming a single-layer translucent phase-shifting film by mixing a dye in coating glass, the transmittance and the phase difference are adjusted by the dye and the coating glass, respectively. In this method, however, a method of determining a refractive index, an extinction coefficient, and a film thickness required to obtain a desired transmittance and phase difference is not particularly specified. Therefore, the method lacks reliability as to the transmittance and phase difference actually obtained. On the other hand, the method in which the film thickness of a single-layer translucent film is set to $d=\lambda/2(n-1)$ does not take account of the effect that the refractive index has on the phase difference and the phase shift produced by multiple reflection. Therefore, this method also lacks reliability as to the transmittance and the phase difference.

As described above, in forming a single-layer translucent phase-shifting film by the conventional methods, it is essential to set the phase difference $\phi$ and the transmittance t at their respective desired values. For this purpose, it is necessary to quickly and precisely determine the relationship that the refractive index n, the extinction coefficient k, and the film thickness d hold with the desired transmittance t and phase difference $\phi$ at the exposure wavelength $\lambda$ of the translucent film. However, no translucent film design method meeting this requirement has been proposed yet.

The present inventors, therefore, provide a translucent film design method capable of accurately and quickly obtaining the conditions of the refractive index n, the extinction coefficient k, and the film thickness d of a single-layer translucent film under which the conditions of the transmittance t and the phase difference of the translucent film are satisfied.

Examples of the preferable aspect of a method of obtaining a plurality of combinations of the refractive index n, the extinction coefficient k, and the film thickness d with respect to the transmittance and the phase difference having desired widths in environments taking account of multiple reflection are as follows.

(4.1) Proper ranges of the desired transmittance t and phase difference $\phi$ are determined by an image profile obtained by simulation result assuming the exposure or the exposure result of the resolving power, the focal depth, and the exposure of a resist pattern.

(4.2) Each of the transmittance t and the phase difference $\phi$ is so set as to fall within the range of desired value ±0.01×desired value.

(4.3) A structure in which a translucent film having the set refractive index n, extinction coefficient k, and film thickness d is formed on a light-transmitting substrate is included.

(4.4) An exposure mask manufactured by performing pattern formation on a structure in which a translucent film having the set refractive index n, extinction coefficient k, and film thickness d is formed on a light-transmitting substrate is included.

(4.5.1) A translucent film having the set refractive index n, extinction coefficient k, and film thickness d consists of at least one material selected from Si, SiO, SiN, SiON, SiC, MoSi, MoSiO, MoSiN, MoSiON, CrO, CrN, CrON, AlO, AlN, AlNO, TiO, TiN, TiNO, WSi, WSiO, WSiN, and WSiON.

(4.5.2) A translucent film is added with hydrogen, carbon, or a halogen element in addition to the above composition.

(4.5.3) The refractive index n and the extinction coefficient k of a translucent film are set by adjusting the stoichiometric ratio of the above material.

(4.5.4) A translucent film is formed by reactive sputtering, plasma CVD, photo CVD, atmospheric-pressure CVD, or vapor deposition. The stoichiometric ratio of the material of the translucent film is set by adjusting the gas composition, the pressure, or the temperature during the reaction.

(4.6.1) An exposure mask manufactured by performing pattern formation on a structure in which a translucent film having the set refractive index n, extinction coefficient k, and film thickness d is formed on a light-transmitting substrate is used to form the image of the mask on a substrate by, e.g., a radiation. A semiconductor substrate processed on the basis of this image is included.

(4.6.2) The wavelength of the radiation is set between 100 nm and 450 nm.

In addition, there is provided a translucent film having a refractive index n and an extinction coefficient k set within the following ranges:

n=n0±λ(5.58Pe+0.167T−12.7Te−982De−0.68)/2000D k=k0±λ(−0.413Pe+0.417T+163Te−312De−2.41)/2000D assuming that the tolerances of the phase difference $\phi$, the intensity transmittance t, and the film thickness d of a translucent film are 180°±Pe°, T×(1±Te), and D(1±De), respectively, with respect to a translucent film having a refractive index n0, an extinction coefficient k0, and a film thickness D meeting a phase difference of 180° and an intensity transmittance T at an exposure wavelength $\lambda$.

Preferably, the tolerance Pe of the phase difference is set within 10°.

Preferably, the desired intensity transmittance T is set between 1 to 20%.

Preferably, the ratio Te of the tolerance of the transmittance to the desired transmittance T is set to be 0.2 or less.

Preferably, the ratio De of the tolerance of the thickness of the translucent film to the desired film thickness D is set to be 0.02 or less.

Preferably, there is provided a substrate in which at least a translucent film meeting the ranges of both the refractive index and the extinction coefficient defined by the present invention is formed on a light-transmitting substrate.

Preferably, there is provided an exposure mask substrate in which at least a pattern made from a translucent film meeting the ranges of both the refractive index and the extinction coefficient defined by the present invention is formed on a light-transmitting substrate.

Preferably, a translucent film consists of at least one material selected from Si, SiO, SiN, SiON, SiC, MoSi, MoSiO, MoSiN, MoSiON, CrO, CrN, CRON, AlO, AlN, AlON, TiO, TiN, TiNO, WSi, WSiO, WSiN, and WSiON.

More preferably, a translucent film is added with hydrogen, carbon, or a halogen element in addition to the above composition.

More preferably, the refractive index n and the extinction coefficient k of a translucent film are set by adjusting the stoichiometric ratio of the above material.

More preferably, a translucent film is formed by reactive sputtering, plasma CVD, photo CVD, atmospheric-pressure CVD, or vapor deposition. The ratio of the composition of the translucent film is set by adjusting the gas composition, the pressure, or the temperature during the reaction.

Preferably, by using an exposure mask substrate, the image of the mask is formed on a substrate by, e.g., a radiation. A semiconductor substrate processed on the basis of this image is included.

More preferably, the wavelength of the radiation is set between 100 and 450 nm.

More preferably, the single-layer translucent phase-shifting film contains a naturally oxidized region on its surface.

More preferably, the exposure mask substrate is used to form a photosensitive resin pattern by forming a mask pattern image on a photosensitive resin material, which is formed on a substrate to be exposed, by oblique-incidence illumination, and developing the formed image.

Also, as one application of this design method, there is provided a translucent film which meets a phase difference of nearly 180° at the exposure wavelength λ and has a refractive index n and an extinction coefficient k set within the following ranges:

$n = n0 \pm 0.214\lambda/D$
$k = k0 \pm 0.115\lambda/D$ with respect to a mean refractive index n0, a mean extinction coefficient k0, and a mean film thickness D obtained by extracting a given portion from the translucent film.

Preferably, there is provided a substrate in which at least a translucent film meeting the ranges of both the refractive index and the extinction coefficient defined by the present invention is formed on a light-transmitting substrate.

Preferably, there is provided an exposure mask in which at least a pattern made from a translucent film meeting the ranges of both the refractive index and the extinction coefficient defined by the present invention is formed on a light-transmitting substrate.

Preferably, a translucent film consists of at least one material selected from Si, SiO, SiN, SiON, SiC, MoSi, MoSiO, MoSiN, MoSiON, CrO, CrN, CrON, AlO, AlN, AlON, TiO, TiN, TiNO, WSi, WSiO, WSiN, and WSiON.

More preferably, a translucent film is added with hydrogen, carbon, or a halogen element in addition to the above composition.

More preferably, the refractive index n and the extinction coefficient k of a translucent film are set by adjusting the stoichiometric ratio of the above material.

More preferably, a translucent film is formed by reactive sputtering, plasma CVD, photo CVD, atmospheric-pressure CVD, or vapor deposition. The ratio of the composition of the translucent film is set by adjusting the gas composition, the pressure, or the temperature during the reaction.

Preferably, by using an exposure mask substrate, the image of the mask is formed on a substrate by, e.g., a radiation. A semiconductor substrate processed on the basis of this image is included.

More preferably, the wavelength of the radiation is set between 100 and 450 nm.

More preferably, the single-layer translucent phase-shifting film contains a naturally oxidized region on its surface.

More preferably, the exposure mask substrate is used to form a photosensitive resin pattern by forming a mask pattern image on a photosensitive resin material, which is formed on a substrate to be exposed, by oblique-incidence illumination, and developing the formed image.

The method of calculating the refractive index n, the extinction coefficient k, and the film thickness d meeting the desired transmittance and phase difference in environments taking account of multiple reflection inside a translucent phase-shifting film is very effective not only in obtaining a unique refractive index n, extinction coefficient k, and film thickness d meeting a desired transmittance and phase shift, but also in obtaining a plurality of combinations of the refractive index n, the extinction coefficient k, and the film thickness d for the transmittance t and the phase difference φ having certain widths.

Normally, the ranges of the transmittance t and the phase difference φ of a translucent phase-shifting film can be determined from an image profile obtained by simulation result assuming the exposure or the exposure result of the resolving power, the focal depth. By replacing the ranges obtained by this examination with the combination of the refractive index n, the extinction coefficient k, and the film thickness d, it is possible to make a clear plan in the formation of a translucent phase-shifting film.

The experimental examples based on the above design method will be described below.

(EXPERIMENTAL EXAMPLE 1)

In this experimental example, the relationship between the extinction coefficient k and the film thickness d of an i-line translucent phase-shifting film was obtained by taking multiple reflection inside the translucent film into consideration when the intensity transmittance and the phase difference were set to meet the ranges of 5±1% and 180°±5°, respectively, and the refractive index was fixed at 4.0.

The result obtained by this experimental example is shown in FIG. 20. Referring to FIG. 20, the extinction coefficient k is plotted on the abscissa, and the film thickness d is plotted on the ordinate. Assuming the refractive index n is fixed, the combination of the extinction coefficient k and the film thickness d can be represented by the region surrounded by four curves as illustrated in FIG. 20. in this manner, the ranges of the extinction coefficient k and the film thickness d could be determined while the refractive index n was fixed at 4 as shown in FIG. 20. That is, this region is given as a region closed by boundaries connecting coordinates defined by the combinations of the extinction coefficient and the film thickness meeting (transmittance, phase difference)=(upper-limit 10 transmittance, indefinite), (lower-limit transmittance, indefinite), (indefinite, upper-limit phase difference), and (indefinite, lower-limit phase difference).

In this experimental example, an i-line (365 nm) was used as the exposure wavelength. However, the exposure wavelength can also be the wavelengths of a g-line (436 nm), KrF (248 nm), ArF (193 nm), and light having alter wavelength.

In addition, the desired intensity transmittance and phase difference were set within the ranges of 5±1% and 180°±5°, respectively, in this experimental example. However, although they depend on the performance during exposure, the intensity transmittance and the phase difference including the respective desired values and desired ranges need only range from 1% to 20% and 90° to 270°, respectively.

Furthermore, the refractive index n was fixed at 4.0 in this experimental example. However, the refractive index can take any given value as long as the value is greater than 1.

(EXPERIMENTAL EXAMPLE 2)

In this experimental example, the relationship between the refractive index n and the film thickness d of a KrF translucent phase-shifting film was obtained by taking multiple reflection inside the translucent film into consideration when the intensity transmittance and the phase difference were set to meet the ranges of 6±1% and 180°±5°, respectively, and the extinction coefficient k was fixed at 0.4.

The result obtained by this experimental example is shown in FIG. 21. Referring to FIG. 21, the refractive index n is plotted on the abscissa, and the film thickness d is plotted on the ordinate. Assuming the extinction coefficient k is fixed, the combination of the refractive index n and the film thickness d can be represented by the region surrounded by four curves as illustrated in FIG. 21. In this manner, the ranges of the refractive index n and the film thickness d could be determined while the extinction coefficient k was fixed at 0.4 as shown in FIG. 21. That is, this region is given as a region closed by boundaries connecting coordinates defined by the combinations of the refractive index and the film thickness meeting (transmittance, phase difference)= (upper-limit transmittance, indefinite), (lower-limit transmittance, indefinite), (indefinite, upper-limit phase difference), and (indefinite, lower-limit phase difference).

In this experimental example, KrF (248 nm) was used as the exposure wavelength. However, the exposure wavelength can also be the wavelengths of a g-line (436 nm), an i-line (365 nm), ArF (193 nm), and light having other wavelength.

In addition, the desired intensity transmittance and phase difference were set within the ranges of 5±1% and 180°±5°, respectively, in this experimental example. However, although they depend on the performance during exposure, the intensity transmittance and the phase difference including the respective desired values and desired ranges need only range from 1% to 20% and 90° to 270°, respectively.

Furthermore, the extinction coefficient k was fixed at 0.4 in this experimental example. However, the extinction coefficient can take any given value as long as the value is greater than 0.

(EXPERIMENTAL EXAMPLE 3)

In this experimental example, the relationship between the refractive index n and the extinction coefficient k of a g-line translucent phase-shifting film was obtained by taking multiple reflection inside the translucent film into consideration when the intensity transmittance and the phase difference were set to meet the ranges of 3±1% and 180°±10°, respectively, and the film thickness d was fixed at 80 nm.

The result obtained by this experimental example is shown in FIG. 22. Referring to FIG. 22, the refractive index n is plotted on the abscissa, and the extinction coefficient k is plotted on the ordinate. Assuming the film thickness d is fixed, the combination of the refractive index n and the extinction coefficient k can be represented by the region surrounded by four curves as illustrated in FIG. 22. In this manner, the ranges of the refractive index n and the extinction coefficient k could be determined while the film thickness d was fixed at 80 nm as shown in FIG. 22. That is, this region is given as a region closed by boundaries connecting coordinates defined by the combinations of the refractive index and the extinction coefficient meeting (transmittance, phase difference)=(upper-limit transmittance, indefinite), (lower-limit transmittance, indefinite), (indefinite, upper-limit phase difference), and (indefinite, lower-limit phase difference).

In this experimental example, a g-line (436 nm) was used as the exposure wavelength. However, the exposure wavelength can also be the wavelengths of an i-line (365 nm), KrF (248 nm), ArF (193 nm), and light having other wavelength.

In addition, the desired intensity transmittance and phase difference were set within the ranges of 3±1% and 180°±10°, respectively, in this experimental example. However, although they depend on the performance during exposure, the intensity transmittance and the phase difference including the respective desired values and desired ranges need only range from 1% to 20% and 90° to 270°, respectively.

Furthermore, the film thickness was fixed at 80 nm in this experimental example. However, the film thickness can take any given value as long as the value is greater than 0.

(EXPERIMENTAL EXAMPLE 4)

In this experimental example, the ranges of the refractive index n, the extinction coefficient k, and the film thickness d of an i-line translucent phase-shifting film were obtained by taking multiple reflection inside the translucent phase-shifting film into consideration when the intensity transmittance and the phase difference were set to meet the ranges of 4.9±0.5% and 180°±5°, respectively, and the film thickness d was set within the range of 99.8±1 nm.

The film thickness was set at 99.8 nm in this experimental example. This film thickness of 99.8 nm was obtained on the basis of the combination of the extinction coefficient k and the film thickness d when the intensity transmittance, the phase difference $\phi$, and the refractive index n were 4.9%, 180°, and 2.9, respectively.

It is preferable to determine the relationship between the refractive index n and the extinction coefficient k with respect to a proper film thickness range as follows. First, 99.8±1 nm is set as the proper film thickness range. This proper film thickness range is determined on the basis of the performance (e.g., a film thickness range obtained in the plane of a substrate as an object of film formation, and a film thickness range obtained when film formation is performed on a plurality of substrates as objects of film formation under the same conditions) of an apparatus used in film formation. By taking account of the fact that the refractive index n and the extinction coefficient k increase monotonically when the film thickness d decreases monotonically with respect to this film thickness range, the procedure of calculations is determined as follows.

(1) A combination of the refractive index n and the extinction coefficient k obtained when the film thickness takes a maximum value is determined.

(2) A combination of the refractive index n and the extinction coefficient k obtained when the film thickness takes a minimum value is determined.

(3) The intersections of the refractive indices n and the extinction coefficients k obtained in (1) and (2) are calculated.

Following the above procedure, it is possible to obtain desired ranges of the transmittance t and phase difference $\phi$ and to readily and quickly determine ranges of the refractive index n and the extinction coefficient k which are met when a proper film thickness range is given, as indicated by a hatched region shown in FIG. 23.

In this experimental example, an i-line (365 nm was used as the exposure wavelength. However, the exposure wavelength can also be the wavelengths of a g-line (436 nm), KrF (248 nm), ArF (193 nm), and light having other wavelength.

In addition, the desired intensity transmittance and phase difference were set within the ranges of 4.9±0.5% and 180°±5°, respectively, in this experimental example. However, although they depend on the performance during exposure, the intensity transmittance and the phase difference including the respective desired values and desired ranges need only range from 1% to 20% and 120° to 240°, respectively.

Furthermore, the film thickness was fixed at 99.8 nm in this experimental example. However, the film thickness can take any given value as long as the value is greater than 0.

By using the applications of the design method discussed earlier as in this experimental example, it is possible to obtain combinations of the extinction coefficient k and the film thickness d meeting an appropriate refractive index range for desired ranges of the phase difference and transmittance. It is also possible to obtain combinations of the refractive index n and the film thickness d meeting a proper extinction coefficient range for desired ranges of the phase difference and transmittance.

In this case, it is preferable to determine the proper range of the refractive index or the extinction coefficient on the basis of the performance (the range of the refractive index or the extinction coefficient obtained in the plane of a substrate as an object of film formation, and the range of the refractive index or the extinction coefficient obtained when film formation is performed on a plurality of substrates as objects of film formation under the same conditions) of an apparatus used in film formation.

(EXPERIMENTAL EXAMPLE 5)

In this experimental example, the latitudes of the refractive index n and the extinction coefficient k obtained by the method of Experimental Example 4 were examined in more detail.

The desired ranges of the refractive index n and extinction coefficient k shown in FIG. 23 are represented by $\Delta n$ as the latitude of the refractive index for a given extinction coefficient and $\Delta k$ as the latitude of the extinction coefficient for a given refractive index n, respectively. In addition, values dn and dk obtained by dividing $\Delta n$ and $\Delta k$ by the exposure wavelength, respectively, are set.

Figure 24:
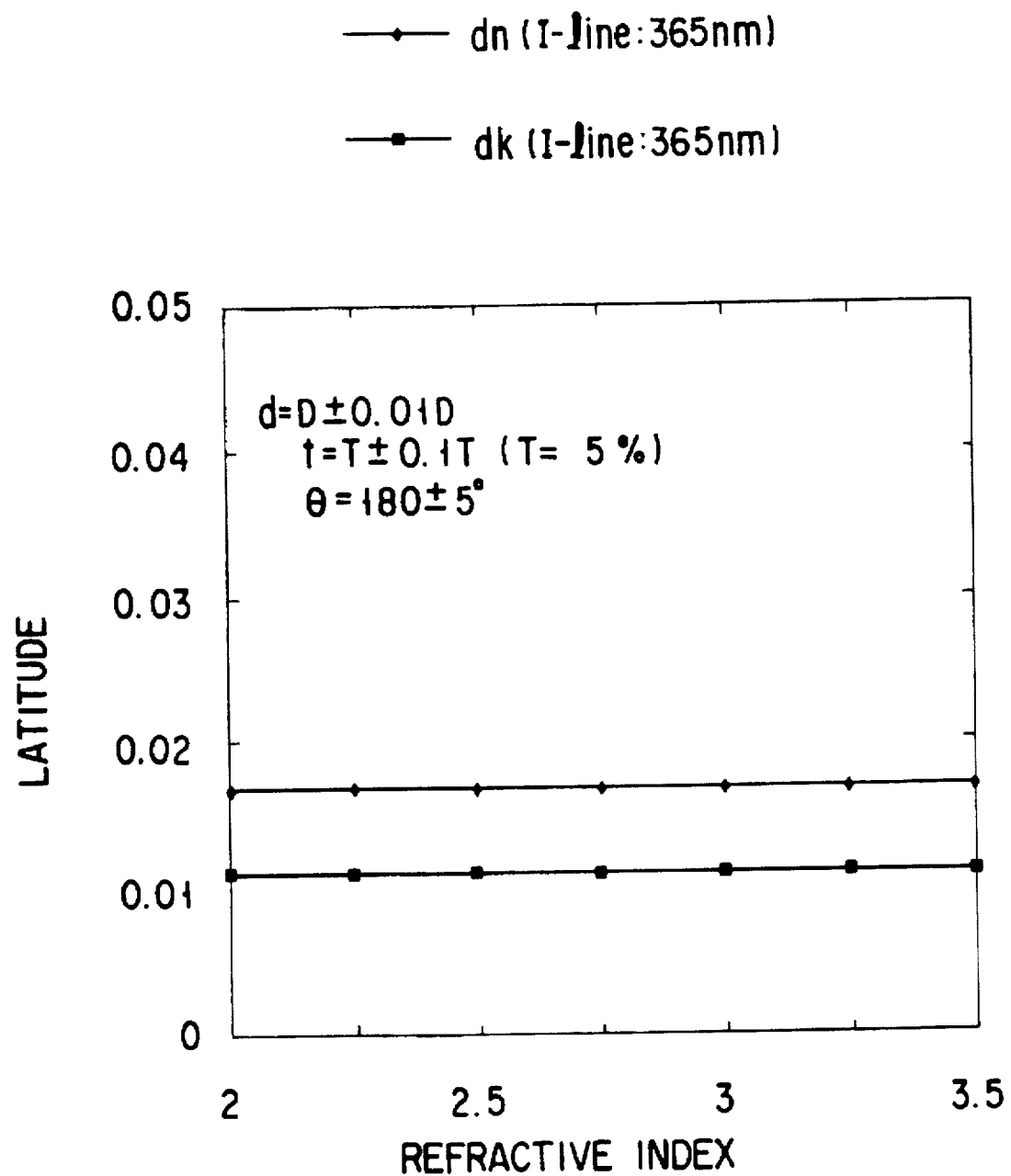
FIG. 24 is a graph for explaining the dependence of dn and dk on the refractive index n and the exposure wavelength λ in the fifth experimental example.

FIG. 24 shows the refractive index dependence of dn and dk meeting a phase difference tolerance of 180°±5° and an intensity transmittance tolerance of 5±0.5% at exposure wavelengths of 365 nm (i-line) and 248 nm (KrF). Referring to FIG. 24, the result obtained for the i-line is represented by a solid line, and that for the KrF is represented by a broken line. It was found that both dn and dk exhibited nearly fixed values respectively regardless of the refractive index. It was also found that the values of dn and dk at the KrF wavelength were the same as those at the i-line wavelength, i.e., dn and dk were independent of the wavelength.

FIG. 25 shows dn and dk as functions of the phase difference tolerance Pe for a reference phase difference of 180°. In this case, a reference transmittance T and a film thickness variation degree De were set at 5% and 0.01, respectively. Referring to FIG. 25, solid lines indicate the results obtained for Te=±0.1 (intensity transmittance 5±0.5%) (Te is the ratio of the variation of the transmittance to the desired transmittance), and broken lines indicate the results obtained for Te=±0.2 (intensity transmittance 5±1%). Both dn and dk could be given by linear functions of Pe.

Figure 26:
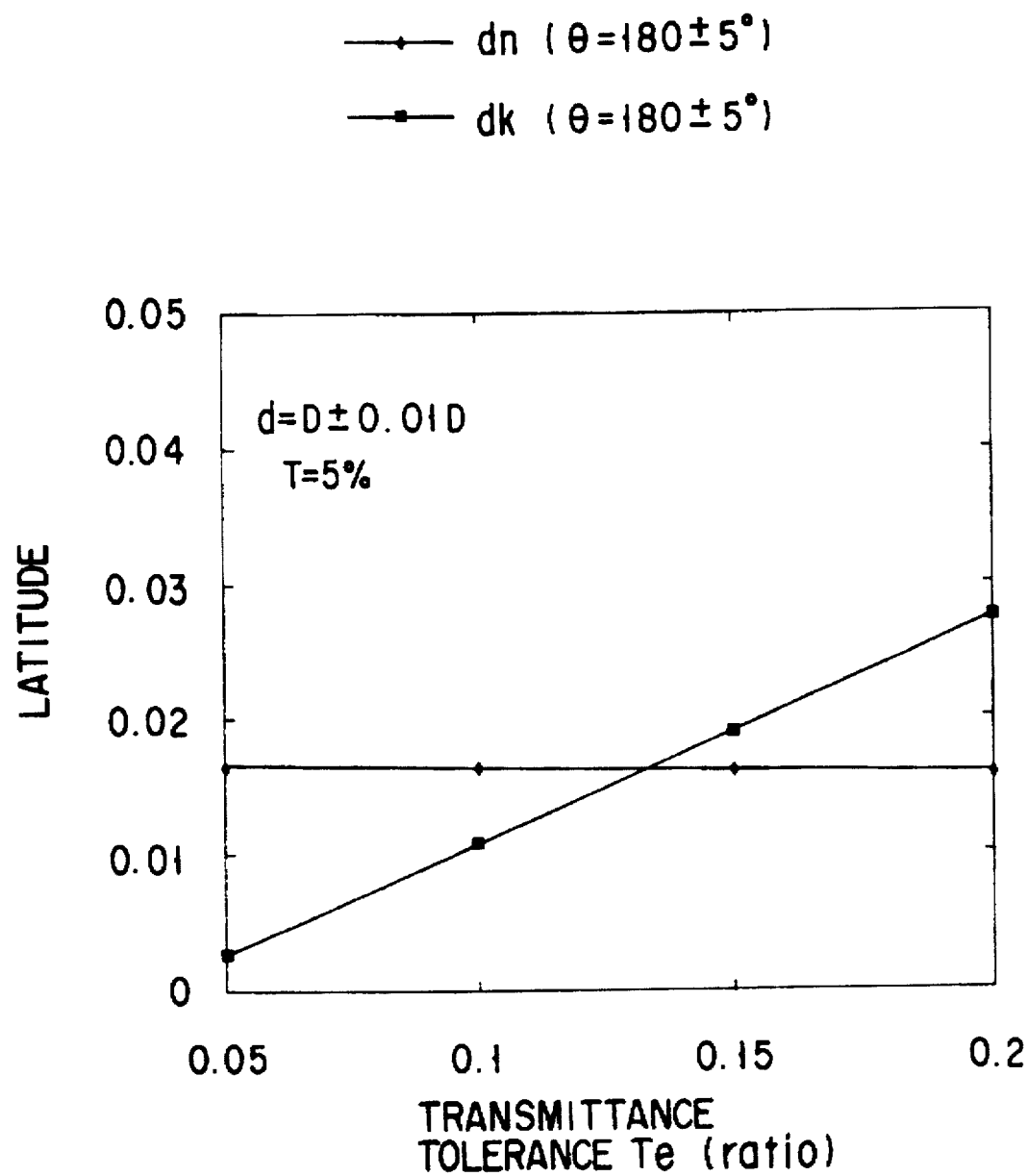
FIG. 26 is a graph for explaining the dependence of dn and dk on the ratio Te of the transmittance variation to the reference transmittance in the fifth experimental example.

FIG. 26 shows dn and dk as functions of the transmittance tolerance Te for a phase difference of 180°±5° and a reference transmittance of 5%. Note that the film thickness variation degree De was set at 0.01. As with the changes with respect to Pe, the values of both dn and dk could be given by linear functions of Te.

Figure 27:
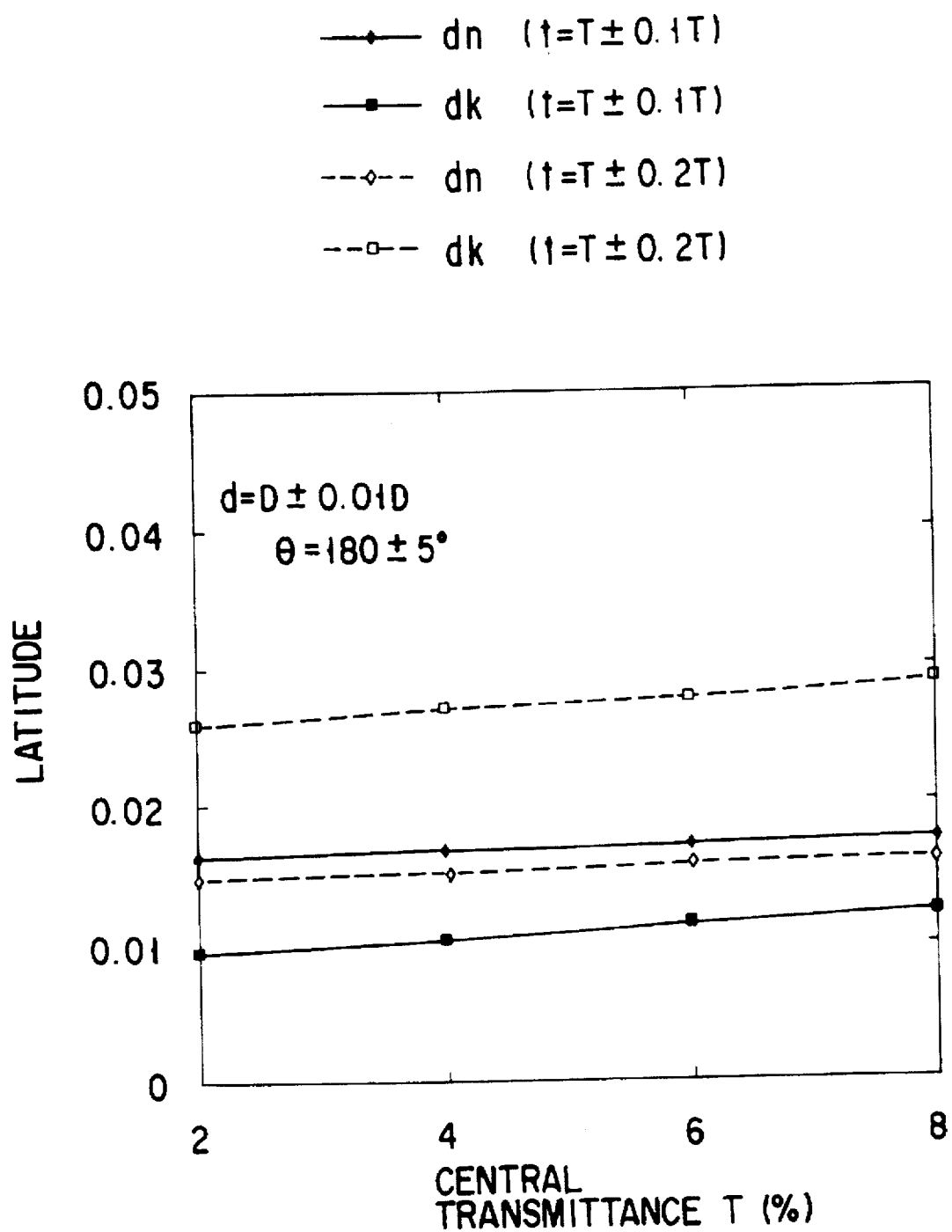
FIG. 27 is a graph for explaining the dependence of dn and dk on the reference transmittance T in the fifth experimental example.

FIG. 27 shows dn and dk as functions of the reference transmittance T. The phase difference tolerance Pe was set at 180°±5°, and the film thickness variation degree De was set at 0.01. Referring to FIG. 27, solid lines indicate the results obtained for transmittance tolerance Te=0.1, and broken lines indicate those for Te=0.2. The changes in dn and dk with respect to T also could be represented by linear functions.

Figure 28:
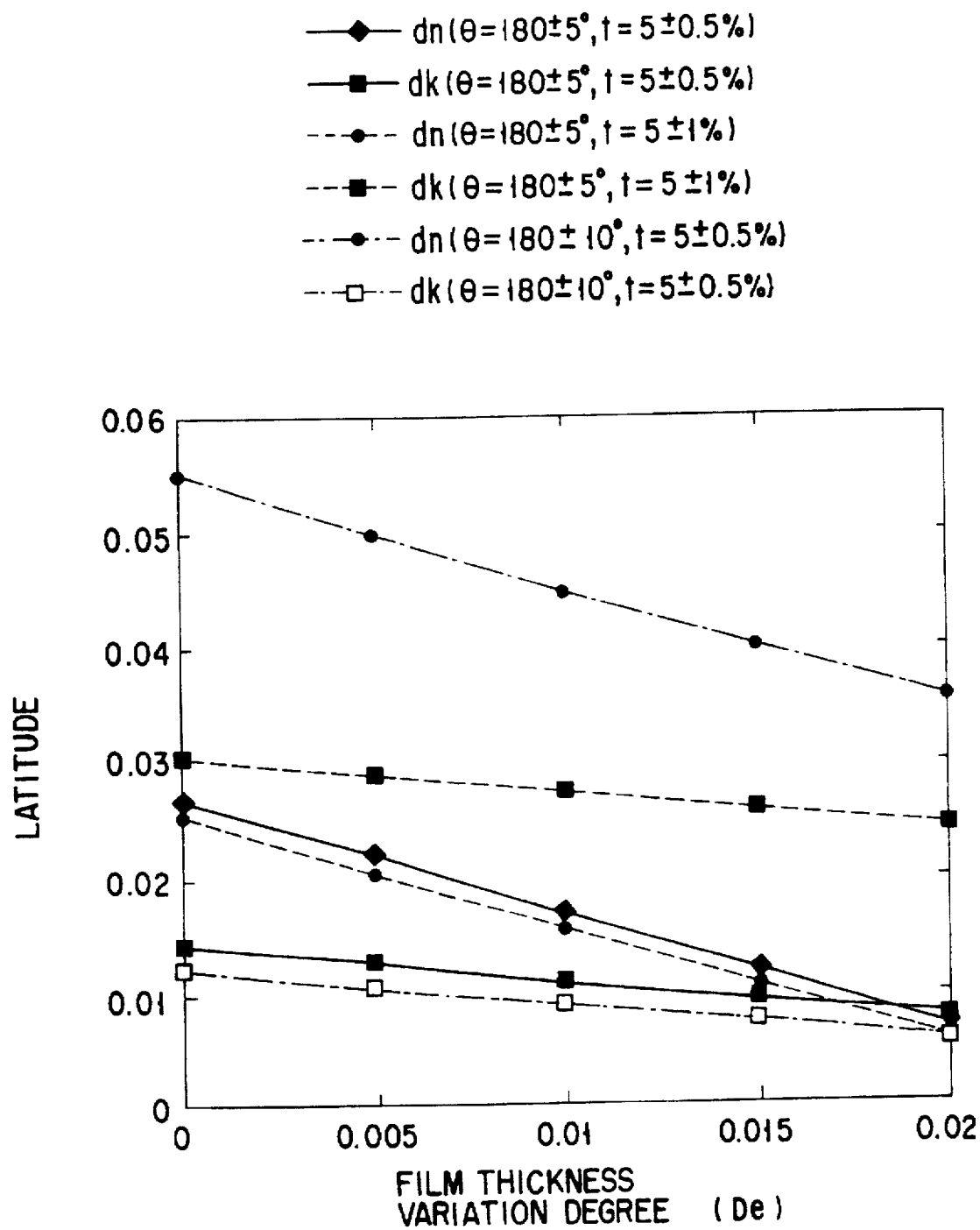
FIG. 28 is a graph for explaining the dependence of dn and dk on the ratio Pe of the film thickness variation to the reference film thickness in the fifth experimental example.

FIG. 28 shows dn and dk as functions of the HT film thickness variation degree De when given values were chosen as the phase difference tolerance Pe and the intensity transmittance tolerance Te. It was possible to represent both dn and dk shown in FIG. 28 as linear functions of the film thickness variation degree De. In addition, dn and dk respectively showed fixed slopes regardless of the phase difference tolerance Pe and the intensity transmittance tolerance Te.

From the results shown in FIGS. 24 to 28, it was possible to define $\Delta n$ and $\Delta k$ by Equations 1 and 2, respectively, as linear polynomials of the phase difference tolerance Pe, the reference transmittance T, the transmittance tolerance Te, the optimum film thickness D, and the film thickness variation degree De.

$$\Delta n = \pm \lambda(5.58Pe + 0.167T - 12.7Te - 982De - 0.68)/2000D \quad \text{Equation 1}$$

$$\Delta k = \pm \lambda(-0.413Pe + 0.417T + 163Te - 312De - 2.41)/2000D \quad \text{Equation 2}$$

Substituting 10° as the phase difference tolerance Pe, 0.2 as the ratio Te of the intensity transmittance variation to the desired transmittance, and 0.01 as the ratio De of the variation in the film thickness of the translucent phase-shifting film to the desired film thickness, Equations 1 and 2 can be rewritten as Equations 3 and 4, respectively. In this case, the effect that the desired transmittance T has on $\Delta n$ and $\Delta k$ is very small, so almost no difference results in each of $\Delta n$ and $\Delta k$ over the range of the intensity transmittance T of 1 to 20%. That is, Equations 3 and 4 can be given independently of the desired transmittance.

$$\Delta n = \pm 0.214 \lambda / D \quad \text{Equation 3}$$

$$\Delta k = \pm 0.115 \lambda / D \quad \text{Equation 4}$$

In this design method as has been described in detail above, unlike in conventional methods by which a translucent phase-shifting film is evaluated by indirect information, such as a phase difference and a transmittance, it is possible to accurately evaluate a translucent phase-shifting film by more direct information, such as a refractive index, an extinction coefficient, and a film thickness. It is also possible to obtain distinct latitudes of the refractive index, the extinction coefficient, and the film thickness.

(Embodiment 5)

FIGS. 29A to 29E are sectional views showing the steps of manufacturing an exposure mask according to the fifth embodiment of the present invention.

Figure 29A:
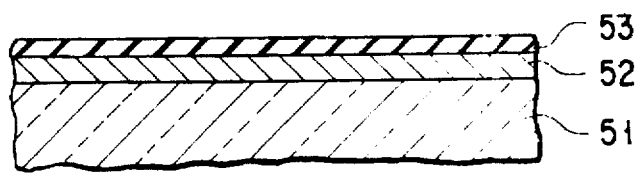
FIGS. 29A to 29E are sectional views showing the steps of manufacturing an exposure mask according to the fifth embodiment of the present invention.

Initially, as shown in FIG. 29A, a 61-nm thick Si film 52 is formed on a transparent substrate 51 by sputtering. A 4-nm thick oxide film 53 is then formed on the Si film 52 by performing oxygen ashing at a flow rate of 100 sccm and a pressure of 0.1 Torr for two minutes. If a natural oxide film is already formed on the surface of the Si film 52, an oxide film is additionally formed on this natural oxide film to have a total oxide film thickness of 4 nm through the above treatment.

Figure 29B:
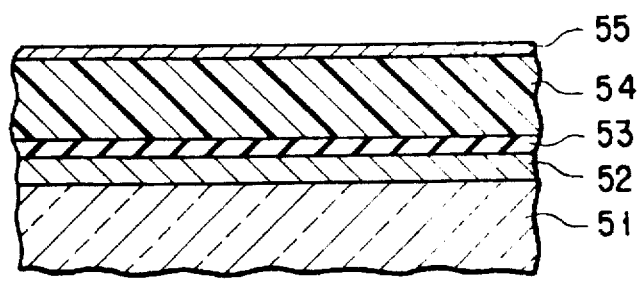

Subsequently, as shown in FIG. 29B, an EB resist 54 is deposited to have a thickness of about 0.5 μm on the oxide film 53, and a conductive film 55 about 0.2 μm in thickness is formed on the EB resist 54.

Figure 29C:
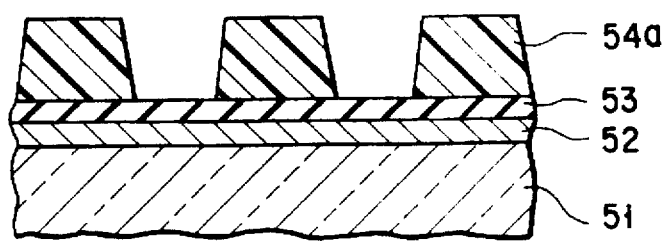

Thereafter, lithography is performed at a dose of 3 μC/cm$^2$ from above the conductive film 55 by using an electron beam, and subsequently development is performed, thereby forming a resist pattern 54a as shown in FIG. 29C. In this case, the conductive film 55 is formed in order to prevent charge-up of the electron beam if the EB resist 54 is insulating.

Figure 29D:
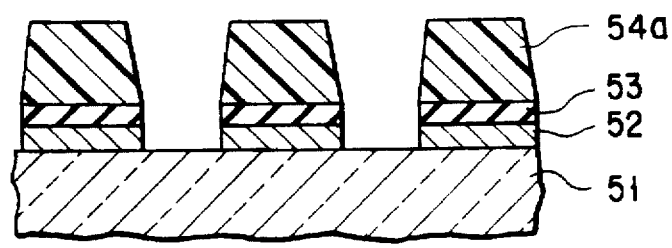

In the next step, as shown in FIG. 29D, by using the resist pattern 54a as a mask, the oxide film 53 and the Si film 52 exposed from the resist pattern 54a are etched away by chemical dry etching (CDE) using a gas mixture of $CF_4$ and $O_2$. This etching is performed in two steps such that the flow rate ratio of $O_2$ to $CF_4$ is increased during the etching of the oxide film 53 compared to that during the etching of the Si film 52.

Figure 29E:
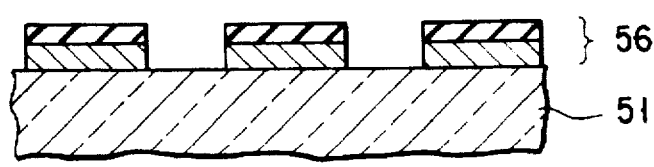

Lastly, the resist pattern 54a is removed to obtain a translucent film pattern (phase-shifting layer) 56 consisting of the oxide film 53 and the Si film 52, as shown in FIG. 29E. In this manner, it is possible to obtain a halftone phase-shifting mask consisting of a desired translucent film.

When a g-line was used as the exposure light for the mask formed as described above, the phase difference between light transmitted through the oxide film 53 and the Si film 52 as the translucent film and light transmitted through the transparent substrate 51 was 180°, and the amplitude transmittance was 17.4% with respect to the transparent substrate.

Although the Si film 52 is formed by sputtering in this embodiment, this film can also be formed by a CVD process or a vapor deposition process. It is also possible to set the thicknesses of the oxide film 53 and the Si film 52 at appropriate values within ranges not departing from the gist of the present invention. In addition, the oxide film can be formed in an atmosphere containing oxygen atoms or by a liquid-phase growth method. Furthermore, the oxide film and the Si film can be processed by RIE or wet etching.

Figure 30:
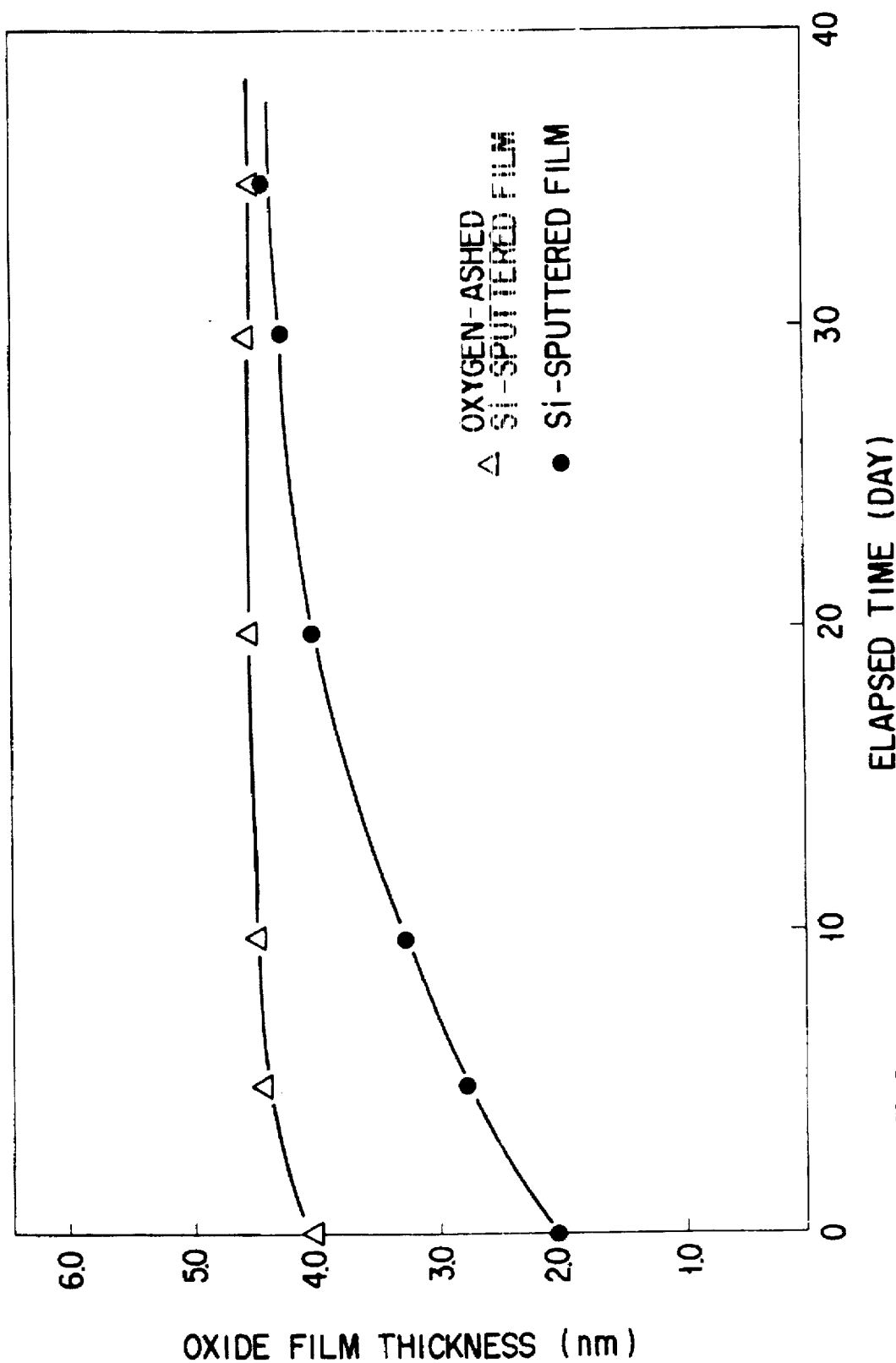
FIG. 30 is a graph showing the change with time of the thickness of an oxide film of a translucent film in the fifth embodiment.

In this embodiment, after formation of the Si film, the $SiO_2$ film is formed by oxidizing this Si film through oxygen ashing. When an oxide film with a predetermined thickness is forcedly formed on the surface of an Si film as in this embodiment, no natural oxide film forms even if the resultant material is left to stand in the air. FIG. 30 is a graph showing the changes in the oxide film thickness of a translucent film with time. Referring to FIG. 30, full circles indicate the result obtained for a sample formed by sputtering Si as a translucent film on quartz, and open triangles indicate the result obtained for a sample subjected to oxygen ashing after the sputtering.

These results demonstrate that the change in oxide film thickness with time can be greatly reduced by additionally performing oxygen ashing after sputtering. That is, when oxygen ashing was performed, almost no change from an initial film thickness of 4 nm was found in the film thickness. when only sputtering was performed, on the other hand, the thickness of the oxide film gradually increased to 4 nm. Although the upper limit of the thickness of this oxide film changes depending on the film quality of Si, these results reveal that once an oxide film with a certain predetermined thickness is formed on an Si film, the film thickness does not change due to natural oxidation or an oxidation reaction resulting from exposure. The oxide film formed in this case has phase differences of 1.6°, 1.8°, and 2.9° with respect to a g-line, an i-line, and KrF, respectively. However, these values are within a phase difference tolerance of 10° and therefore present no problems in practice.

In the present invention, this oxide film having a predetermined thickness is formed on the surface of an Si film to allow the resultant layered film of the Si film and the oxide film to have an ideal amplitude transmittance and phase difference of a halftone phase-shifting mask.

In the mask formed by the steps discussed above, no deterioration in film quality with time such as caused by natural oxidation was found, so the ideal phase difference and amplitude transmittance could be maintained. When this mask was used to conduct an experiment of pattern transfer to wafers, patterns having good shapes could be obtained with a high dimensional accuracy.

(Embodiment 6)

FIGS. 31A to 31E are sectional views showing the steps of manufacturing an exposure mask according to the sixth embodiment of the present invention.

Figure 31A:
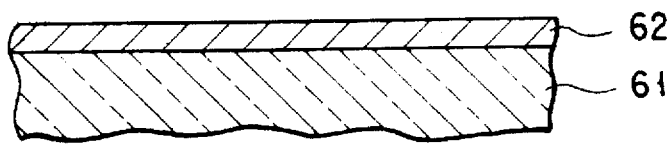
FIGS. 31A to 31E are sectional views showing the steps of manufacturing an exposure mask according to the sixth embodiment of the present invention.
Figure 31B:
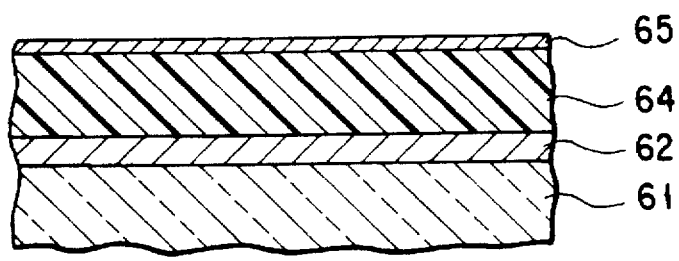

To begin with, as shown in FIG. 31A, a 59-nm thick Si film 62 is formed on a transparent substrate 61 by sputtering. Subsequently, as shown in FIG. 31B, an EB resist 64 is deposited to have a thickness of about 0.5 µm, and a conductive film 65 about 0.2 µm in thickness is formed on the EB resist 64.

Figure 31C:
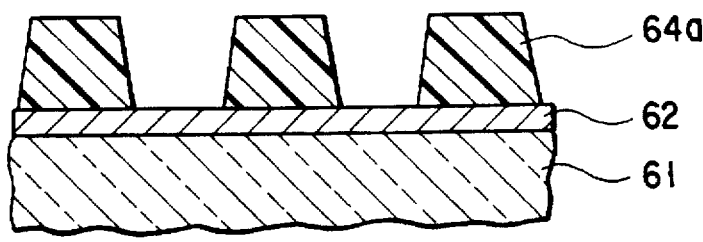

Thereafter, lithography is performed at a dose of 3 µC/cm² from above the conductive film 65 by using an electron beam, and subsequently development is performed, thereby forming a resist pattern 64a as shown in FIG. 31C.

Figure 31D:
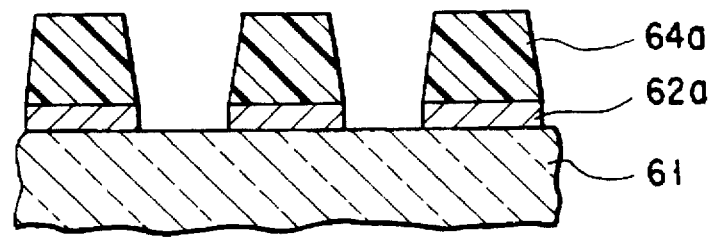

Subsequently, as shown in FIG. 31D, by using the resist pattern 64a as a mask, the Si film 62 exposed from the resist pattern 64a is etched away by chemical dry etching CDE) using a gas mixture of $CF_4$ and $O_2$. Thereafter, the resist pattern 64a is removed to obtain an Si film pattern 62a.

Figure 31E:
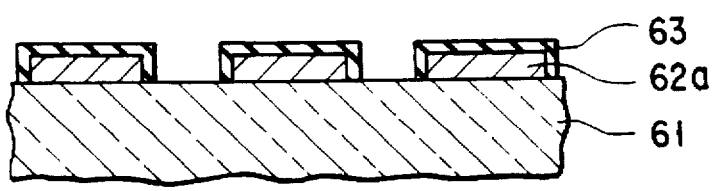

Lastly, as shown in FIG. 31E, a 4-nm thick oxide film 63 is formed on the Si film pattern 62a by oxygen ashing. In this case, there may be a possibility that the resolving power is decreased by the oxide film 63 formed on the side walls. However, no problem arises because the width of this oxide film 63 is very small, 4 nm, compared to an exposure wavelength of 436 nm. If a natural oxide film is already formed on the surface of the Si film 62, an oxide film is additionally formed on this natural oxide film to have a total oxide film thickness of 4 nm through the above treatment.

When a g-line was used as the exposure light for the mask formed as described above, the phase difference between light transmitted through the oxide film 63 and the Si film 62 as the translucent film and light transmitted through the transparent substrate 61 was 180°, and the amplitude transmittance was 17.4% with respect to the transparent substrate.

Although the Si film 62 is formed by sputtering in this embodiment, this film can also be formed by a CVD process or a vapor deposition process. It is also possible to set the thicknesses of the oxide film 63 and the Si film 62 at appropriate values within ranges not departing from the gist of the present invention. In addition, the oxide film can be formed in an atmosphere containing oxygen atoms or by a liquid-phase growth method. Furthermore, the oxide film and the Si film can be processed by RIE or wet etching.

In the mask formed by the steps discussed above, no deterioration in film quality with time such as caused by natural oxidation was found, so the ideal phase difference and amplitude transmittance could be maintained. When this mask was used to conduct an experiment of pattern transfer to wafers, patterns having good shapes could be obtained with a high dimensional accuracy.

(Embodiment 7)

The seventh embodiment of the present invention will be described below. This embodiment relates to a method of performing, as a step of forming an oxide film, oxidation on the surface of a translucent film by dipping a substrate having the translucent film into an oxidizing solution.

The reaction formula when a solution mixture of sulfuric acid and a hydrogen peroxide solution is used as the oxidizing solution is as follows.

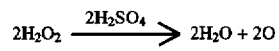

The a hydrogen peroxide solution has a high cleaning effect because its oxidizing function is very strong. Examples of the material often used in manufacturing a translucent phase-shifting film as a single-layer film are amorphous Si, $SiN_x$, $SiO_y$, $CrO_z$, $GeO_u$, $TiO_y$, $AlO_w$, $MoSiO_x$, $MoSiO_xN_y$, $WSiO_x$, and $WSiO_xN_y$ (wherein each of u, v, w, x, y, and z represents a given composition ratio), and their mixtures. A film consisting of any of these materials is readily oxidized in the air. However, when the film is oxidized in the solution of the above sort, the surface oxide film present on the translucent film does not increase any longer after the oxidation. This prevents the deterioration of the physical properties of the translucent film with time. In addition, by simultaneously controlling the refractive index and the extinction coefficient of the translucent film by taking account of the film thickness of the oxide film formed by the oxidation and the consequent change in thickness of the translucent film, the amplitude transmittance and the phase difference with respect to the substrate can be controlled to values by which a full advantage of the phase-shifting effect can be exploited.

FIGS. 32A to 32E are sectional views showing the 10 steps of manufacturing an exposure mask according to the seventh embodiment of the present invention. When a KrF laser is used as an exposure light source, $SiN_x$ can be used as the material of a translucent film of a halftone mask.

Figure 32A:
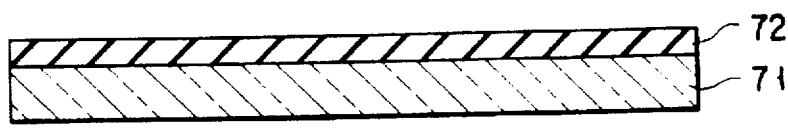
FIGS. 32A to 32E are sectional views showing the steps of manufacturing an exposure mask according to the seventh embodiment of the present invention.

First, as shown in FIG. 32A, a 96-nm thick $SiN_x$ film (translucent film) 72 is formed on a transparent substrate 71 by sputtering. This film thickness is so adjusted that the phase difference and the transmittance with respect to the transparent substrate 71 are controlled to their respective desired values after oxidation. The amplitude transmittance of the translucent film 72 at that time was found to be 17.6%.

Figure 32B:
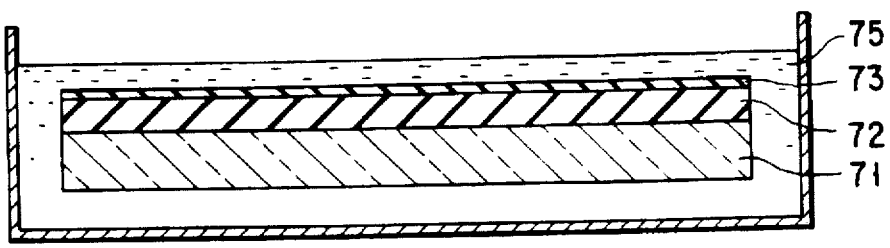
Figure 33:
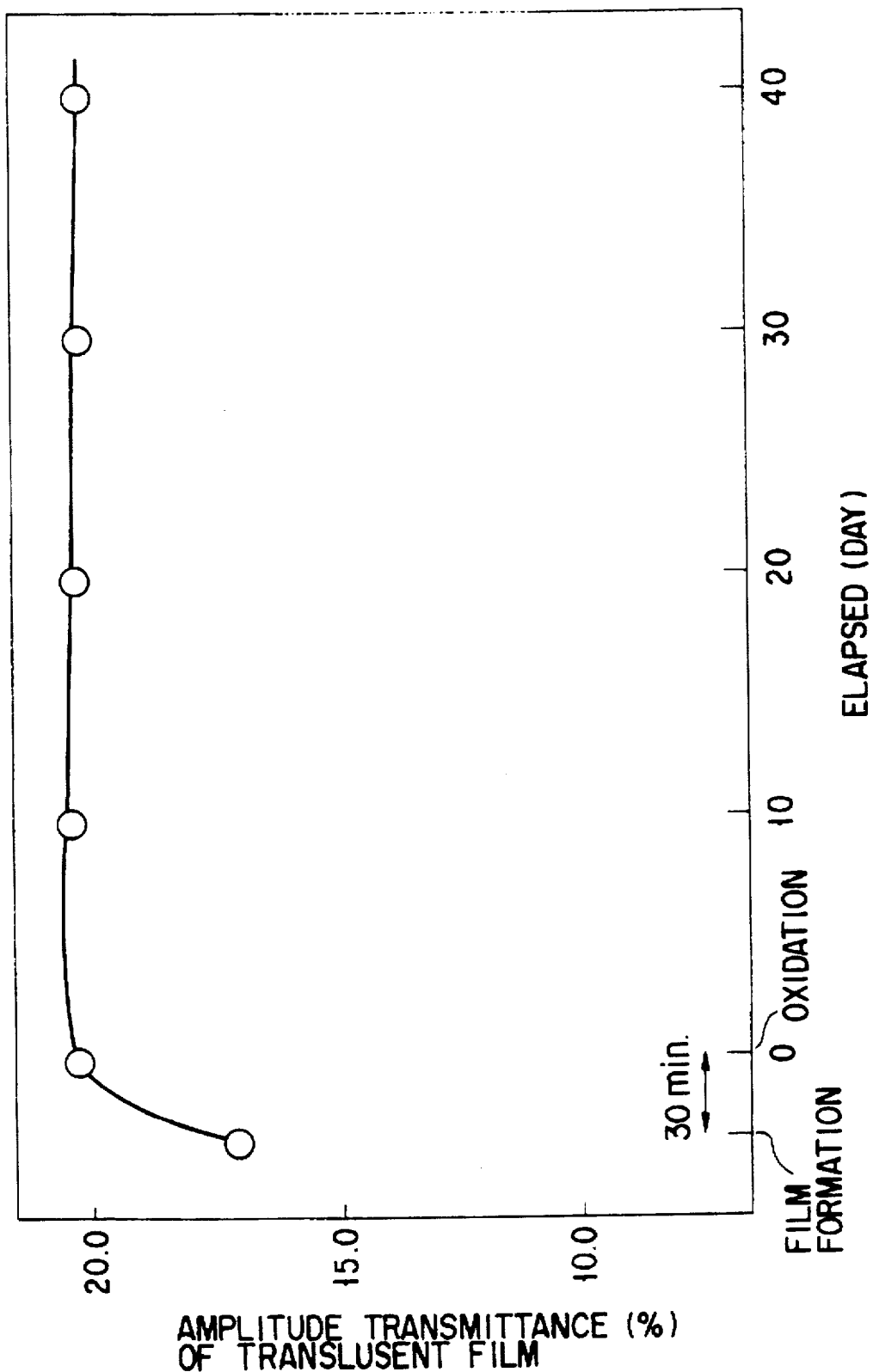
FIG. 33 is a graph showing the change with time of the transmittance of a translucent film in the seventh embodiment.

Subsequently, as shown in FIG. 32B, the resultant substrate is dipped in an oxidizing solution 75 containing a hydrogen peroxide solution and sulfuric acid at a mixing ratio of 1:3 for 30 minutes (oxidation), forming a surface oxide film 73. The time required for this oxidation can be calculated from data as shown in FIG. 33. FIG. 33 illustrates the change in the amplitude transmittance of the translucent film with time when the substrate was dipped in the solution containing a hydrogen peroxide solution and sulfuric acid at a mixing ratio of 1:3 for 30 minutes. As can be seen from FIG. 33, after the substrate was dipped in the solution containing a hydrogen peroxide solution and sulfuric acid at a mixing ratio of 1:3 for 30 minutes (oxidation), neither the transmittance nor the phase difference changed with time. At that time, the thickness of the surface oxide film 73 formed was 4.5 nm, and the amplitude transmittance was found to be 20.2%.

Figure 32C:
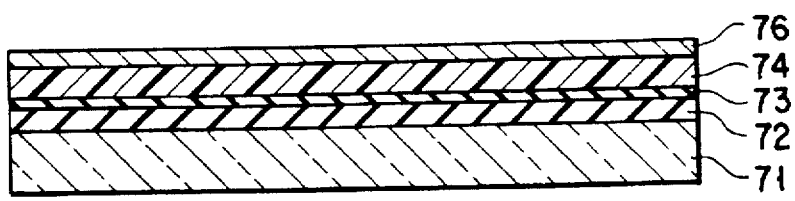
Figure 32D:
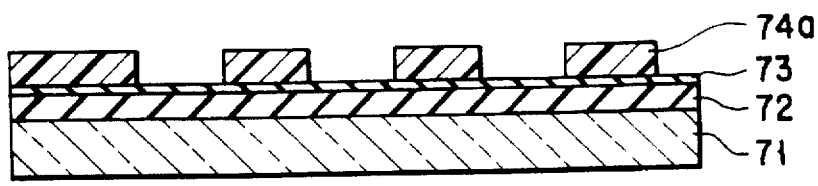

After the resultant substrate is washed with water sufficiently and dried, as shown in FIG. 32C, an EB resist 74 is coated on the surface oxide film 73, and a conductive film 76 is formed on the EB resist 74 in order to prevent charge-up occurring when EB lithography is performed. Thereafter, as shown in FIG. 32D, a desired resist pattern 74a is formed by EB lithography.

Figure 32E:
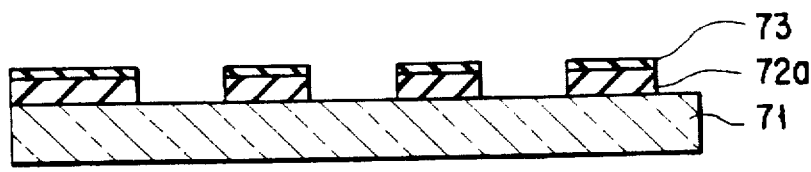

Subsequently, as shown in FIG. 32E, the $SiN_x$ film 72 is patterned through etching by using the resist pattern 74a as a mask. As this etching, CDE (Chemical Dry Etching) or RIE (Reactive ion Etching) can be used. After an $SiN_x$ film pattern 72a is formed by this etching, the EB resist 74a is removed.

In this embodiment, the $SiN_x$ film was used as the translucent film 72. However, the translucent film 72 is not limited to the $SiN_x$ film. For example, similar effects can be obtained by using a translucent film consisting of any of amorphous Si, $SiO_y$, $CrO_x$, $GeO_u$, $TiO_y$, $AlO_w$, $MoSiO_x$, $MoSiO_xN_y$, $WSiO_x$, and $WSiO_xN_y$ (wherein each of u, v, w, x, y, and z represents a given composition ratio). It is also possible to set the film thickness of the translucent film at a proper value within a range not departing from the gist of the present invention. In addition, the oxidizing solution is not limited to the solution containing a hydrogen peroxide solution and sulfuric acid at a mixing ratio of 1:3 but may be some other substance, such as fuming nitric acid, having a strong oxidizing effect. Furthermore, instead of forming the conductive film on the translucent film, a film serving as an antistatic film may be formed on the substrate in advance.

According to this embodiment as described above, an oxide film can be formed on the surface of a translucent film by dipping a substrate having the translucent film into an oxidizing solution. Consequently, it is possible to prevent the deterioration of the film quality of the translucent film with time. This makes it possible to realize an ideal phase difference and amplitude transmittance of a halftone phase-shifting mask. In addition, since the step of forming the translucent film having stable physical properties is performed by dipping the substrate into the oxidizing solution, a mask cleaning effect can be realized at the same time. (Embodiment 8)

FIGS. 34A to 34F are sectional views showing the steps of manufacturing an exposure mask according to the eighth embodiment of the present invention. When a KrF laser is used as an exposure light source, $SiN_x$ can be used as the material of a translucent film of a halftone mask.

Figure 34A:
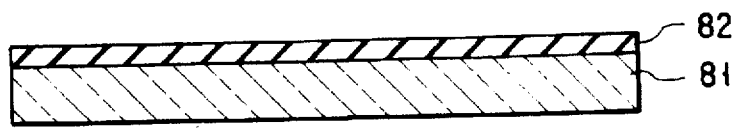
FIGS. 34A to 34F are views showing the steps of manufacturing an exposure mask according to the eighth embodiment of the present invention.

First, as shown in FIG. 34A, a 96-nm thick $SiN_x$ film (translucent film) 82 is formed on a transparent substrate 81 by sputtering. The amplitude transmittance of the translucent film 82 at that time was found to be 17.6%. This film thickness is so adjusted that the phase difference and the transmittance with respect to the transparent substrate 81 are controlled to their respective desired values after oxidation.

Figure 34B:
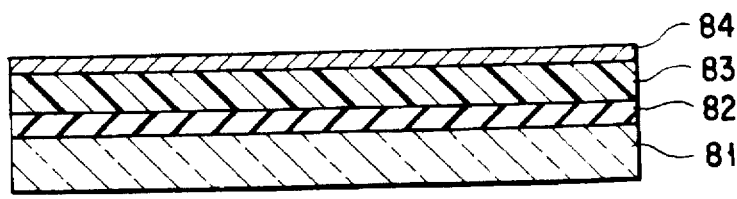
Figure 34C:
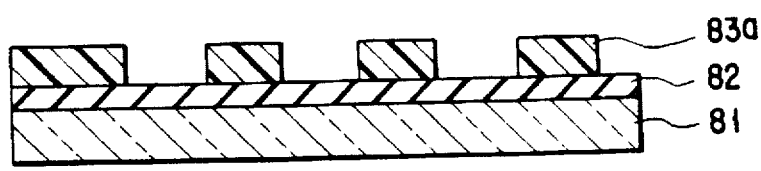

Subsequently, as shown in FIG. 34B, an EB resist 83 is coated on the $SiN_x$ film 82, and a conductive film 84 is formed on the EB resist 83 in order to prevent charge-up occurring when EB lithography is performed. Thereafter, as shown in FIG. 34C, a desired resist pattern 83a is formed by EB lithography.

Figure 34D:
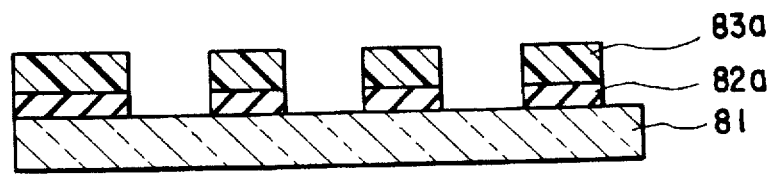
Figure 34E:
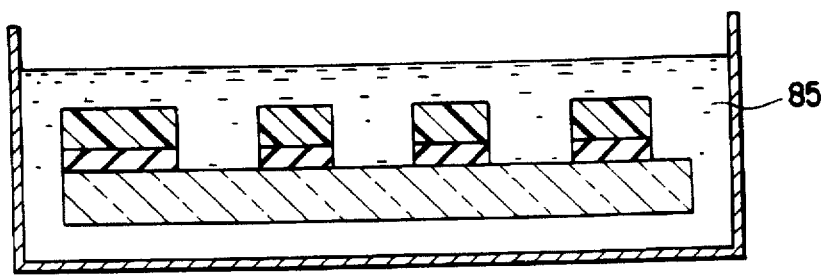
Figure 34F:
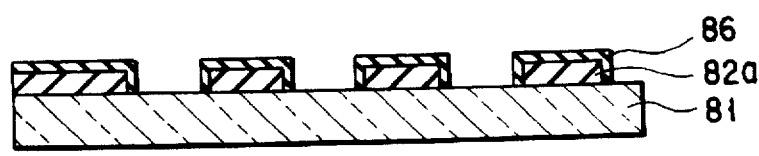

In the next step, as shown in FIG. 34D, the $SiN_x$ film 82 is patterned through etching by using the resist pattern 83a as a mask. As this etching, CDE (Chemical Dry Etching) or RIE (Reactive Ion Etching) can be used. After an $SiN_x$ film pattern 82a is formed by this etching, as shown in FIG. 34E, the EB resist 83 is removed by dipping the resultant substrate in an oxidizing solution 85 containing a hydrogen peroxide solution and sulfuric acid at a mixing ratio of 1:3 for 40 minutes. Thereafter, a desired surface oxide film 86 is formed as shown in FIG. 34F. At that time, the thickness of the surface oxide film 86 of the translucent film 82 was 4.5 nm, and the amplitude transmittance was found to be 20.2%. Since the removal of the EB resist 83 was performed in the oxidizing solution, no change was found in the transmittance and the phase difference with time after that. Consequently, a translucent film with a stable film quality could be obtained.

In this embodiment, the $SiN_x$ film was used as the translucent film 82. However, the translucent film 82 is not limited to the $SiN_x$ film. For example, similar effects can be obtained by using a translucent film consisting of any of amorphous Si, $SiO_y$, $CrO_z$, $GeO_u$, $TiO_y$, $AlO_w$, $MoSiO_x$, $MoSiO_xN_y$, $WSiO_x$, and $WSiO_xN_y$ (wherein each of u, v, w, x, y, and z represents a given composition ratio). It is also possible to set the film thickness of the translucent film at a proper value within a range not departing from the gist of the present invention. In addition, the oxidizing solution is not limited to the solution containing a hydrogen peroxide solution and sulfuric acid at a mixing ratio of 1:3 but may be some other substance, such as fuming nitric acid, having a strong oxidizing effect. Furthermore, instead of forming the conductive film on the translucent film, a film serving as an antistatic film may be formed on the substrate in advance.

According to this embodiment as described above, as in the seventh embodiment mentioned earlier, an oxide film can be formed on the surface of a translucent film by dipping a substrate having the translucent film into an oxidizing solution. Consequently, it is possible to obtain effects similar to those of the seventh embodiment. In addition, the removal of the resist after the pattern formation of the translucent film is performed by dipping the substrate into the oxidizing solution. This makes it unnecessary the use of an additional step of forming a translucent film having stable physical properties. Consequently, the manufacturing cost of the mask can be reduced.

(Embodiment 9)

Figure 35:
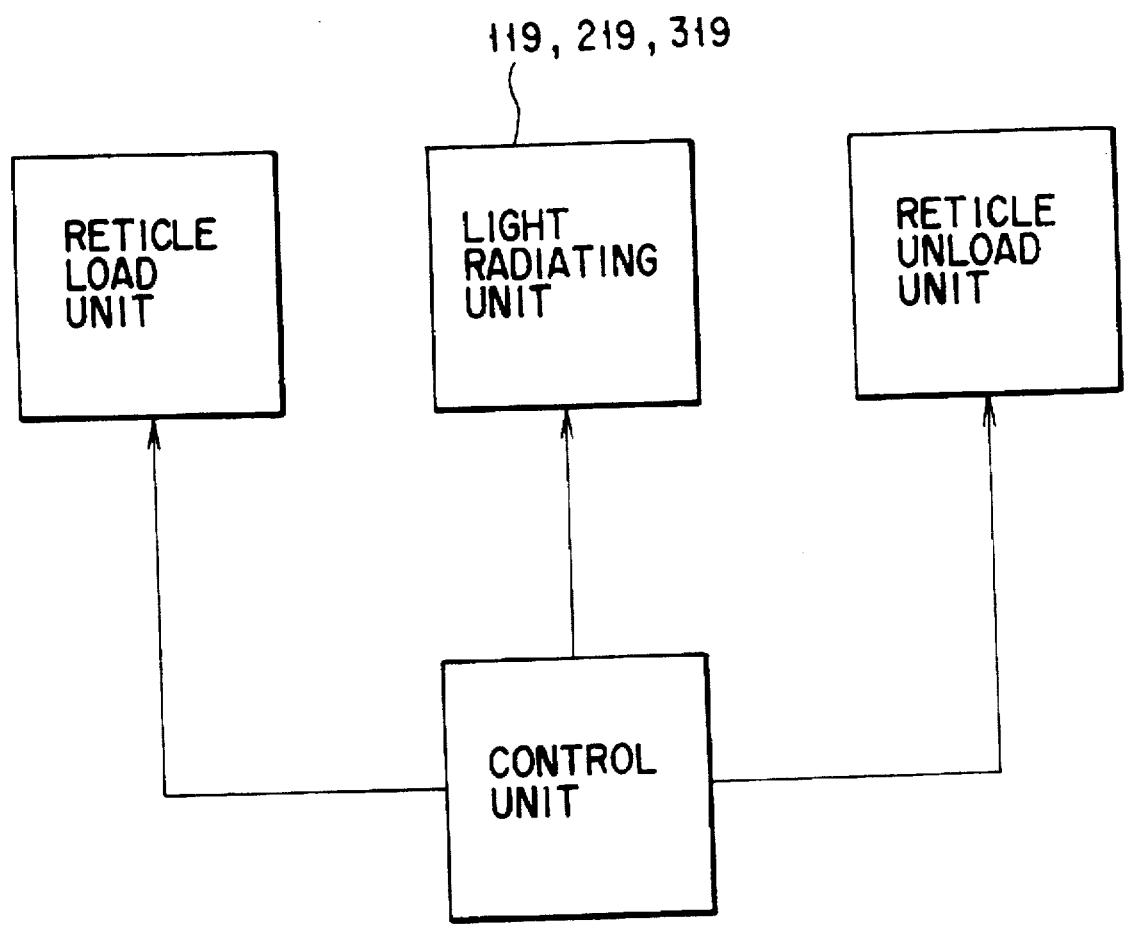
FIG. 35 is a block diagram showing an exposure mask manufacturing apparatus of the present invention.

The arrangement of an exposure mask manufacturing apparatus of the present invention is as shown in FIG. 35. In this arrangement, a reticle is taken out from a reticle load unit by a conveyor arm or belt (not shown) and placed on a stage of a light radiating unit (119, 219, 319). The light radiating unit stabilizes the reticle. Subsequently, the reticle is transferred from the light radiating unit to a reticle unload unit by a conveyor arm or belt. The operations of the reticle load unit, the light radiating unit, and the reticle unload unit are controlled by a control unit.

FIG. 36 is a schematic view showing an exposure mask manufacturing apparatus according to the ninth embodiment of the present invention. This apparatus comprises a section for radiating exposure light onto an exposure mask, and a section for measuring the transmittance of the exposure mask.

An exposure mask 100 has a device pattern 101 and a transmittance monitor area 102. Light emitted from a light radiating unit (first light source) 111 is radiated on the exposure mask 100 through a linearly polarizing filter (polarizing plate) 112. Note that it is possible to use, e.g., a low-pressure mercury lamp, a high-pressure mercury lamp, a Xe—Hg lamp, or a heavy hydrogen lamp as the light source of the light radiating unit 111, and these lamps are so selected as to match the absorption band of a translucent film of the exposure mask 100. The exposure mask 100 is so arranged that the irradiation direction is from a transparent substrate to a translucent film.

While being supported at its four corners, the exposure mask 100 is rotated with its center as the axis of rotation by a motor 113. This permits even irradiation of the light from the light radiating unit 111. Although the exposure mask 100 is fixed at its four corners in this embodiment, the exposure mask 100 need only be supported at its peripheral portion. In addition, the exposure mask 100 is rotated concentrically in this embodiment, but the exposure mask 100 may be rotated eccentrically. It is also possible to perform eccentric rotation and rotation on its axis at the same time. Furthermore, the light radiating unit, rather than the mask, can be rotated from the point of view of even irradiation.

The section for measuring the transmittance of the exposure mask is designed as follows. That is, light emitted from a transmittance monitoring light source (second light source) 114 for emitting only an exposure wavelength is radiated on the transmittance monitor area 102 through a linearly polarizing filter 115 arranged in a direction perpendicular to the direction of the linearly polarizing filter 112. The light passing through the monitor area 102 is incident on a transmittance light-receiving unit 117 through a linearly polarizing filter 116 in the same direction as the linearly polarizing filter 115. This transmittance light-receiving unit 117 consists of a light-receiving element such as a photodiode. Therefore, by fixing the light emission intensity of the monitoring light source 114, it is possible to measure the transmittance of the monitor area 102 from the output from the photodiode. Note that it is not particularly necessary to provide the linearly polarizing filter 115 on the transmittance monitoring light source side.

The measurement result obtained by the transmittance light-receiving unit 117 is supplied to the light radiating unit 111, and the light radiating unit 111 is controlled in accordance with this measurement result by an irradiation control unit 118. More specifically, the irradiation from the light radiating unit 111 is terminated at the time the transmittance light-receiving unit 117 obtains an optimum transmittance.

With this arrangement, the photoirradiation from the light radiating unit 111 makes it possible to form the stabilized region discussed earlier in the boundary between the transparent substrate and the translucent film of the exposure mask 100, or on the translucent film, thereby preventing variations in optical variables of the translucent film upon irradiation with exposure light. In addition, this embodiment makes use of the mechanism for measuring the transmittance. Since the light from the light radiating unit 111 is separated from the light from the monitoring light source by using the linearly polarizing filters 112, 115, and 116, the transmittance of the exposure mask 100 can be accurately measured. Furthermore, the information of the measured transmittance is fed back to the light radiating unit 111. This results in an advantage that the irradiation of light can be stopped when an optimum transmittance of the exposure mask 100 is obtained.

(Embodiment 10)

FIG. 37 is a schematic view showing the arrangement of an exposure mask manufacturing apparatus according to the tenth embodiment of the present invention. Although the basic arrangement of this embodiment is identical with that of the ninth embodiment, this embodiment uses a difference in wavelength, instead of the use of linearly polarizing filters, in order to distinguish between light for stabilization and light for transmittance measurement.

An exposure mask 200 has a device pattern 201 and a transmittance monitor area 202. Light emitted from a light radiating unit (first light source) 211 passes through a filter 212 for limiting the wavelength of light. Consequently, light having a wavelength range containing at least a wavelength falling in the infrared absorption band of a translucent film is radiated on the exposure mask 200. Note that it is possible to use, e.g., a low-pressure mercury lamp, a high-pressure mercury lamp, a Xe—Hg lamp, or a heavy hydrogen lamp as the light source of the light radiating unit 211, and these lamps are so selected as to match the absorption band of a translucent film of the exposure mask 200. The exposure mask 200 is so arranged that the irradiation direction is from a transparent substrate to a translucent film.

While being supported at its four corners, the exposure mask 200 is rotated with its center as the axis of rotation by a motor 213. This permits even irradiation of the light from the light radiating unit 211. Although the exposure mask 200 is fixed at its four corners in this embodiment, the exposure mask 200 need only be fixed at its peripheral portion. That is, various modifications such as explained in the ninth embodiment can be made.

The section for measuring the transmittance of the exposure mask is designed as follows. That is, light emitted from a transmittance monitoring light source (second light source)

214 for emitting only an exposure wavelength is radiated on the transmittance monitor area 202. The light passing through this monitor area 202 is incident on a transmittance light-receiving unit 217 consisting of a photosensor. Therefore, by fixing the light emission intensity of the monitoring light source 214, the transmittance of the monitor area 202 can be measured from the output from the photosensor.

The transmittance light-receiving unit 217 preferably has a wavelength selectivity in order to distinguish between the light from the light radiating unit 211 and the light from the monitoring light source 214. More specifically, a photomultiplier or photodiode added with a spectral function can be used. If a photosensor having no wavelength selectivity is to be used, a filter which cuts off the light from the light radiating unit 111 and transmits the light from the monitoring light source 214 is arranged on the input side of the photosensor.

The measurement result obtained by the transmittance light-receiving unit 217 is supplied to the light radiating unit 211, and the light radiating unit 211 is controlled in accordance with this measurement result by an irradiation control unit 218. More specifically, the irradiation from the light radiating unit 211 is stopped at the time the transmittance light-receiving unit 217 obtains an optimum transmittance.

With this arrangement, the photoirradiation from the light radiating unit 211 makes it possible to form the stabilized region discussed earlier in te boundary between the transparent substrate and the translucent film of the exposure mask 200, or on the translucent film, thereby preventing variations in optical variables of the translucent film upon irradiation with exposure light. In addition, this embodiment makes use of the mechanism for measuring the transmittance. Since the light for stabilization is separated from the light for monitoring the transmittance by using a difference in wavelength, the transmittance of the exposure mask 200 can be accurately measured. Furthermore, the information of the measured transmittance is fed back to the light radiating unit 211. This results in an advantage that the irradiation of light can be stopped when an optimum transmittance of the exposure mask 200 is obtained.

(Embodiment 11)

Figure 38:
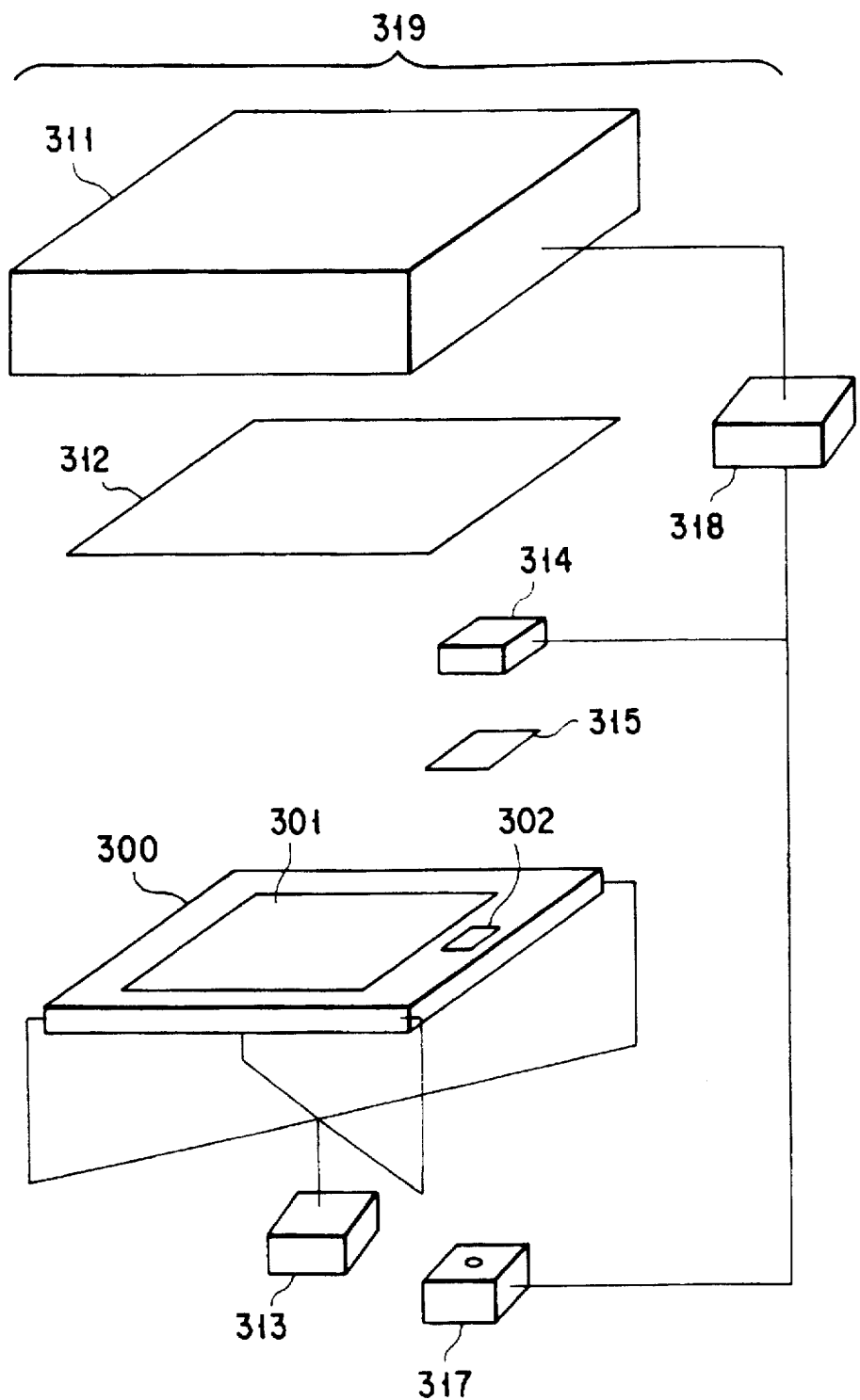
FIG. 38 is a schematic view showing an exposure mask manufacturing apparatus according to the 11th embodiment of the present invention.

FIG. 38 is a schematic view showing the arrangement of an exposure mask manufacturing apparatus according to the 11th embodiment of the present invention. Although the basic arrangement of this embodiment is identical with that of the tenth embodiment, this embodiment shifts the irradiation timing of light for stabilization from that of transmittance measuring light in order to distinguish between these two light components.

An exposure mask 300 has a device pattern 301 and a transmittance monitor area 302. Light emitted from a light radiating unit (first light source) 311 is radiated periodically on the exposure mask 300 through a shutter 312. Note that it is possible to use, e.g., a low-pressure mercury lamp, a high-pressure mercury lamp, a Xe—Hg lamp, or a heavy hydrogen lamp as the light source of the light radiating unit 311, and these lamps are so selected as to match the absorption band of a translucent film of the exposure mask 300. This shutter 312 is unnecessary if a laser for periodically emitting light, such as a KrF excimer laser, is used as the light radiating unit. The exposure mask 300 is so arranged that the irradiation direction is from a transparent substrate to a translucent film.

While being supported at its four corners, the exposure mask 300 is rotated with its center as the axis of rotation by a motor 313. This permits even irradiation of the light from the light radiating unit 311. Although the exposure mask 300 is fixed at its four corners in this embodiment, the exposure mask 300 need only be fixed at its peripheral portion. That is, various modifications such as explained in the ninth embodiment can be made.

The section for measuring the transmittance of the exposure mask is designed as follows. That is, light emitted from a transmittance monitoring light source (second light source) 314 for emitting only an exposure wavelength is radiated periodically on the transmittance monitor area 302 through a shutter 315. The light passing through this monitor area 302 is incident on a transmittance light-receiving unit 317. The shutter 315 is so controlled that the light from the transmittance monitoring light source 314 is radiated on the transmittance monitor area 302 in a time period during which no light is radiated from the light radiating unit 314. This shutter 315 is unnecessary if a laser for periodically emitting light, such as a KrF excimer laser, is used as the transmittance monitoring light source 314 and the transmittance monitoring light source can radiate light at a timing shifted from the irradiation timing of the light radiating unit 311. The transmittance light-receiving unit 317 consists of a photosensor. Therefore, by fixing the light emission intensity of the monitoring light source 314, the transmittance of the monitor area 302 can be measured from the output from the photosensor.

The measurement result obtained by the transmittance light-receiving unit 317 is supplied to the light radiating unit 311, and the light radiating unit 311 is controlled in accordance with this measurement result by an irradiation control unit 318. More specifically, the irradiation from the light radiating unit 311 is terminated at the time the transmittance light-receiving unit 317 obtains an optimum transmittance.

With this arrangement, the photoirradiation from the light radiating unit 311 makes it possible to form the stabilized region discussed earlier in the boundary between the transparent substrate and the translucent film of the exposure mask 300, or on the translucent film, thereby preventing variations in optical variables of the translucent film upon irradiation with exposure light.

In addition, this embodiment makes use of the mechanism for measuring the transmittance. Since the light for stabilization is separated from the transmittance monitoring light by shifting their irradiation timings by using the shutters 312 and 315, the transmittance of the exposure mask 300 can be accurately measured. Furthermore, the information of the measured transmittance is fed back to the light radiating unit 311. This results in an advantage that the irradiation of light can be stopped when the optimum transmittance of the exposure mask 300 is obtained.

As described above, this embodiment uses the mechanism for monitoring the transmittance of a translucent film. Instead, it is possible to use a mechanism for determining the end point by calculating a transmittance and a phase difference from the refractive index n and the extinction coefficient k of a translucent film obtained by monitoring the reflected light by using a spectral ellipsometer.

(Embodiment 12)

By using a halftone phase-shifting mask manufactured by the apparatus and the method described in this embodiment and having an amplitude transmittance of 24.5% and a phase shift of 180°, the transfer results of 0.3-μm hole patterns when a KrF laser was used as an exposure light source were evaluated. Consequently, it was possible to obtain a focal depth of 1.5 μm. In addition, the transfer results were again evaluated after patterns of 500 lots were irradiated using the same mask. Consequently, the focal depth was found to be 1.5 μm, indicating that the performance when the mask was manufactured could be maintained.

When a mask manufactured by a conventional method was similarly used for irradiation of patterns of 500 lots, on the other hand, the amplitude transmittance and the phase difference which were 24.5% and 180°, respectively, immediately after the film formation largely varied to 26.5% and 170°, respectively, due to irradiation of exposure light and deterioration with time. The consequent focal depth was found to be 0.8 μm, demonstrating that the performance when the mask was manufactured was largely degraded. Consequently, the use of the halftone phase-shifting mask manufactured by the apparatus and the method described in this embodiment greatly widened the range of applications to devices.

Note that the present invention is not limited to the above embodiments but can be modified and practiced without departing from the gist of the invention.

(Embodiment 13)

When a material having a high reflectance to an exposure wavelength is used as a mask material in a conventionally used exposure mask substrate, light reflected by the surface of the exposure mask substrate on which illuminating light is incident returns to an illuminating unit. The light is then reflected by a lens or the like of the illuminating unit and again becomes incident on the exposure mask substrate. This light acts as noise to cause unevenness of illuminance, resulting in a deteriorated resolving performance or a decreased focal depth.

On the other hand, light transmitted through apertures in the pattern surface (from which illuminating light emerges) of the exposure mask substrate is reflected by a projecting lens and a substrate (wafer) to be exposed to reach the exposure mask substrate. Since this light is reflected more by a non-aperture portion, the light reaching the substrate to be exposed forms a negative image which is the inverse image of a mask image to be originally formed. This results in a deteriorated pattern shape such as a film reduction.

To solve these problems, as disclosed in, e.g., Jpn. Pat. Appln. KOKAI Publication No. 61-198156, an antireflection film consisting of a chromium film having a thickness of 20 to 50 nm and containing oxygen or nitrogen is formed on a light-shielding pattern. This reduces the reflectance of the pattern portion formed on the mask material of an exposure mask substrate to 10% or less, thereby preventing occurrence of stray light.

Jpn. Pat. Appln. KOKAI Publication No. 4-136854, on the other hand, discloses an exposure translucent phase-shifting mask substrate which improves the resolving power and the focal depth by using intact the pattern design of a conventionally used exposure mask substrate. In the above publication, a translucent phase-shifting film so formed as to have an intensity transmittance of 2 to 16% and a phase difference of 180° with respect to adjacent apertures is used as the pattern portion of the exposure mask substrate. In addition, to achieve this object, it has been proposed to form a two-layer structure in which a phase-adjusting layer and an intensity transmittance-adjusting layer are separately formed.

Figure 42:
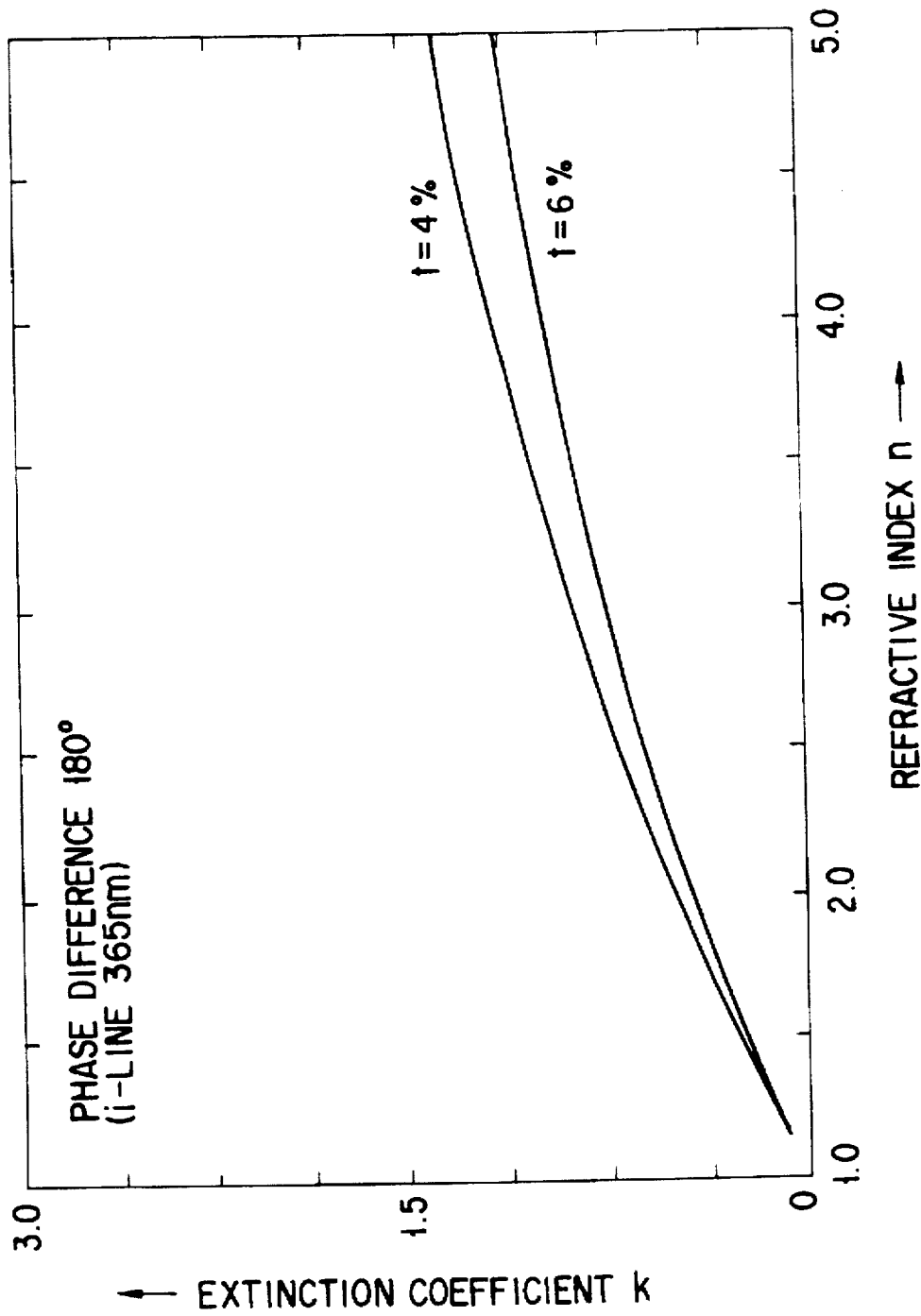
FIG. 42 is a graph showing the relationship between the refractive index and the extinction coefficient with respect to the intensity transmittance of a single-layer translucent phase-shifting mask.

When an exposure translucent phase-shifting mask substrate is formed with a single-layer structure, the relationship between the refractive index, the extinction coefficient, and the film thickness is uniquely determined if a desired intensity transmittance and phase difference are determined as shown in FIG. 42. As indicated by the curves illustrated in FIG. 42, however, one combination necessarily exists for a given refractive index. The reflectance of a certain substance, on the other hand, has a close relation to the refractive index and the extinction coefficient of that substance; that is, the reflectance rises as the differences in refractive index and extinction coefficient between two substances forming the interface increase. Therefore, if a material having a refractive index of a certain value or more is used as a translucent phase-shifting film, the reflectance of this translucent phase-shifting film increases to produce stray light, leading to reduction in pattern exposure accuracy.

Conventionally, as discussed above, when an exposure translucent phase-shifting mask substrate is formed with a single-layer structure, the reflectance of a translucent phase-shifting film increases to produce stray light depending on the type of material, resulting in a decreased pattern exposure accuracy.

This embodiment has been made in consideration of the above situation and has as its object to provide an exposure mask substrate capable of improving the pattern exposure accuracy by removing stray light caused by the material of a translucent phase-shifting film.

To achieve the above object, the present invention adopts the following arrangement.

That is, the exposure mask substrate of this embodiment is characterized in that, in an exposure mask substrate in which a single-layer translucent phase-shifting film having an intensity transmittance t of 2 to 16% and a refractive index, an extinction coefficient, and a film thickness so adjusted that an optical path length is shifted by a half wavelength from that of light transmitted through only a light-transmitting substrate is formed on at least a portion of at least one surface of the light-transmitting substrate, the reflectance of the surface of the translucent phase-shifting film on the surface on which the translucent phase-shifting film is formed is 10% or less.

Another desirable aspect of the present invention is as follows.

(5.1) The reflectance of the translucent phase-shifting film is achieved by setting the refractive index of the translucent phase-shifting film between 1.49 and 1.73+0.016t.

In addition, the exposure mask substrate of this embodiment is characterized in that, in an exposure mask substrate in which a single-layer translucent phase-shifting film having an intensity transmittance t of 2 to 16% and a refractive index, an extinction coefficient, and a film thickness so adjusted that an optical path length is shifted by a half wavelength from that of light transmitted through only a light-transmitting substrate is formed on at least a portion of at least one surface of the light-transmitting substrate, assuming, for each aperture (an aperture in the pattern surface) in which neither the translucent phase-shifting film nor a light-shielding film is formed, a median line at equal distances from two parallel sides and positioned in the aperture, at least a pattern is included in which a value calculated by dividing a shortest distance L between parallel ones of median lines of adjacent apertures by $\lambda/NA$, which is represented by a wavelength $\lambda$ for use in exposure and a numerical aperture NA for a substrate to be exposed by an exposure optical system, is 1 or less on the substrate to be exposed, or in which the value obtained by dividing the shortest distance L by $\lambda/NA$ is larger than on the substrate to be exposed but a value calculated by dividing the minimum width of apertures by $\lambda/NA$ is 0.5 or less on the substrate, the reflectance of the surface of the translucent phase-shifting film is 10% or less on the surface on which the translucent phase-shifting film is formed, and the reflectance of the translucent phase-shifting film is achieved by setting the refractive index of the translucent phase-shifting film between 1.49 and 1.73+0.016t.

Examples of the desirable aspects of the present invention are as follows.

(6.1) At least a pattern is included in which the minimum value of the values calculated by dividing the shortest distance L by λ/NA ranges between 0.9 and 1 on the substrate to be exposed, or in which the value calculated by dividing the shortest distance L by λ/NA is larger than 0.9 on the substrate to be exposed but the minimum value of the values calculated by dividing the minimum width of apertures by λ/NA ranges between 0.45 and 0.5 on the substrate, and the reflectance (10% or less) of the translucent phase-shifting film is achieved by setting the refractive index of the translucent film between 1.49 and 1.73+0.016t.

(6.2) At least a pattern is included in which the minimum value of the values calculated by dividing the shortest distance L by λ/NA ranges between 0.8 and 0.9 on the substrate to be exposed, or in which the value calculated by dividing the shortest distance L by λ/NA is larger than 0.8 on the substrate to be exposed but the minimum value of the values calculated by dividing the minimum width of apertures by λ/NA ranges between 0.40 and 0.45 on the substrate, and the reflectance (10% or less) of the translucent phase-shifting film is achieved by setting the refractive index of the translucent film between 1.60 and 1.73+0.016t.

(6.3) At least a pattern is included in which the minimum value of the values calculated by dividing the shortest distance L by λ/NA ranges between 0.75 and 0.8 on the substrate to be exposed, or in which the value calculated by dividing the shortest distance L by λ/NA is larger than 0.75 on the substrate to be exposed but the minimum value of the values calculated by dividing the minimum width of apertures by λ/NA ranges between 0.375 and 0.40 on the substrate, and the reflectance (10% or less) of the translucent phase-shifting film is achieved by setting the refractive index of the translucent film between 1.72 and 1.73+0.016t.

(6.4) At least a pattern is included in which the minimum value of the values calculated by dividing the shortest distance L by λ/NA ranges between 0.7 and 0.75 on the substrate to be exposed, or in which the value calculated by dividing the shortest distance L by λ/NA is larger than 0.7 on the substrate to be exposed but the minimum value of the values calculated by dividing the minimum width of apertures by λ/NA ranges between 0.35 and 0.375 on the substrate, and the reflectance (10% or less) of the translucent phase-shifting film is achieved by setting the refractive index of the translucent film between 1.81 and 1.73+0.016t.

(6.5) At least a pattern is included in which the minimum value of the values calculated by dividing the shortest distance L by λ/NA is 0.7 or less on the substrate to be exposed, or in which the value calculated by dividing the shortest distance L by λ/NA is larger than 0.7 on the substrate to be exposed but the minimum value of the values calculated by dividing the minimum width of apertures by λ/NA is 0.35 or less on the substrate, and the reflectance (10% or less) of the translucent phase-shifting film is achieved by setting the refractive index of the translucent film between 1.85 and 1.73+0.016t.

(6.6) The single-layer translucent phase-shifting film contains a naturally oxidized region on its surface.

(6.7) The exposure mask substrate of this embodiment is used to form a photosensitive resin pattern by forming a mask pattern image on a photosensitive resin material, which is formed on a substrate to be exposed, by oblique-incidence illumination, and developing the formed image.

(6.8) The exposure mask substrate of this embodiment is used to form a photosensitive resin pattern by forming a mask pattern image on a photosensitive resin material, which is formed on a substrate to be exposed, by oblique-incidence illumination, and developing the formed image, and a semiconductor device is formed by processing the substrate by using this photosensitive resin pattern as a mask.

The function of the exposure mask substrate of this embodiment will be described below.

Figure 40:
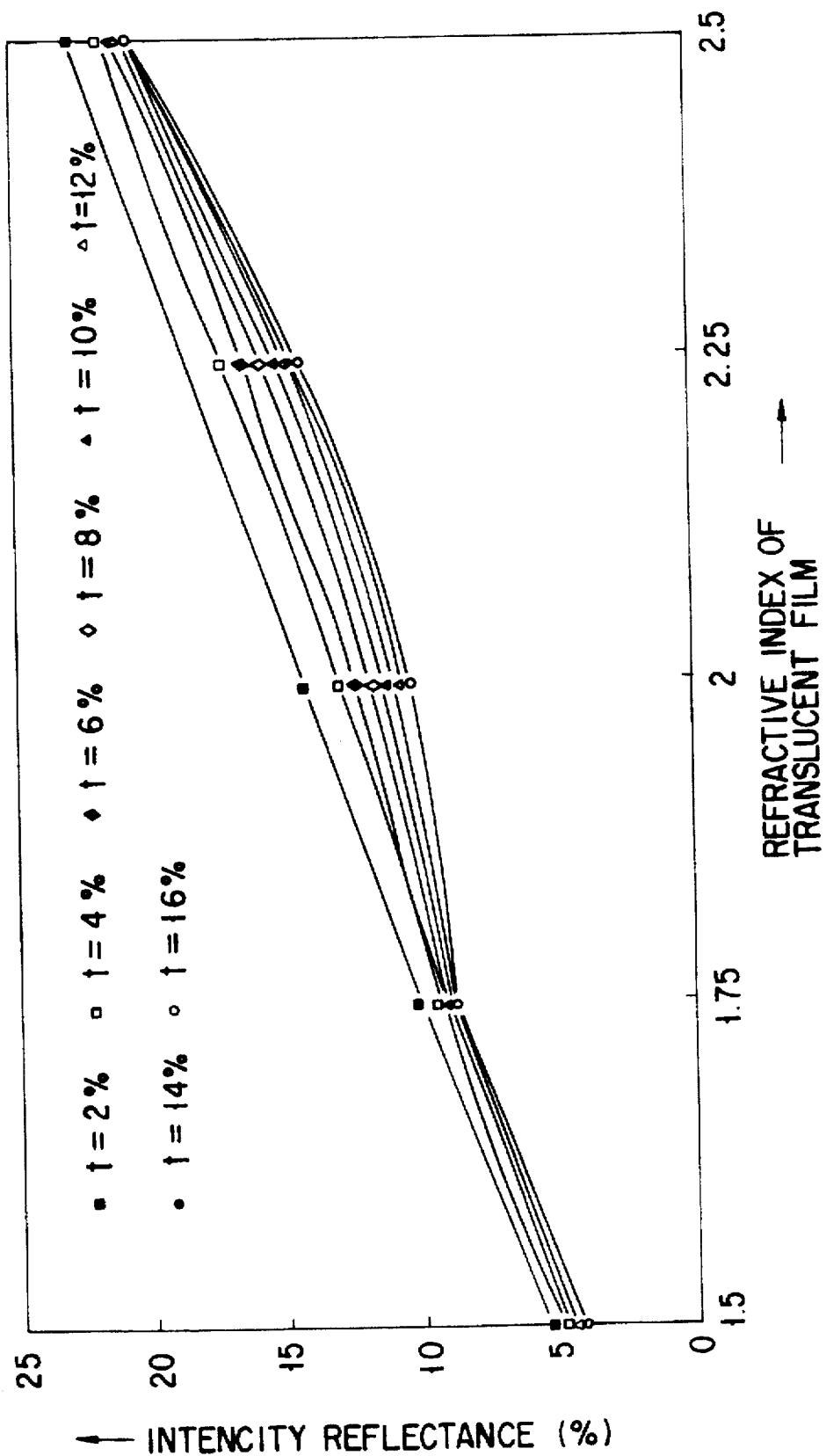
FIG. 40 is a graph showing the pattern surface reflectance when the intensity transmittance of an i-line translucent phase-shifting film is set.

FIG. 40 shows the reflectance of a translucent phase-shifting pattern when an exposure translucent phase-shifting mask, which is to be used when an i-line (365 nm) is used as an exposure light source, is manufactured as a single-layer mask having a phase difference of 180° and an intensity transmittance t of 2 to 16%. Referring to FIG. 40, assuming that the translucent phase-shifting pattern is formed by using quartz (refractive index=1.45) as a substrate, the reflectance is obtained by taking multiple reflection into consideration.

Figure 39:
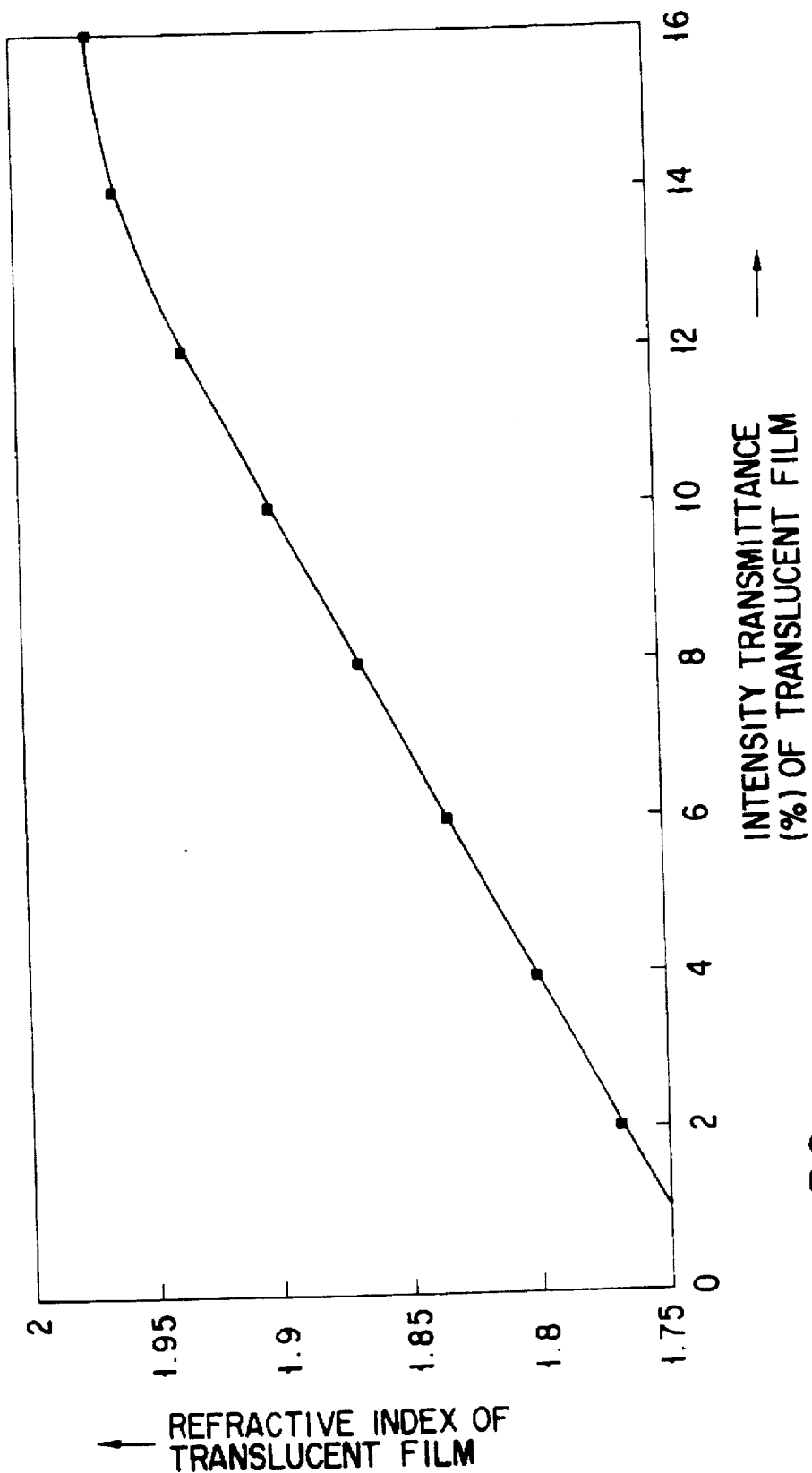
FIG. 39 is a graph for explaining the upper limit of the refractive index of a translucent phase-shifting film of an exposure mask according to the 13th embodiment of the present invention.

As shown in FIG. 40, the reflectance rises as the refractive index of the translucent phase-shifting film increases. In addition, the reflectance changes when the intensity transmittance changes. FIG. 39 shows the refractive index as a function of the intensity transmittance obtained on the basis of FIG. 40 when the reflectance is 10%. To obtain a phase difference of 180× for a desired intensity transmittance by taking account of a reflectance of 10% or less, it is necessary to use a substance having a smaller refractive index than the portion indicated by the curve illustrated in FIG. 39 as the material of the translucent phase-shifting film. The curve shown in FIG. 39 is approximated to refractive index=1.73+0.016t.

The upper limit of the refractive index as a function of the desired intensity transmittance shown in FIG. 39 hardly depends upon the wavelength.

FIG. 41 shows the refractive indices of exposure translucent phase-shifting mask substrates having desired intensity transmittances of 2% and 16%, assuming that the substrate has the same refractive index for an i-line (365 nm) and KrF (248 nm). As illustrated in FIG. 41, the reflectance obtained by one intensity transmittance coincides well with that obtained by the other regardless of whether the i-line or the KrF is used. That is, the upper limit of the refractive index remains almost the same for the same refractive index and the same extinction coefficient of a substrate when any of an i-line, KrF (248 nm), a g-line (436 nm), ArF (193 nm), or light having other wavelength is used as exposure light.

In FIGS. 40 and 41, 1.45 is used as the refractive index of quartz. However, if the refractive index of a substrate differs from this value, e.g., if a refractive index of 1.75 of $Al_2O_3$ or a refractive index of 2.03 of $Si_3N_4$ is used, the upper limit of the refractive index becomes different from that shown in FIG. 39. In this case, while each individual film is formed on a substrate, results similar to those shown in FIG. 40 are obtained by performing calculations by taking multiple reflection into account. The upper limit of the refractive index of the translucent phase-shifting film can be determined by calculating the refractive index when the reflectance at each intensity transmittance intercepts the upper limit of the reflectance required for the mask, thereby obtaining a correlation such as shown in FIG. 39.

Figure 43:
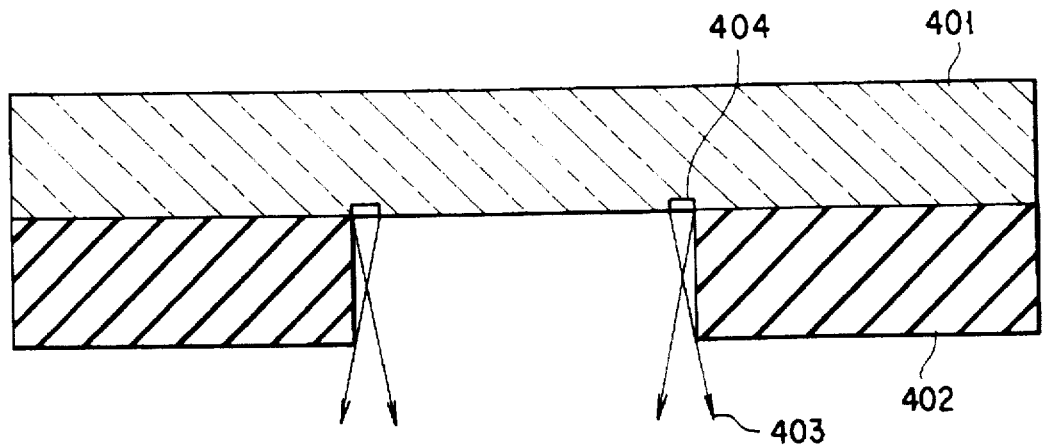
FIG. 43 is a sectional view for explaining pattern image blurred regions formed upon oblique-incidence illumination.

A translucent phase-shifting mask can be improved in resolution and focal depth when combined with oblique-incidence illumination. In the case of the oblique-incidence illumination, however, since light is radiated obliquely, blurred regions (regions lacking optical information) are formed as shown in FIG. 43 to degrade the image quality. Referring to FIG. 43, reference numeral 401 denotes a light-transmitting substrate; 402, a translucent phase-shifting pattern; 403, illuminating light; and 404, image blurred regions. In FIG. 43, the oblique-incidence angle is set such that the phase is shifted 180° in the interface between adjacent apertures. The tendency of image quality degradation becomes conspicuous as the thickness of the translucent phase-shifting film increases. In the case of the translucent phase-shifting mask, the thickness of the translucent phase-shifting mask depends primarily on the refractive index.

Assume that the dimensional variation of the wafer pattern finally formed is 10%, and that this variation is divided into variations in the mask pattern and the resist pattern and further divided into variations produced by pattern formation for the mask and by the film thickness. in this case, the variation allowed for the blurred regions 404 is within 2.5% in desired dimensions on the mask.

Figure 44:
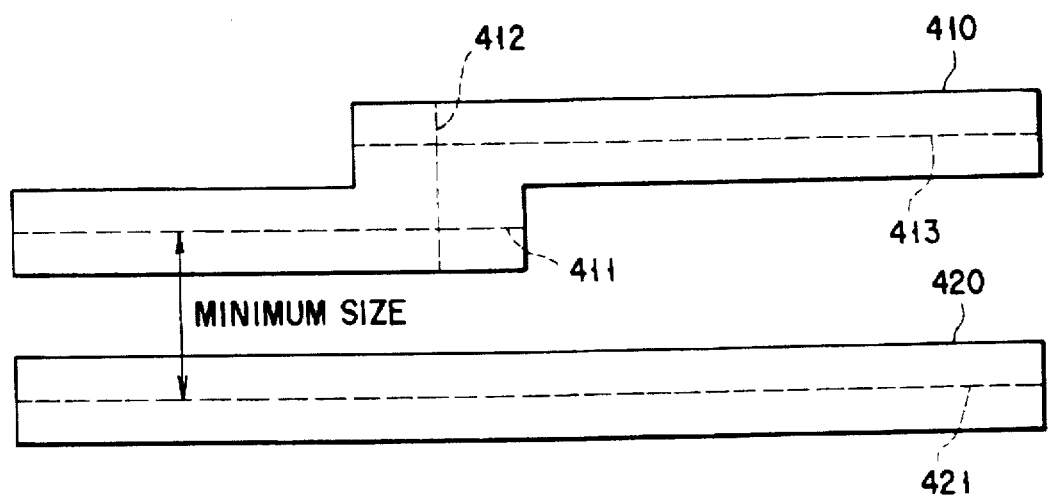
FIG. 44 is a view for explaining the concept of a minimum size L.

FIG. 44 shows the concept of the pattern size which causes this blur. Referring to FIG. 44, two apertures 410 and 420 are illustrated. Note that the aperture herein mentioned generally means a portion in which no translucent phase-shifting film is formed. In some cases, a light-shielding film is formed in addition to a translucent phase-shifting film depending on the type of mask. In this embodiment, however, a portion in which a light-shielding film is formed is not regarded as an aperture even if no translucent phase-shifting film is formed in it.

Median lines between parallel sides of the apertures 410 and 420 can be drawn as denoted by reference numerals 411, 412, 413, and 421. By comparing the median lines 411, 412, and 413 of the aperture 410 with the median line 421 of the aperture 420, it is possible to obtain combinations of median lines which are parallel to each other. In this case, two sets (411, 421) and (413, 421) can be obtained. Of these two combinations, the combination by which the distance between the patterns is minimized is (411, 421). The lower limit of the refractive index of the translucent phase-shifting film is calculated by obtaining the distance L between the median lines 411 and 421 for all mask patterns and comparing the minimum value of the distances with values listed in Table 1 below.

TABLE 1

| Exposure wavelength | Minimum size | L/(λ/NA) | Lower limit of refractive index |
|---|---|---|---|
| 365 nm | 3.25 μm | 0.445 | 1.51 |
|  | 3.00 μm | 0.411 | 1.60 |
|  | 2.75 μm | 0.377 | 1.72 |
|  | 2.50 μm | 0.342 | 1.86 |
| 248 nm | 2.25 μm | 0.453 | 1.49 |
|  | 2.00 μm | 0.403 | 1.65 |
|  | 1.75 μm | 0.353 | 1.81 |

(Calculated for NA: 0.5)

When the reduction in reflectance and the blur are taken into consideration, it is possible to obtain a more detailed intensity transmittance range from FIG. 39 and Table 1. More specifically, the lower limit of the refractive index for each minimum distance L is given as shown in Table 1, in reality, however, allowing a dimensional variation of 10% as a whole is a very loose regulation. In practice, therefore, it is desirable to set the lower limit of the refractive index to be higher than the values given in Table 1. Note that similar settings are required even not in the case of oblique-incidence illumination, since illuminating light has a certain angle of incidence to an exposure mask substrate.

A desirable aspect of the present invention is to use the range of refractive index defined by determining the upper limit of the refractive index of a translucent phase-shifting film from the relation shown in FIG. 39, and determining its lower limit from the relation given in Table 1.

Details of this embodiment will be described below by way of its experimental examples.

(EXPERIMENTAL EXAMPLE 6)

This experimental example relates to an exposure translucent phase-shifting mask substrate to be used when a KrF excimer laser (248 nm) is used as an exposure light source. In this experimental example, an intensity transmittance of 6% and a phase difference of 180° were set as desired values.

Reactive sputtering was performed on a light-transmitting substrate (quartz: refractive index 1.51, extinction coefficient 0.00) in an argon-nitrogen atmosphere by using Si as a target, forming an SiN film as a translucent phase-shifting film on the substrate. The refractive index and the extinction coefficient of the resultant SiN film were found to be 2.14 and 0.48, respectively. However, the reflectance of the surface of the translucent phase-shifting film with this film quality was 14.3%, which was higher than 10%, albeit slightly.

On the basis of the above method, a refractive index of 1.81 at which the reflectance was 10% was obtained by taking into account the refractive index of the substrate, the desired intensity transmittance and phase difference of 6% and 180°, respectively, and the resultant multiple interference. To obtain a reflectance of 10% or lower, therefore, the refractive index of the translucent phase-shifting film must be decreased to 1.81 or smaller. For this reason, a translucent phase-shifting film having SiON as its composition was formed by further adding oxygen during film formation, thereby obtaining refractive index=1.77 and extinction coefficient=0.34 (film thickness 162.8 nm). The surface reflectance of this translucent phase-shifting film could be reduced to 9.4%.

An exposure translucent phase-shifting mask was formed by patterning the exposure mask substrate of this experimental example by laser lithography, and etching the translucent phase-shifting film. The resultant exposure translucent phase-shifting mask was used to expose a 0.25-μm line-and-space pattern by using an exposure apparatus with numerical aperture NA=0.5 and coherent factor σ=0.5, and by cutting off light in a region inside σ=0.33 of the region of σ=0.5. Consequently, the focal depth could be increased to 1.1 μm by using a mask having a reduced reflectance of 9.4%, whereas a focal depth of only 0.9 μm could be obtained by a conventional mask having a reflectance of 14.3%.

In addition, since the refractive index was optimized, it was possible to dramatically improve the resolution of a 0.20-μm line-and-space pattern by performing oblique-incidence illumination. That is, by performing exposure by using a secondary light source arranged at a four-time symmetric position with respect to the optical axis, a focal depth of 1 μm could be obtained when the exposure mask substrate of this experimental example was used, while that was about at most 0.5 μm when a conventional mask having a high reflectance was used.

In this experimental example of the exposure mask substrate, a KrF excimer laser (248 nm) was used as the exposure light source, and an intensity transmittance of 6% and a phase difference of 180° were set as desired values. However, the exposure light source and the desired intensity transmittance and phase difference are not limited to those used in this example.

In addition, the oblique-incidence method of this experimental example was performed by using the secondary light source arranged at the four-time symmetric position with respect to the optical axis. The oblique-incidence method, however, is not limited to this one but may be any given illumination provided that the 10 illumination contains an oblique-incidence component. Examples are illumination in which a secondary light source is arranged at a two-time symmetric position, illumination formed into a ring with respect to a light source, and donut-like illumination. It is of course possible to use regular circular illumination.

It was confirmed that this circular illumination was effective for contact hole patterns and the focal depth was also improved in that case.

Furthermore, the SiN film was used as the translucent material in this experimental example, but the material is not limited to SiN. For example, it is possible to use Si, SiO, CrO, CrN, CrON, TiO, TiN, TiON, AlO, AlN, AlON, and an oxide, a nitride, and an oxynitride of a metal silicide such as MoSi.

(EXPERIMENTAL EXAMPLE 7)

This experimental example relates to an exposure translucent phase-shifting mask substrate to be used when an i-line (365 nm) is used as an exposure light source. In this experimental example, an intensity transmittance of 5% and a phase difference of 180° were set as desired values.

Reactive sputtering was performed on a light-transmitting substrate (quartz: refractive index 1.44, extinction coefficient 0.00) in an argon-nitrogen atmosphere by using Si as a target, forming an SiN film as a translucent phase-shifting film on the substrate. The refractive index and the extinction coefficient of the resultant SiN film were found to be 2.81 and 0.74, respectively. However, the reflectance of the surface of the translucent phase-shifting film with this film quality was 26.9%, which was higher than 10%.

On the basis of the above method, a refractive index of 1.81 at which the reflectance was 10% was obtained by taking into account the refractive index of the substrate, the desired intensity transmittance and phase difference of 5% and 180°, respectively, and the resultant multiple interference. To obtain a reflectance of 10% or lower, therefore, the refractive index of the translucent phase-shifting film must be decreased to 1.81 or smaller. For this reason, a translucent phase-shifting film having SiON as its composition was formed by further adding oxygen during film formation, thereby obtaining refractive index=1.75 and extinction coefficient=0.35 (film thickness 246.2 nm). The surface reflectance of this translucent phase-shifting film could be reduced to 9.3%.

An exposure translucent phase-shifting mask was formed by patterning the exposure mask substrate of this experimental example by laser lithography, and etching the translucent phase-shifting film. The resultant exposure translucent phase-shifting mask was used to expose a 0.35-μm line-and-space pattern by using an exposure apparatus with numerical aperture NA=0.5 and coherent factor σ=0.6, and by cutting off light in a region inside σ=0.33 of the region of σ=0.5. Consequently, the focal depth could be increased to 2.5 μm by using a mask having a reduced reflectance of 9.3%, whereas a focal depth of only 1.8 μm could be obtained by a conventional mask having a reflectance of 26.9%.

In addition, since the refractive index was optimized, it was possible to dramatically improve the resolution of a 0.30-μm line-and-space pattern by performing oblique-incidence illumination. That is, by performing exposure by using a secondary light source arranged at a four-time symmetric position with respect to the optical axis, a focal depth of 1.2 μm could be obtained when the exposure mask substrate of this experimental example was used, while that was about at most 0.6 μm when a conventional mask having a high reflectance was used.

In this experimental example of the exposure mask substrate, an i-line (365 nm) was used as the exposure light source, and an intensity transmittance of 5% and a phase difference of 180° were set as the desired values. However, the exposure light source and the desired intensity transmittance and phase difference are not limited to those used in this example.

In addition, the various illumination methods discussed in Experimental Example 6 can also be used as the oblique-incidence method in this experimental example. It is also possible to use regular circular illumination. It was confirmed that this circular illumination was effective for contact hole patterns and the focal depth was also improved in that case. Furthermore, the various materials explained in Experimental Example 6 can be used as the translucent material.

According to this embodiment as described above, when the intensity transmittance t of a translucent phase-shifting film falls within the range of 2 to 16%, the reflectance of the surface of the translucent phase-shifting film is set to 10% or less on the surface on which this translucent phase-shifting film is formed, and the refractive index of the translucent phase-shifting film is set between 1.49 and 1.73+0.016t. Consequently, the reflectance can be decreased compared to that of a conventional light-shielding mask, and this makes removal of stray light possible. In addition, the mask image quality can be improved by decreasing a quantity of blur to 2.5% or less with respect to a desired size. This makes it possible to realize an exposure mask substrate capable of improving the pattern exposure accuracy.

According to the present invention as has been described above, a translucent film can be stabilized with respect to irradiation of exposure light by performing irradiation in a direction from a transparent substrate to the translucent film. Consequently, it is possible to realize an exposure mask capable of preventing variations in transmittance that cannot be avoided by conventional masks, and a method and an apparatus for manufacturing this exposure mask.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An exposure mask comprising:
   a translucent film formed on a light-transmitting substrate, having a specific transmittance, and producing a phase difference of $(2n+1)\pi$, in which n is an integer, against an exposure light through the light-transmitting substrate, and
   a stabilized region formed on a boundary between said light-transmitting substrate and said translucent film or on at least a surface of said translucent film to prevent variations in physical properties of said translucent film.

wherein said stabilized region is formed by performing at least one treatment selected from the group consisting of nitriding, halogenation, hydrogenation and carbonization.

2. A mask according to claim 1, wherein said translucent film during film formation has a complex index of refraction different from a desired complex index of refraction, which complex index of refraction is adjusted to a value meeting a desired transmittance and phase difference by performing said at least one treatment selected from the group consisting of nitriding, halogenation, hydrogenation and carbonation.

3. A mask according to claim 2, wherein the complex index of refraction of said translucent film during film formation is set by taking account of a shift in the complex index of refraction caused by said at least one treatment selected from the group consisting of nitriding, halogenation, hydrogenation and carbonization.

4. A mask according to claim 1, wherein a variation in an amplitude transmittance of said translucent film including said stabilized region is not more than 0.05% for a dose of 800 J/cm$^2$.

* * * * *